United States Patent
Kimura et al.

(10) Patent No.: US 8,581,805 B2
(45) Date of Patent: Nov. 12, 2013

(54) DISPLAY DEVICE AND DRIVING METHOD THEREOF

(75) Inventors: Hajime Kimura, Kanagawa (JP); Jun Koyama, Kanagawa (JP); Masahiko Hayakawa, Kanagawa (JP); Yu Yamazaki, Tokyo (JP); Yukari Ando, Gifu (JP); Keisuke Miyagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 2049 days.

(21) Appl. No.: 11/131,463

(22) Filed: May 18, 2005

(65) Prior Publication Data

US 2006/0007212 A1    Jan. 12, 2006

(30) Foreign Application Priority Data

May 21, 2004  (JP) .................................. 2004-152628

(51) Int. Cl.
   *G09G 3/30*         (2006.01)
(52) U.S. Cl.
   USPC .............. 345/76; 345/82; 345/204; 345/211; 345/690; 315/169.1; 315/169.3; 313/463
(58) Field of Classification Search
   USPC .............................. 345/76–83, 204, 211, 690; 315/169.1–169.3; 313/463, 504
   See application file for complete search history.

(56) References Cited

U.S. PATENT DOCUMENTS

| 6,528,951 | B2 | 3/2003 | Yamazaki et al. |
| 6,753,834 | B2 | 6/2004 | Mikami et al. |
| 6,828,950 | B2 | 12/2004 | Koyama |
| 6,876,345 | B2 | 4/2005 | Akimoto et al. |
| 6,909,413 | B2 | 6/2005 | Nanno et al. |

(Continued)

FOREIGN PATENT DOCUMENTS

| EP | 1 381 019 A1 | 1/2004 |
| JP | 2002-333870 A | 11/2002 |

(Continued)

OTHER PUBLICATIONS

Hiroshi Kageyama et al.; "A 3.5-inch OLED Display using a 4-TFT Pixel Circuit with an Innovative Pixel Driving Scheme"; *SID '03 Digest*; pp. 96-99; 2003.

(Continued)

*Primary Examiner* — Lun-Yi Lao
*Assistant Examiner* — Insa Sadio
(74) *Attorney, Agent, or Firm* — Fish & Richardson P.C.

(57) ABSTRACT

A display device having a pixel configuration in which the aperture ratio is not decreased, and a driving method of a display device in which the duty ratio and the reliability of a light emitting element are increased. According to the invention, a signal line for inputting an analog signal, a first switch controlled by a first scan line, a second switch controlled by a second scan line, and a light emitting element connected to the second switch are included, wherein the first switch and the second switch are selected and an analog signal is inputted in a first period of one gate selection period, the first switch is selected and a reference signal is inputted from the signal line in a second period of the one gate selection period, and the light emitting element emits light by the analog signal and the reference signal.

11 Claims, 43 Drawing Sheets

(56) References Cited

U.S. PATENT DOCUMENTS

| | | |
|---|---|---|
| 7,057,588 B2 | 6/2006 | Asano et al. |
| 7,071,906 B2 | 7/2006 | Nishitani et al. |
| 7,084,848 B2 * | 8/2006 | Senda et al. .............. 345/92 |
| 7,142,180 B2 | 11/2006 | Akimoto et al. |
| 7,245,277 B2 | 7/2007 | Ishizuka |
| 7,277,072 B2 | 10/2007 | Akimoto et al. |
| 2002/0140659 A1 | 10/2002 | Mikami et al. |
| 2002/0196213 A1 * | 12/2002 | Akimoto et al. ............ 345/82 |
| 2003/0030629 A1 | 2/2003 | Tam et al. |
| 2003/0067424 A1 | 4/2003 | Akimoto et al. |
| 2003/0103022 A1 | 6/2003 | Noguchi et al. |
| 2003/0132716 A1 * | 7/2003 | Yamazaki et al. ........ 315/169.3 |
| 2004/0201555 A1 * | 10/2004 | Ozawa ..................... 345/76 |
| 2005/0017933 A1 | 1/2005 | Koyama |
| 2005/0205880 A1 * | 9/2005 | Anzai et al. ............... 257/83 |
| 2005/0225683 A1 * | 10/2005 | Nozawa .................. 348/801 |
| 2008/0007493 A1 | 1/2008 | Akimoto et al. |

FOREIGN PATENT DOCUMENTS

| | | |
|---|---|---|
| JP | 2003-005709 A | 1/2003 |
| JP | 2003-208124 A | 7/2003 |
| JP | 2003-223137 A | 8/2003 |
| JP | 2004-045647 A | 2/2004 |
| JP | 2004-133240 A | 4/2004 |
| WO | WO 02/27700 A2 | 4/2002 |

OTHER PUBLICATIONS

Hajime Akimoto et al.; "An Innovative Pixel-Driving Scheme for 64-Level Gray-Scale Full-Color Active Matrix OLED Displays"; *SID '02 Digest;* pp. 972-975; 2002.

Simon W.B. Tam et al.; "A Self-Biased TFT-OLED Pixel Driver Circuit"; *IDW '02;* pp. 243-246; 2002.

* cited by examiner

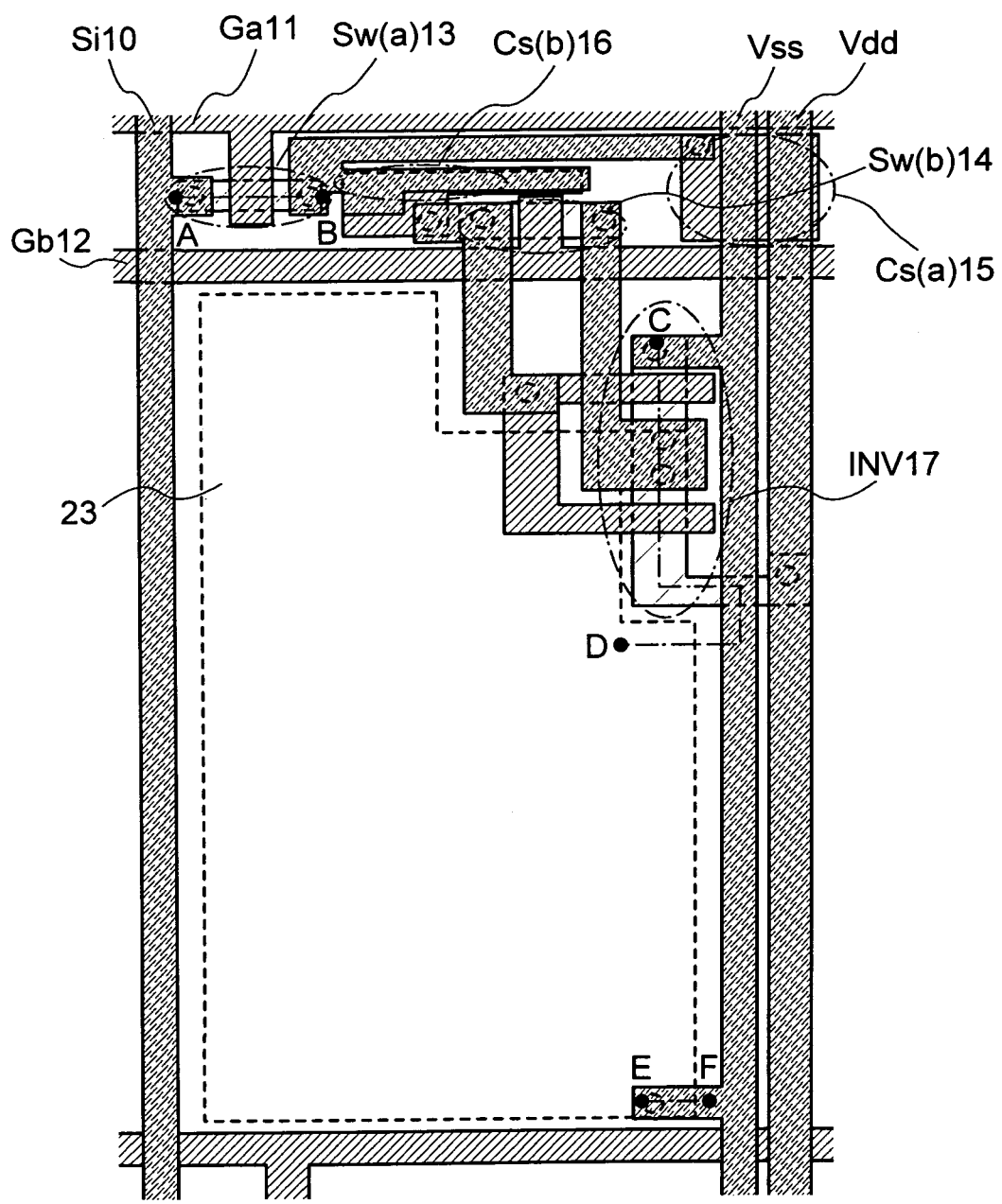

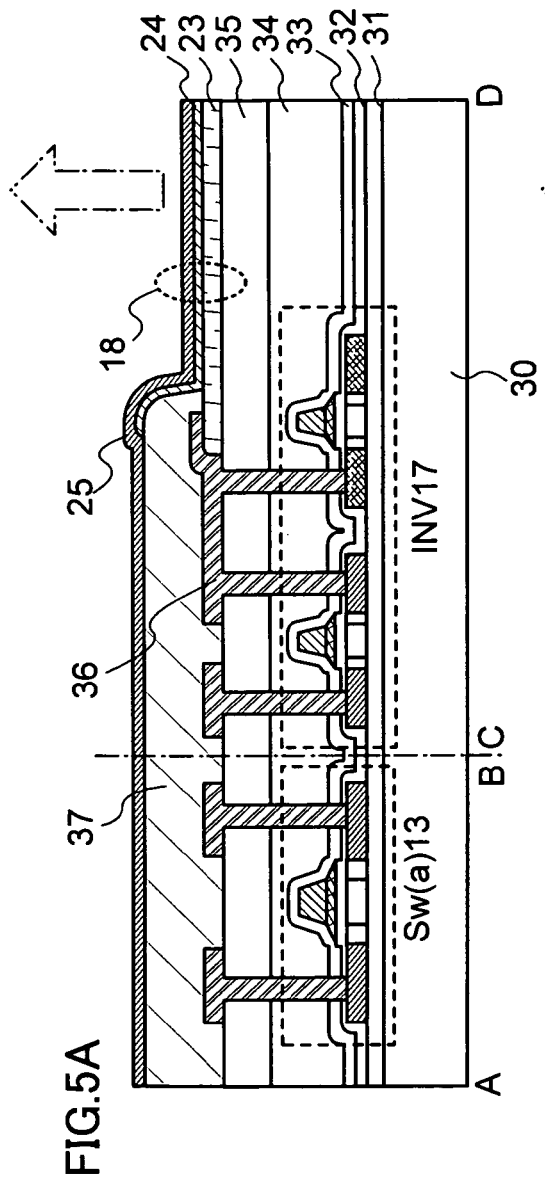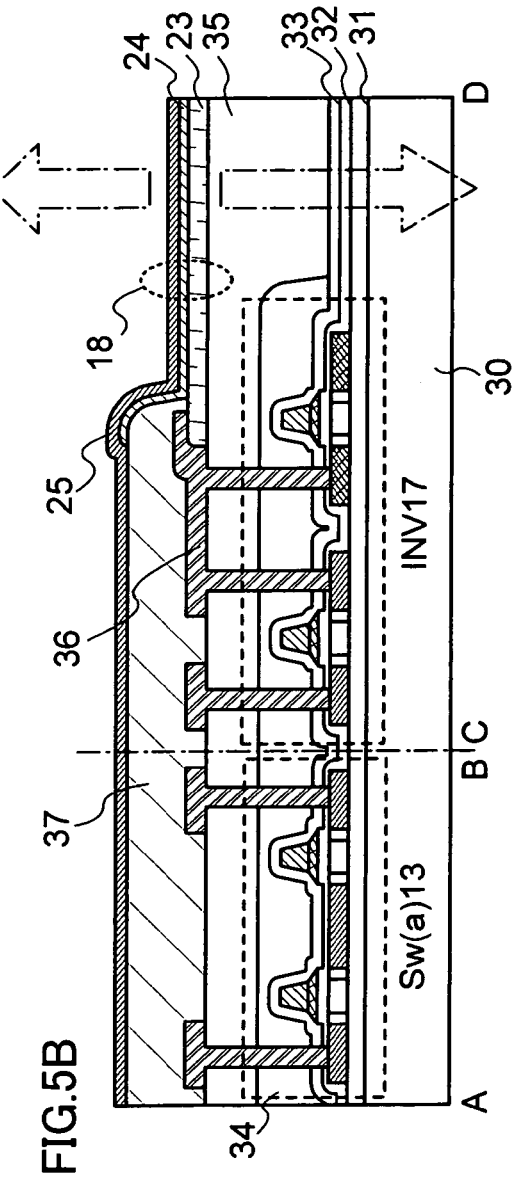

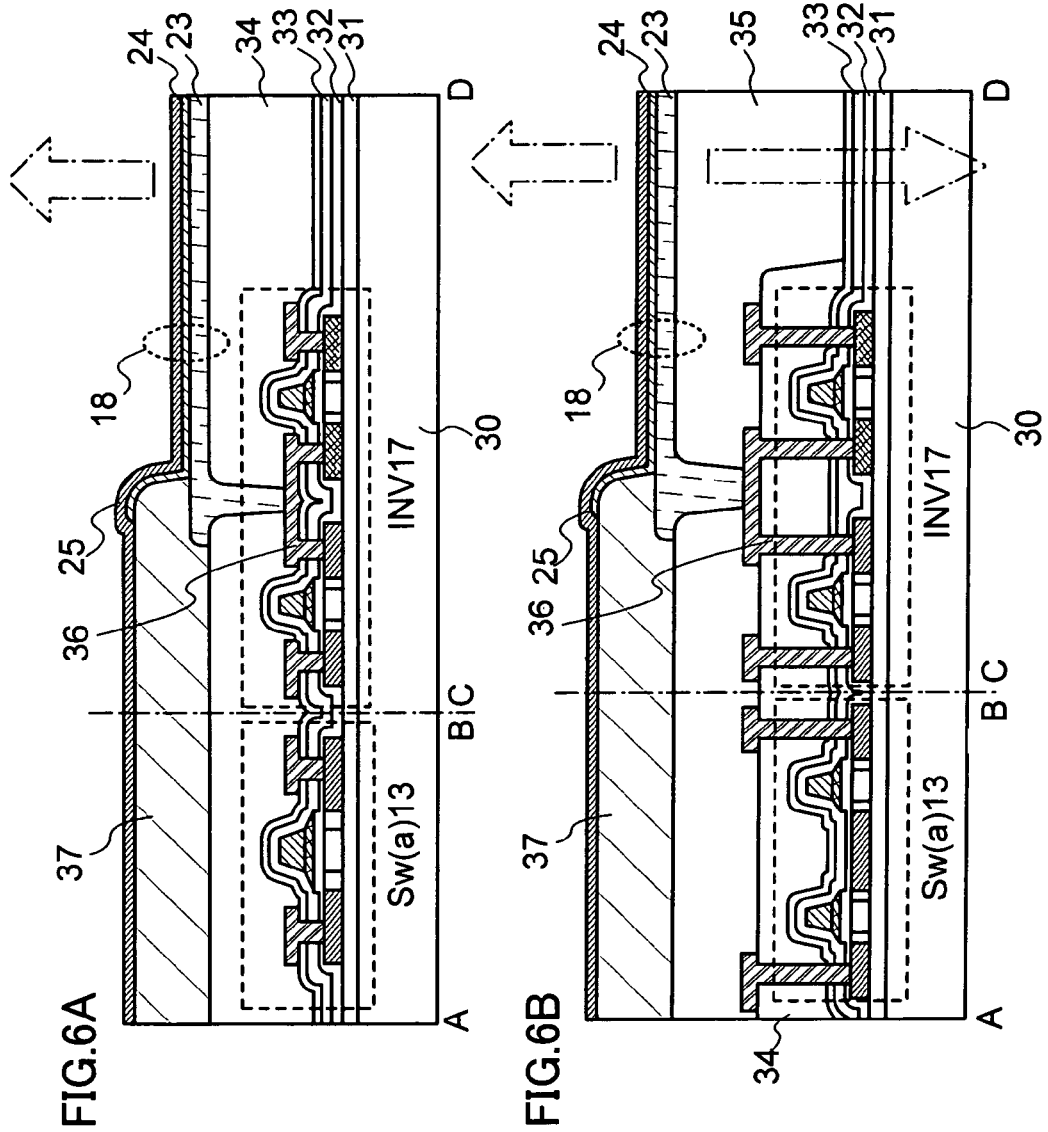

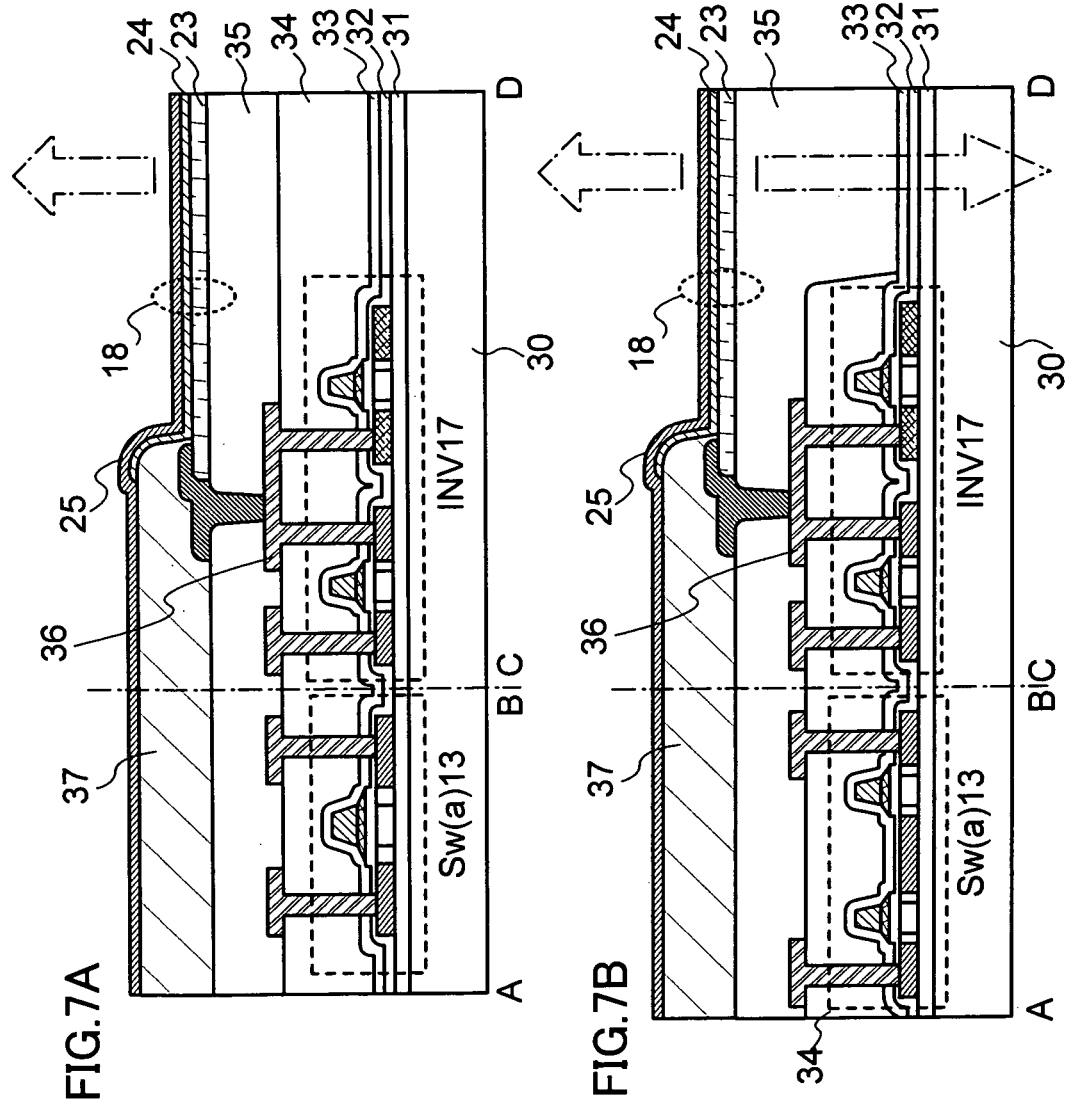

FIG.22A  1 gate selection period (1 horizontal period)
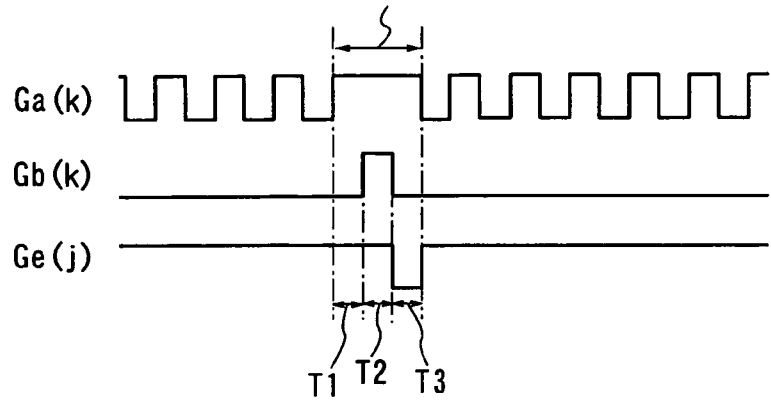
FIG.22B
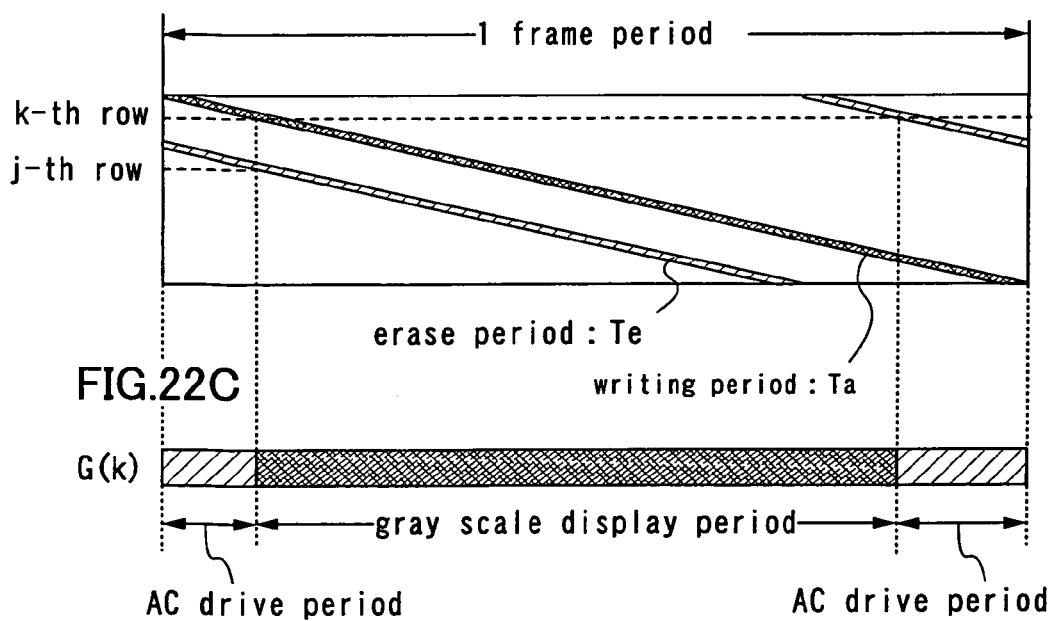

DISPLAY DEVICE AND DRIVING METHOD THEREOF

BACKGROUND OF THE INVENTION

1. Field of the Invention

The present invention relates to a display device having a self-light emitting element and a driving method thereof.

2. Description of the Related Art

For conventional display devices having self-light emitting elements, a display method for displaying a gray scale has been suggested, in which a signal voltage that is inputted as a video signal and a voltage of a reference signal that is a triangle wave varying for one frame period are compared, and a light emitting period of the light emitting element is controlled depending on a period until a relationship between the voltages is inverted so that a light emitting period within one frame period is controlled in an analog manner (refer to Non-Patent Documents 1 and 2).

[Non-Patent Document 1]
"An Innovative Pixel-Driving Scheme for 64-Level Gray-Scale Full-Color Active Matrix OLED Displays" Hajime Akimoto, et al.
SID'02DIGEST P972-975
[Non-Patent Document 2]
"A 3.5-inch OLED Display using a 4-TFT Pixel Circuit with an Innovative Pixel Driving Scheme" Hiroshi Kageyama, Hajime Akimoto SID'03 DIGEST, P. 96-99

In Non-Patent Document 1, in order not to provide a light emitting period and a signal inputting period within one frame period, a sweep line and a data line are provided. By providing them, a video signal and a reference signal can be inputted at the same time. Therefore, the entire one frame period corresponds to a light emitting period. The duty ratio (the ratio of a gray scale display period within one frame period) can be increased in this pixel configuration. Consequently, the current density of a current flowing to a light emitting portion of a self-light emitting element can be decreased, and the reliability of the light emitting element can be increased. However, the aperture ratio can be decreased due to the sweep line for inputting reference signals and the data line for inputting video signals.

In Non-Patent Document 2, a pixel configuration in which a sweep line is not provided is disclosed. In this case, the aperture ratio can be higher than the case of Non-Patent Document 1. However, the duty ratio is decreased in this pixel configuration. The reason is that one frame period is divided into a light emitting period and a signal inputting period since a reference signal and a video signal can not be inputted at the same time. Consequently, the current density is increased, and the reliability of the light emitting element is decreased.

SUMMARY OF THE INVENTION

It is an object of the invention to provide a display device having a pixel configuration in which the aperture ratio is not decreased. Furthermore, it is another object of the invention to provide a display device in which the duty ratio and the reliability of a light emitting element are increased, and a driving method thereof.

In view of the foregoing, according to the invention, a signal line is used both for inputting a video signal and for inputting a reference signal to increase the aperture ratio of a pixel. In addition, in order to share the signal line, operation is performed such that a period for inputting a video signal and a period for inputting a reference signal are provided in one gate selection period. According to the driving method of the invention, a video signal and a reference signal can be inputted during one gate selection period, so that it is not necessary to divide one frame period into a gray scale display period (described as a lighting period or a light emitting period) and a signal inputting period.

According to one example of the driving method of the display device of the invention, a signal line for inputting an analog signal, a first switch controlled by a first scan line, a second switch controlled by a second scan line, and a light emitting element connected to the second switch are included, wherein the first switch and the second switch are turned on and an analog signal is inputted in a first period of one gate selection period, the first switch is turned on and a reference signal is inputted from the signal line in a second period of the one gate selection period, and the light emitting element emits light by the analog signal and the reference signal.

According to the driving method of the display device of the invention, a signal line for inputting an analog signal, a first switch controlled by a first scan line, a second switch controlled by a second scan line, an inverter provided with the second switch at both ends thereof, and a light emitting element provided on the output side of the inverter are included, wherein the first switch and the second switch are turned on and an analog signal is inputted in a first period of one gate selection period, the first switch is turned on and a reference signal is inputted from the signal line in a second period of the one gate selection period, and a signal is outputted from the inverter by the analog signal and the reference signal, so that the light emitting element emits light depending on the signal.

According to one example of the driving method of the display device of the invention, a signal line for inputting an analog signal, a first switch controlled by a first scan line, a second switch controlled by a second scan line, a differential amplifier provided with the first switch and the second switch on the input side thereof, and a light emitting element provided on the output side of the differential amplifier are included, wherein the first switch and the second switch are turned on and an analog signal is inputted in a first period of one gate selection period, the first switch is turned on and a reference signal is inputted from the signal line in a second period of the one gate selection period, and a signal is outputted from the differential amplifier by the analog signal and the reference signal, so that the light emitting element emits light depending on the signal.

According to the driving method of the invention, the inverter or the differential amplifier comprises a plurality of thin film transistors, and the thin film transistor connected to the light emitting element is operated in the linear region.

According to one example of the display device of the invention, a pixel region comprising a first switch controlled by a first scan line, a second switch controlled by a second scan line, an inverter circuit provided with the second switch on both ends thereof, and a light emitting element provided on the output side of the inverter circuit, and a driver circuit for generating signals to be inputted to the first scan line and the second scan line are included, wherein a protection circuit is provided between the pixel region and the driver circuit. In addition, an element having a temperature compensation function may be provided between the pixel region and the driver circuit.

According to one example of the display device of the invention, a pixel region comprising a first switch controlled by a first scan line, a second switch controlled by a second scan line, a differential amplifier provided with the first switch and the second switch on the input side thereof, and a light emitting element provided on the output side of the differential amplifier, and a driver circuit for generating signals to be inputted to the first scan line and the second scan line are included, wherein a protection circuit is provided between the pixel region and the driver circuit. In addition, an element having a temperature compensation function may be provided between the pixel region and the driver circuit.

By the driving method of the invention described hereinbefore, the number of wirings of a pixel, namely signal lines can be decreased, so that the aperture ratio can be improved. Therefore, a defect in the manufacturing process due to a plurality of signal lines being provided can be reduced. Accordingly, the manufacturing yield is improved and further cost reduction can be achieved. In addition, by the driving method of the invention, the duty ratio can be improved. Consequently, since the current density flowing to the light emitting element can be decreased, the reliability of the light emitting element can be improved.

In addition, by providing the protection circuit of the invention, electrostatic discharge damage of an element can be prevented. Furthermore, by providing the temperature compensation function of the invention, the light emitting element can emit light with the predetermined luminance regardless of the temperature change.

BRIEF DESCRIPTION OF THE DRAWINGS

FIG. 3 is a top view illustrating a pixel of the invention.

FIGS. 5A and 5B are sectional views each illustrating a pixel of the invention.

FIGS. 6A and 6B are sectional views each illustrating a pixel of the invention.

FIGS. 7A and 7B are sectional views each illustrating a pixel of the invention.

FIGS. 22A to 22C are diagrams illustrating an operation where a reverse voltage is applied of the invention.

DETAILED DESCRIPTION OF THE INVENTION

Figure 1A:
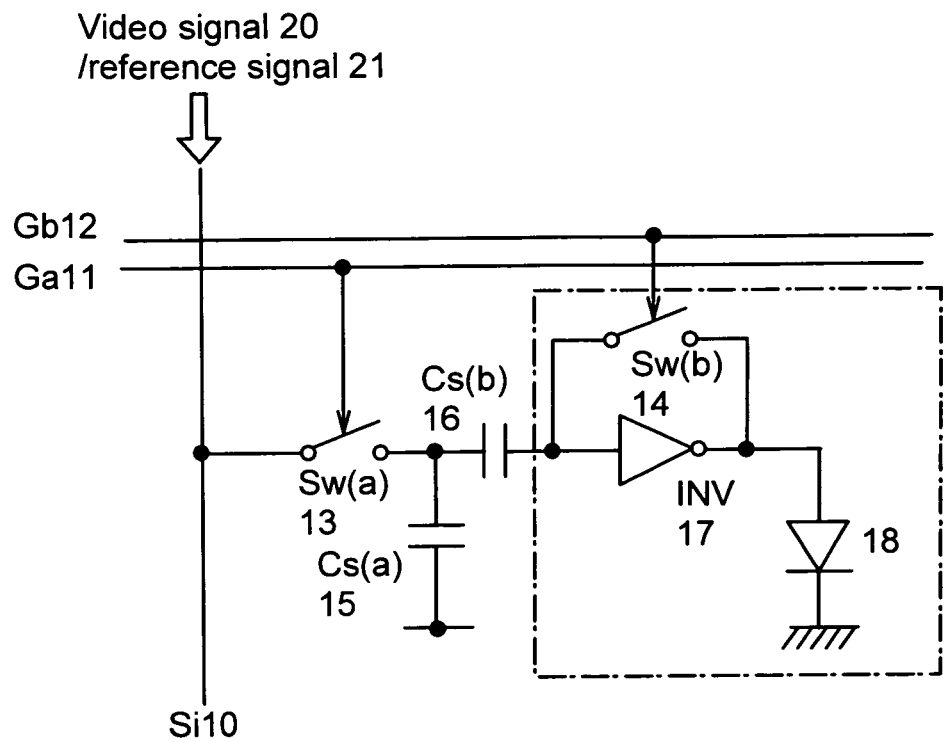
FIGS. 1A to 1C are circuit diagrams each illustrating a pixel of the invention.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. It is to be noted that the same portion or a portion having the same function is denoted by the same reference numeral in different drawings each illustrating an embodiment mode, and description thereof will not be repeated.

Embodiment Mode 1

In this embodiment mode, a pixel configuration is described.

As shown in FIG. 1A, a pixel comprises a signal line (Si) 10, a first scan line (Ga) 11, a second scan line (Gb) 12, a first switch (Sw(a)) 13, a second switch (Sw(b)) 14, a first capacitor (Cs(a)) 15, a second capacitor (Cs(b)) 16, an inverter 17, and a light emitting element 18. The first switch 13 and the second switch 14 can be, for example, formed by using a thin film transistor. The thin film transistor has three terminals that are a gate electrode, a source electrode, and a drain electrode, of which the source electrode and the drain electrode cannot be clearly distinguished from each other because of the structure of a thin film transistor. Therefore, when describing the connection between elements, one of the source electrode and the drain electrode is denoted by a first electrode while the other thereof is denoted by a second electrode.

The connection in this pixel configuration is described. It is to be noted that to connect means to electrically connect. That is, an element such as a switch may be additionally provided between the elements. One terminal of the first switch 13 is connected to the signal line 10 and controlled by the first scan line 11. The other terminal of the first switch 13 is connected to one terminal of the first capacitor 15. The other terminal of the first capacitor 15 is connected to an arbitrary wiring. Since it is preferable for the arbitrary wiring to have a constant potential, an anode line (Vdd line) or a Vss line connected to the inverter are preferably employed as the arbitrary wiring. Alternatively, a second scan line included in a pixel at the previous stage may be employed. The first capacitor 15 is required to have a function of holding charges inputted from the signal line 10. Specifically, the first capacitor 15 is required to hold a reference signal 21 inputted from the signal line 10. Although described below, according to the invention, input of a video signal and a reference signal is performed in one gate selection period which is quite a short period, and the input of the reference signal is performed with a cycle of one gate selection period, therefore, the first capacitor 15 can be made small. That is, since the reference signal 21 is inputted in a short period, a period for holding charges can be short, therefore, the first capacitor 15 can be made small.

The second switch 14 is connected to both terminals of the inverter 17, and controlled by the second scan line 12. The second capacitor 16 is connected between the first switch 13 and the second switch 14. The second capacitor 16 is required to have a function of holding charges inputted from the signal line 10. Specifically, the second capacitor 16 is required to hold a video signal 20 inputted from the signal line 10 (to be exactly, voltage difference between a threshold voltage of the inverter and the video signal).

The light emitting element 18 is connected to the output side of the inverter 17. It is to be noted that an element such as a switch may be additionally provided between the light emitting element 18 and the inverter 17. Such a switch can prevent the light emitting element 18 from emitting light when the second switch 14 is turned on.

According to this pixel configuration, the video signal 20 and the reference signal 21 can be inputted from one signal line. Consequently, the aperture ratio of the pixel can be increased. In addition, by adopting the operation of the invention, the duty ratio can be increased. The reason is that one frame period is not required to be divided into a gray scale display period and a signal inputting period. Consequently, one frame period can be used as a gray scale display period, thereby the duty ratio can be improved. Operation of a display device having the pixel configuration illustrated in FIG. 1A is described below.

Figure 2A:
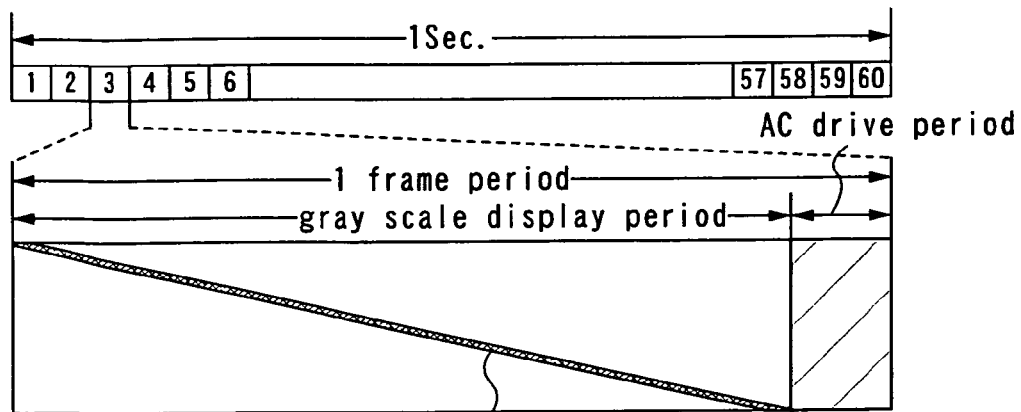
FIGS. 2A to 2C are diagrams illustrating a driving method of a pixel of the invention.

FIG. 2A is a timing chart for one frame period in which an image is rewritten at the rate of 60 frames per second, in which a vertical axis denotes a scan line G (from the first row to the last row) while a horizontal axis denotes time. Note that, in this embodiment mode, a gray scale display period and an AC drive period are provided in one frame period as shown in FIG. 2A, however, the invention may not be provided with an AC drive period.

It is to be noted that, in this embodiment mode, a thin film transistor of the inverter 17, in particular, a P-type thin film transistor thereof is not required to be operated in the saturation region. That is, since the thin film transistor can be operated in the linear region, a source-drain voltage of the thin film transistor can be decreased. Therefore, a driving voltage is not required to be increased and power consumption can be reduced.

In the AC drive period, a reverse voltage can be applied to a light emitting element. For example, potentials of a counter electrode of the light emitting element and of a high potential power source (Vdd) are changed. It is to be noted that the timing at which a reverse voltage is applied to the light emitting element 18, namely an AC drive period is not limited to that shown in FIG. 2A. That is, the AC drive period is not necessarily provided for each frame. In addition, the AC drive period is not necessarily provided in the last half of one frame period. Operation in the AC drive period is described in an embodiment mode later. In addition, other configurations in the case of a reverse voltage, operation thereof, and the like are described in an embodiment mode later.

Applying a reverse voltage can desirably improve the condition of a light emitting element to improve the reliability. In a light emitting element, an initial defect of short-circuiting between an anode and a cathode may occur, which is caused by the adhesion of foreign substance, a pinhole due to a minute projection on the anode or the cathode, and the non-uniformity of an electroluminescent layer. When such initial defect occurs, light emission/non-light emission in accordance with a signal is not performed and a current mostly flows to the short-circuited portion, thereby no light emission of a pixel would occur. Consequently, high-quality image display is not performed. In addition, this short-circuiting may occur at an arbitrary pixel. Therefore, as described in this embodiment mode, a reverse voltage is applied to the light emitting element, thereby a current flows locally only to the short-circuited portion so that the short-circuited portion generates heat to oxidize or carbonize itself. Accordingly, the short-circuited portion can be insulated, thus a current flows to the portion other than the short-circuited portion so that the luminescence in accordance with a signal can be achieved. By applying a reverse voltage in this manner, even when the initial defect occurs, it is possible to dissolve the defect and display high-quality images. Note that the insulation of a short-circuited portion is preferably performed before shipment.

In addition, other than the initial defect, short-circuiting between an anode and a cathode may occur with time. Such a defect is also called a progressive defect. Here, since a reverse voltage can be regularly applied to a light emitting element, even when the progressive defect occurs, it is possible to dissolve the defect and display high-quality images.

By applying a reverse voltage, image persistence can be prevented as well. The image persistence occurs depending on the deterioration level of the light emitting element 18. The deterioration level of the light emitting element 18 can be decreased by applying a reverse voltage. Accordingly, image persistence can be prevented.

Generally, the deterioration of a light emitting element progresses at a faster rate in the initial period, and the progress rate thereof decreases with time. That is, in a light emitting element which has already deteriorated in a pixel, further deterioration hardly occurs. In view of this, all pixels may emit light before shipment or when displaying no image. By generating deterioration in a pixel which has not deteriorated in this manner, the deterioration level of all the pixels can be averaged. As described above, a structure of lighting all pixels when displaying no image may be provided.

Figure 2B:
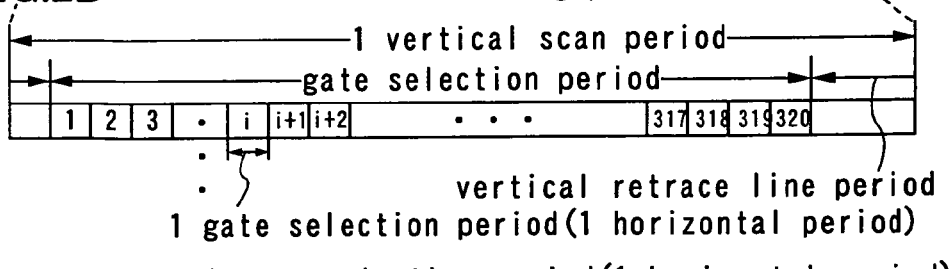

Next, as illustrated in FIG. 2B, one vertical scan period is provided in a write-in period, which includes a vertical flyback period and a gate selection period. In the vertical flyback period, change of writing direction, signal writing to a preliminary pixel, and the like can be performed. The gate selection period includes a selection period called one gate selection period (one horizontal period) in accordance with the number of scan lines.

Figure 2C:
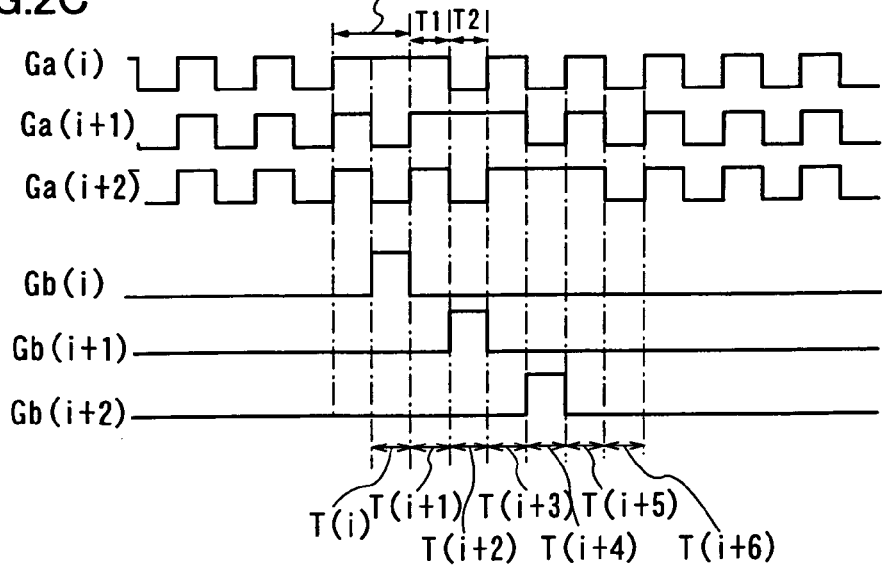

In FIG. 2C, respective waveforms of signals inputted to a first scan line Ga and a second scan line Gb at the i-th to (i+2)-th rows are shown. In this embodiment mode, one gate selection period includes a reference signal inputting period T1 and a video signal inputting period T2. The respective periods are denoted by T(i) to T(i+6) as shown in FIG. 2C, and operation of a pixel in the respective periods is described below.

Figure 35A:
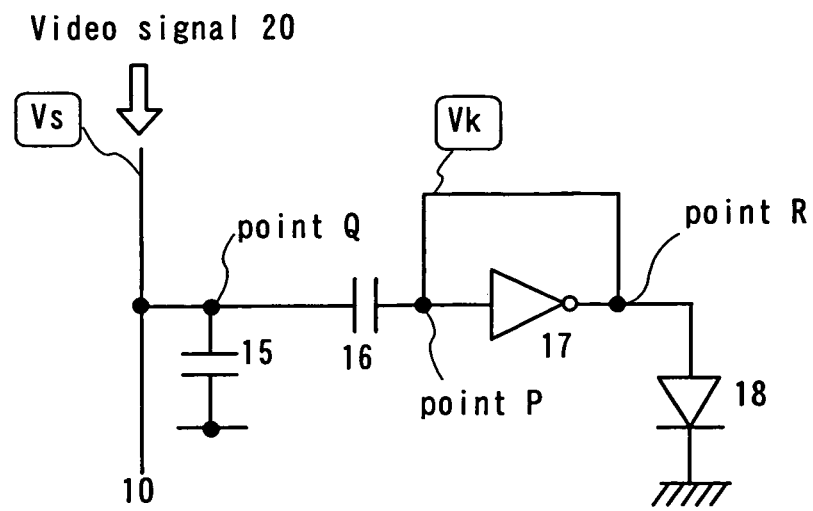
FIGS. 35A and 35B are circuit diagrams illustrating a pixel of the invention.

In the period T(i), the first switch 13 and the second switch 14 are turned on as shown in FIG. 35A. Note that, in the drawings, a switch being turned on is shown by connecting a line while the switch being turned off is shown by severing. Then, the video signal 20 is inputted from the signal line 10. A potential of the video signal 20 here is denoted by Vs. Since the second switch 14 is on, an input terminal and an output terminal of the inverter 17 are connected. At this time, a potential at a point P is Vk. Therefore, charges for (Vk−Vs) are accumulated in the second capacitor 16. In this manner, video signals are inputted in the period T(i).

Figure 35B:
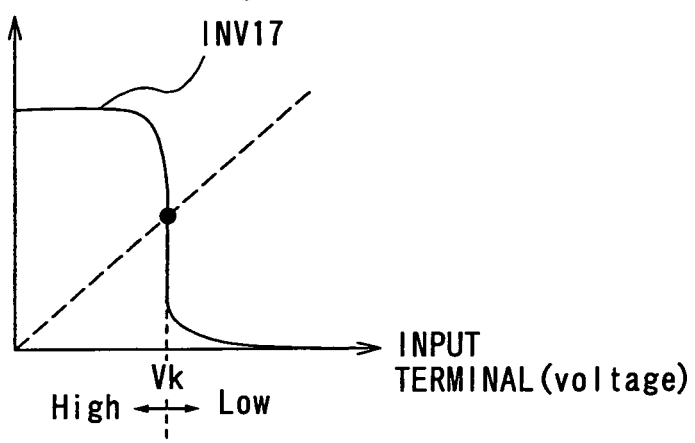

It is to be noted that, as shown in FIG. 35B, Vk is a potential in the state where the input terminal and the output terminal of the inverter 17 are connected, namely a potential when input and output of the inverter 17 are equal to each other. When the potential at the point P that is input of the inverter 17 is higher than Vk, output of the inverter 17, namely a potential at a point R becomes Low. In that case, the light emitting element 18 does not emit light. On the contrary, when the potential at the point P is lower than Vk, the potential at the point R becomes High. In that case, a voltage is applied to the light emitting element 18 to emit light.

Figure 36A:
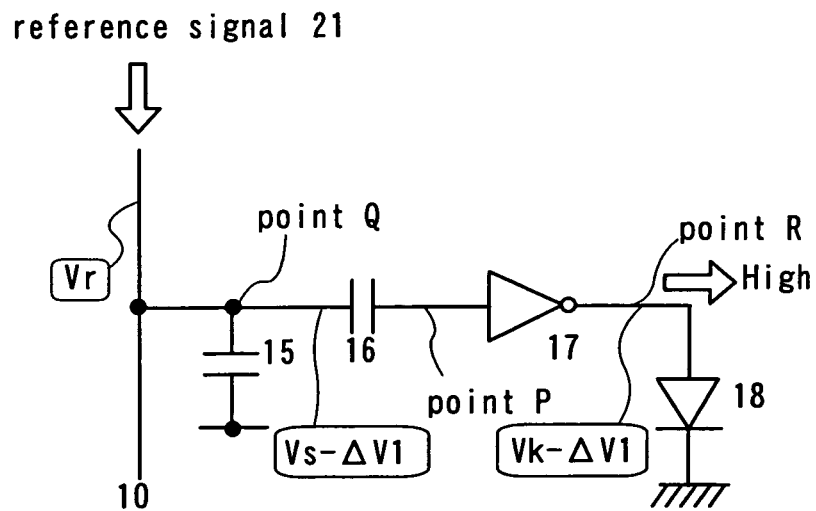
FIGS. 36A and 36B are circuit diagrams illustrating a pixel of the invention.
Figure 36B:
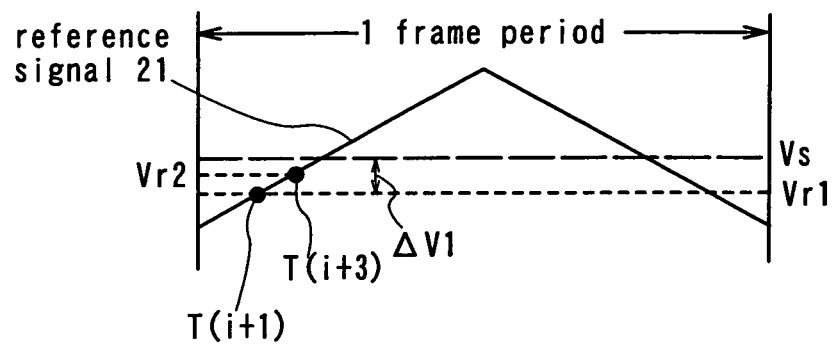

Next, in the period T(i+1), the first switch 13 is turned on and the second switch 14 is turned off as shown in FIG. 36A. The reference signal 21 is inputted from the signal line 10. Note that the reference signal 21 has a triangle wave varying for one frame period as shown in FIG. 36B. A potential of the reference signal 21 here is denoted by Vr1 in the period T(i+1). As shown in FIG. 36B, the potential Vs of the video signal is set to be higher than Vr1. When Vs−Vr1=ΔV1, the potential at a point Q is Vr1 (=Vs−ΔV1) that is lower than Vs by ΔV1. Consequently, the potential at the point P becomes (Vk−ΔV1). Since the potential at the point P is lower than Vk, the potential at the point R becomes High. In that case, a voltage is applied to the light emitting element 18 to emit light.

Figure 37:
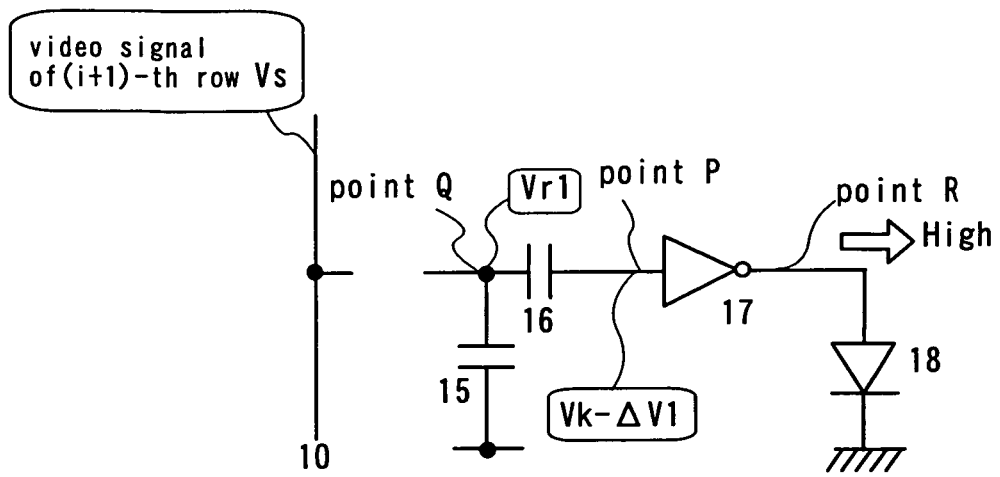
FIG. 37 is a circuit diagram illustrating a pixel of the invention.

In the period T(i+2), the first switch 13 and the second switch 14 are turned off as shown in FIG. 37. Therefore, the potential Vr1 at the point Q is held in the first capacitor 15. Charges of (Vk−Vs) continue to be held in the second capacitor 16. Therefore, the potential at the point P is kept at (Vk−ΔV1) and the potential at the point R is High. A voltage is applied to the light emitting element 18 to emit light.

At that time, in the pixels at the next (i+1)-th row, the first switch 13 and the second switch 14 are turned on. The video signal 20 for the pixels at the (i+1)-th row is inputted from the signal line 10.

Subsequently, in the period T(i+3), the first switch 13 is turned on and the second switch 14 is turned off as shown in FIG. 36A. The reference signal 21 is inputted from the signal line 10. A potential of the reference signal 21 here is denoted by Vr2 in the period T(i+3). Since the potential Vr2 of the reference signal 21 is kept lower than the potential Vs of the video signal, the potential at the point P is kept lower than Vk. Consequently, the potential at the point R is kept at High, and a voltage is applied to the light emitting element 18 to emit light.

In the period T(i+4), the first switch 13 and the second switch 14 are turned off similarly to the state shown in FIG. 37. Since charges of Vr2 are held in the first capacitor 15, the potential at the point Q is Vr2 in the period T(i+4). Charges of (Vk−Vs) continue to be held in the second capacitor 16. Therefore, the potential at the point P is kept at (Vk−ΔV2) (ΔV2=Vs−Vr2 is satisfied). Consequently, the potential at the point P is lower than Vk, and the potential at the point R is kept at High.

At that time, in the pixels at the next (i+2)-th row, the first switch 13 and the second switch 14 are turned on. The video signal 20 for the pixels at the (i+2)-th row is inputted from the signal line 10.

Figure 38A:
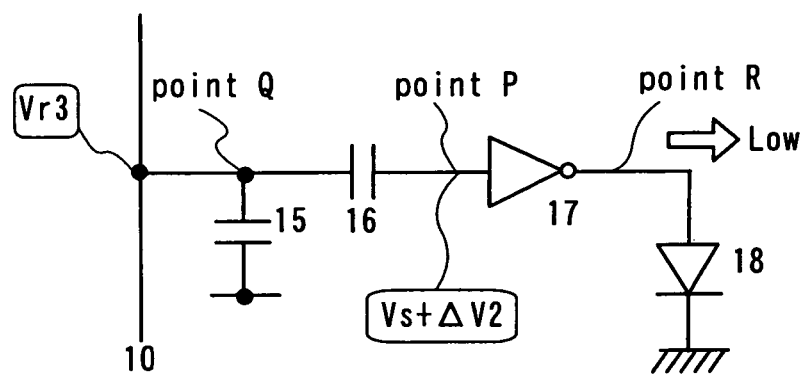
FIGS. 38A and 38B are circuit diagrams illustrating a pixel of the invention.
Figure 38B:
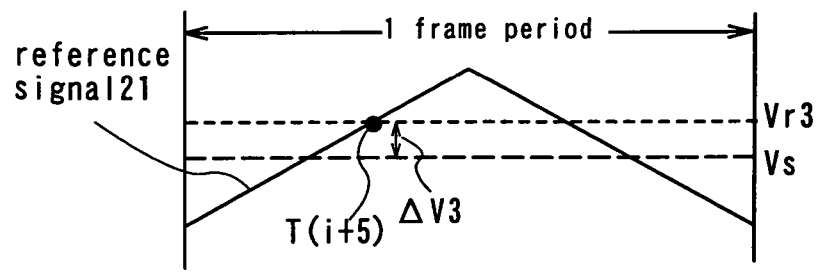

Next, in the period T(i+5), the first switch 13 is turned on and the second switch 14 is turned off as shown in FIG. 38A. The reference signal 21 is inputted from the signal line 10. A potential of the reference signal 21 here is denoted by Vr3 in the period T(i+5). As shown in FIG. 38B, Vs−Vr3=ΔV3 is satisfied. The ΔV3 has a negative value, and Vr3 is higher than Vs. Therefore, the potential at the point P becomes higher than Vk, and the potential at the point R becomes Low. In that case, the light emitting element 18 does not emit light.

In the period T(i+6), the first switch 13 and the second switch 14 are turned off. Since the potential Vr3 is held in the first capacitor 15, the potential at the point Q is Vr3. Charges of (Vk−Vs) continue to be held in the second capacitor 16. Therefore, the potential at the point P is kept at (Vk−ΔV3) (ΔV3=Vs−Vr3). Consequently, the potential at the point R is kept at Low and the light emitting element 18 does not emit light.

At that time, in the pixels at the next (i+3)-th row, the first switch 13 and the second switch 14 are turned on. The video signal 20 for the pixels at the (i+3)-th row is inputted from the signal line 10.

As set forth above, writing of the video signal 20 and the reference signal 21 and holding of the reference signal 21 are required to be performed alternately. Whether the light emitting element 18 emits light or not is controlled depending on whether or not the potential of the reference signal 21 is higher or lower than that of the video signal 20.

According to this embodiment mode as described above, a thin film transistor of the inverter 17, in particular, a P-type thin film transistor thereof is not required to be operated in the saturation region. Therefore, a driving voltage is not required to be increased and power consumption can be reduced.

In addition, according to this embodiment mode, one gate selection period includes the reference signal inputting period T1 and the video signal inputting period T2. Accordingly, one signal line 10 can be shared and the aperture ratio can be increased. Furthermore, the duty ratio can be increased. Since the reference signal inputting period T1 and the video signal inputting period T2 are provided in one gate selection period, it is preferable to increase the operating frequency of a scan line driver circuit. It is to be noted that, in a pixel, the reference signal inputting period T1 and the video signal inputting period T2 can be arranged in any order.

Figure 1B:
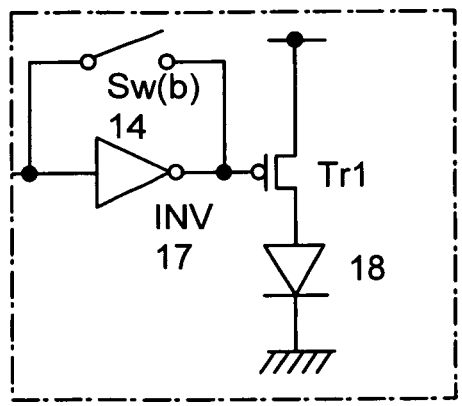

A pixel configuration which is different from that shown in FIG. 1A is described below. In a pixel shown in FIG. 1B, a transistor Tr1 is additionally provided between the inverter 17 and the light emitting element 18 in the pixel shown in FIG. 1A. The other configuration is the same as that in FIG. 1A, thus the description thereof is omitted here.

Figure 1C:
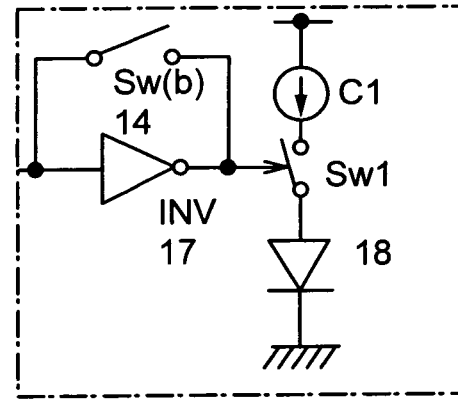

In a pixel shown in FIG. 1C, a switch Sw1 provided with a current source C1 is additionally provided between the inverter 17 and the light emitting element 18 in the pixel shown in FIG. 1A. By supplying a constant current with the current source C1, the constant current can flow to the light emitting element 18. The other configuration is the same as that in FIG. 1A, thus the description thereof is omitted here.

This embodiment mode can be freely combined with any of the other embodiment modes.

Embodiment Mode 2

In this embodiment mode, a configuration of an inverter other than a normal CMOS inverter is described. The inverter 17 may include a transistor having one polarity. In that case, a transistor and a resistor, or two transistors having the same polarity may be provided. A specific pixel circuit comprising an inverter is shown in FIGS. 39A, 39B, 40A, and 40B.

Figure 39A:
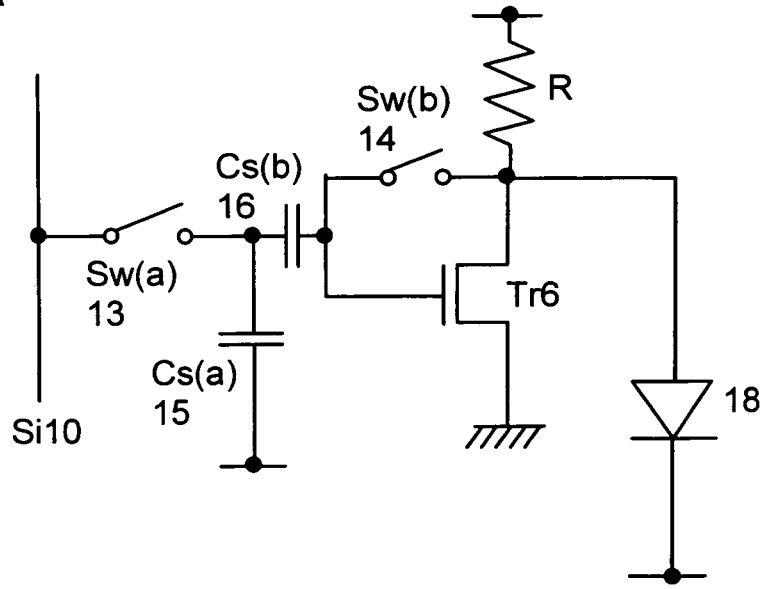
FIGS. 39A and 39B are circuit diagrams each illustrating a pixel of the invention.

In FIG. 39A, a resistor R and an N-channel transistor Tr6 are provided. The resistor R and the transistor Tr6 are connected to each other, and one terminal of the second switch 14 is connected therebetween. The one terminal of the second switch 14 is also connected to a pixel electrode of the light emitting element 18. The resistor R and the transistor Tr6 function as an inverter. The other configuration is the same as that in FIG. 1A, thus the description thereof is omitted here.

Figure 39B:
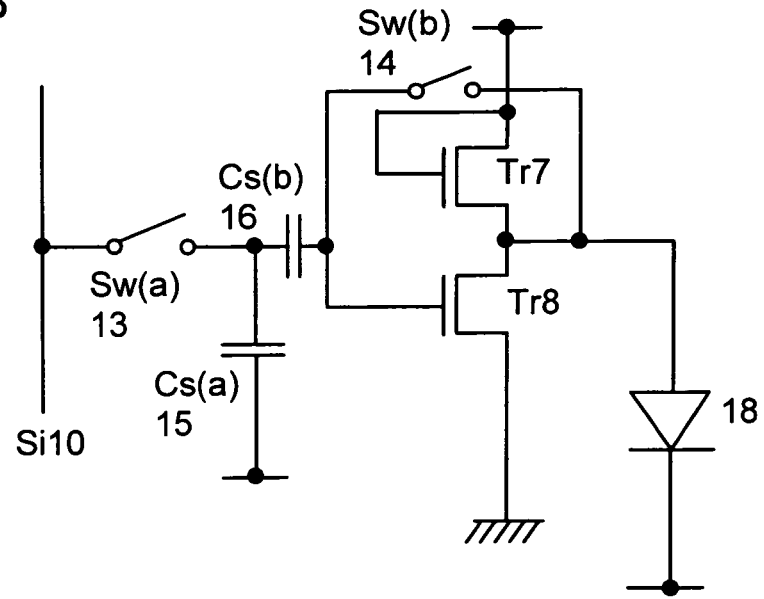

In FIG. 39B, a first N-channel transistor Tr7 and a second N-channel transistor Tr8 are provided. The first N-channel transistor Tr7 and the second N-channel transistor Tr8 are connected to each other, and one terminal of the second switch 14 is connected therebetween. The one terminal of the second switch 14 is also connected to a pixel electrode of the light emitting element 18. The first N-channel transistor Tr7 is a diode-connected transistor. The other configuration is the same as that in FIG. 1A, thus the description thereof is omitted here.

Figure 40A:
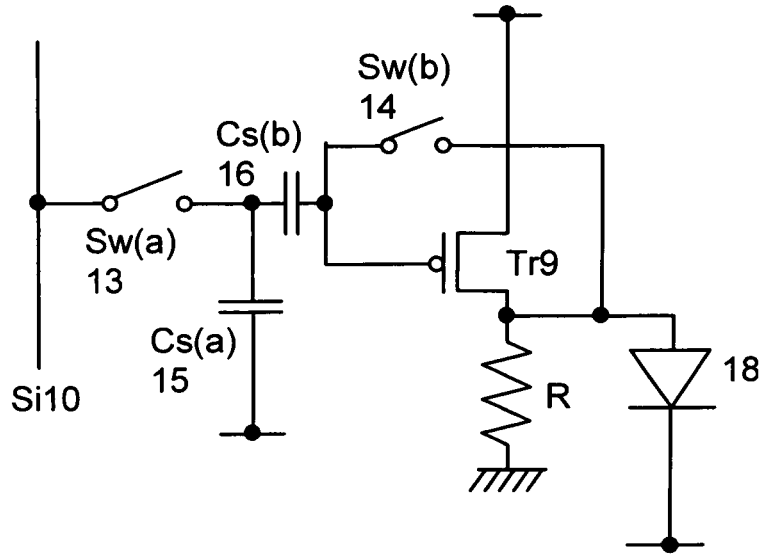
FIGS. 40A and 40B are circuit diagrams each illustrating a pixel of the invention.

In FIG. 40A, a resistor R and a P-channel transistor Tr9 are provided. The resistor R and the transistor Tr9 are connected to each other, and one terminal of the second switch 14 is connected therebetween. The one terminal of the second switch 14 is also connected to a pixel electrode of the light emitting element 18. The resistor R and the transistor Tr9 function as an inverter. The other configuration is the same as that in FIG. 1A, thus the description thereof is omitted here.

Figure 40B:
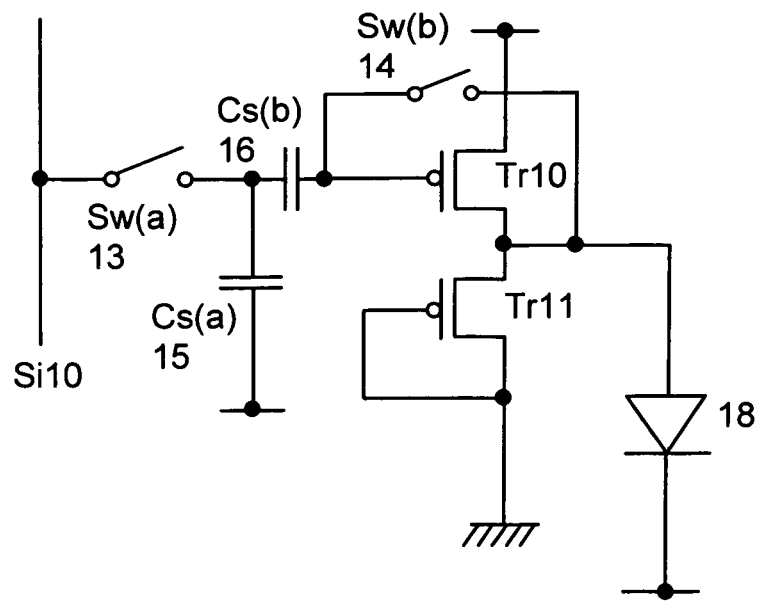

In FIG. 40B, a first P-channel transistor Tr10 and a second P-channel transistor Tr11 are provided. The first P-channel transistor Tr10 and the second P-channel transistor Tr11 are connected to each other, and one terminal of the second switch 14 is connected therebetween. The one terminal of the second switch 14 is also connected to a pixel electrode of the light emitting element 18. The second N-channel transistor Tr11 is a diode-connected transistor. The other configuration is the same as that in FIG. 1A, thus the description thereof is omitted here.

As the configurations shown in FIGS. 40A and 40B are compared with the configurations shown in FIGS. 39A and 39B, the anode voltage of the light emitting element 18 is less likely to be affected by each element. Therefore, the configurations shown in FIGS. 40A and 40B are preferable.

Embodiment Mode 3

In this embodiment mode, a layout of a pixel portion of a pixel having the equivalent circuit shown in FIG. 1A is described with an example.

FIG. 3 illustrates a case where the first switch 13, the second switch 14, and the inverter 17 are each constituted by using a thin film transistor. Note that, in this description, the inverter 17 is constituted by using two or more thin film transistors that are different in polarity.

For the abovedescribed thin film transistors, a semiconductor layer is formed and patterned to have a predetermined shape. A gate insulating layer is formed to cover the semiconductor layer.

Then, a first conductive layer is formed and patterned to form the first scan line (Ga) 11, the second scan line (Gb) 12, and gate electrodes of the thin film transistors.

An insulating layer is formed to cover the first conductive layer. Then, a second conductive layer is formed and patterned to form the signal line (Si) 10, power supply lines Vss and Vdd, source electrodes or drain electrodes of the thin film transistors.

At this time, the first capacitor (Cs(a)) 15 is formed by the first conductive layer, the gate insulating layer or the insulating layer, and the second conductive layer. For this, the first conductive layer is formed below the first power supply line Vss and the second power supply line Vdd, and is connected to the source electrode or the drain electrode of the thin film transistor corresponding to the first switch by the second conductive layer. In addition, the second capacitor (Cs(b)) 16 is formed by the first conductive layer, the gate insulating layer or the insulating layer, and the second conductive layer. For this, the first conductive layer is formed below the source electrode or the drain electrode of the thin film transistor corresponding to the first switch. At this time, the first conductive layer is connected to a source electrode or a drain electrode of the thin film transistor corresponding to the second switch.

A pixel electrode 23 of the light emitting element 18 is formed so as to be connected to source electrodes or drain electrodes of the thin film transistors constituting an inverter.

After forming up to the pixel electrode, an insulating layer functioning as a partition is formed and an electroluminescent layer is formed. Particulars about the partition and the electroluminescent layer are described in the following embodiment mode.

This embodiment mode can be freely combined with any of the other embodiment modes.

Embodiment Mode 4

In this embodiment mode, a cross sectional structure of the pixel portion exemplified in FIG. 3 is described.

Figure 4A:
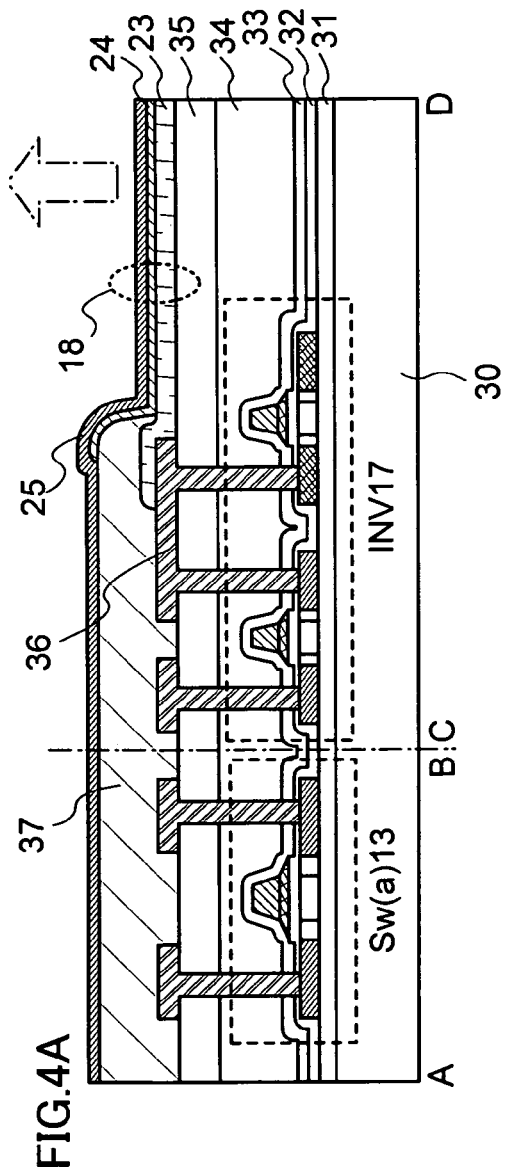
FIGS. 4A and 4B are sectional views each illustrating a pixel of the invention.
Figure 4B:
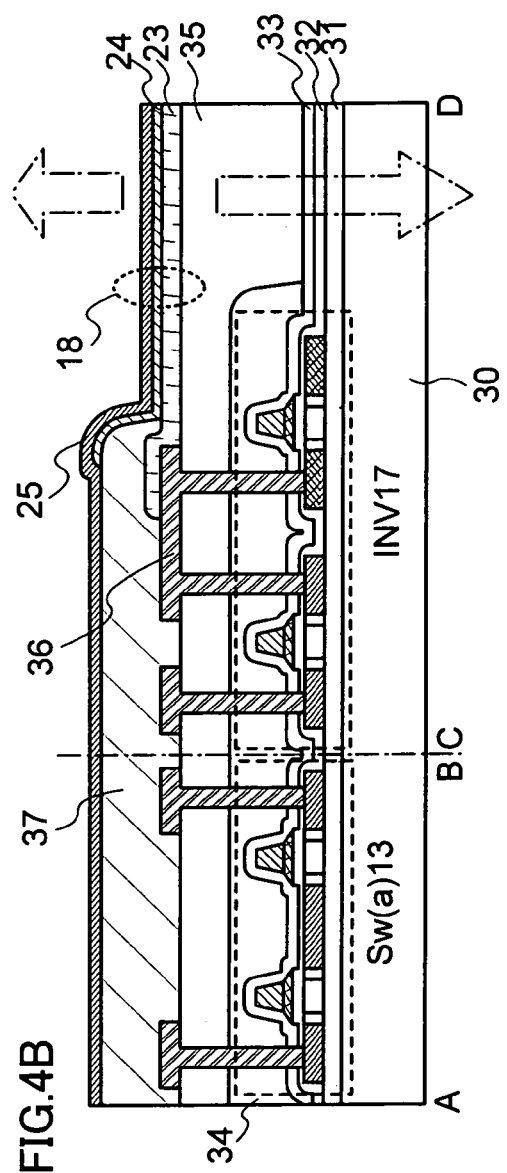

FIGS. 4A and 4B are cross sectional views of the first switch 13, the inverter 17, and the light emitting element 18. Over a base insulating film formed over an insulating substrate 30, a thin film transistor Tr1 functioning as the first switch 13, and a first thin film transistor Tr2 and a second thin film transistor Tr3 constituting the inverter are provided. The thin film transistors Tr1 and Tr2 are N-channel type whereas the thin film transistor Tr3 is P-channel type in this embodiment mode.

For the insulating substrate, a glass substrate made of barium borosilicate glass, aluminum borosilicate glass or the like, a quartz substrate, or the like is used. Other than the above, a substrate made of a flexible synthetic resin such as plastic typified by polyethylene terephthalate (PET), polyethylene naphthalate (PEN) and polyether sulfone (PES), and acryl may be used for the substrate having an insulating surface.

The thin film transistors Tr1 to Tr3 each includess the semiconductor layer functioning as an active layer, the gate insulating layer 32 formed over the semiconductor layer, and the gate electrode.

The semiconductor layer may be in any condition of an amorphous semiconductor, a SAS in which an amorphous state and a crystalline state are mixed, a microcrystalline semiconductor in which a crystal grain of 0.5 to 20 nm can be observed in an amorphous semiconductor, and a crystalline semiconductor.

In this embodiment mode, a crystalline semiconductor film is used, which is obtained by forming an amorphous semiconductor film and crystallizing it by heat treatment. A heating furnace, laser irradiation, irradiation with light emitted from a lamp in place of laser light (hereinafter referred to as lamp annealing), or a combination thereof can be employed as the heat treatment.

A continuous wave laser beam (CW laser beam) or a pulsed wave laser beam (pulsed laser beam) can be used in the case of employing laser irradiation. The laser beam can be obtained by use of one of or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser, and a gold vapor laser. A crystal having a large grain size can be obtained by irradiation with a fundamental wave of the laser beam and a second harmonic to a fourth harmonic of the fundamental wave. For example, a second harmonic (532 nm) or a third harmonic (355 nm) of an Nd:$YVO_4$ laser (fundamental wave of 1064 nm) can be used. Energy density of the laser at the time needs to be in the range of approximately 0.01 to 100 MW/cm$^2$ (preferably, 0.1 to 10 MW/cm$^2$). Then, laser irradiation is performed at scanning rate of approximately 10 to 2000 cm/sec.

The semiconductor film may be irradiated with a continuous wave laser beam of a fundamental wave and a continuous wave laser beam of a harmonic, or may be irradiated with a continuous wave laser beam of a fundamental wave and a pulsed wave laser beam of a harmonic. Energy can be supplemented by irradiating with a plurality of kinds of laser beams.

In the case of the pulsed laser beam, the pulsed laser beam may be oscillated at such a repetition rate that the laser light of the next pulse is irradiated after melting the semiconductor film by the previous laser light and before solidifying the semiconductor film. This makes it possible to obtain crystal grains that are sequentially grown in the scanning direction. Actually used is a pulsed beam with a repetition rate of 10 MHz or more the repetition rate is much higher than that of several ten to several hundred Hz of a normally used pulsed beam.

The laser beam irradiation may be performed in an inert gas atmosphere such as a noble gas or nitrogen. This can suppress roughness of a semiconductor surface due to the laser light irradiation, improve the planarity, and prevent variations in the threshold caused by variations in interface state densities.

Alternatively, it is possible that a microcrystalline semiconductor film is formed by using $SiH_4$ and $F_2$, or $SiH_4$ and $H_2$ and irradiated with the laser as described above for crystallization.

In the case of using a heating furnace for the heat treatment, the amorphous semiconductor film is heated at a temperature of 500 to 550° C. for 2 to 20 hours. At this time, the temperature is preferably set in multiple stages in the range of 500 to 550° C. so as to gradually reach a higher temperature. Since hydrogen and the like of the amorphous semiconductor film are released at the first low temperature heating step, so-called dehydrogenation can be performed by which the film roughness can be reduced during crystallization. When a metal element which accelerates crystallization, for example, Ni, is further formed over the amorphous semiconductor film, the heat temperature can be preferably lowered. Even in the case of using such a metal element for the crystallization, heat treatment can be performed at a high temperature of 600 to 950° C.

However, in the case of forming a metal element, it is concern that the metal element adversely affects electric characteristics of a semiconductor element. Thus, a gettering step is required to reduce or remove the metal element. For example, the step may be performed to capture the metal element by using the amorphous semiconductor film as a gettering sink.

Alternatively, a crystalline semiconductor film may be directly formed on the base insulating film. In this case, the crystalline semiconductor film can be directly formed by utilizing heat or plasma with the use of a fluorine-based gas such as $GeF_4$ or $F_2$ and a silane-based gas such as $SiH_4$ or $Si_2H_6$.

In the case of forming the crystalline semiconductor film as described above and requiring the high temperature treatment, a quartz substrate that is highly heat resistant may preferably be employed.

The gate insulating film and the gate electrode are formed in this order over the semiconductor film. The gate insulating film can be formed by using an oxide film containing silicon or a nitride film containing silicon.

Then, an impurity element is doped in a self-aligned manner by using the gate electrode as a mask. Consequently, a channel forming region is formed below the source and drain regions doped with the impurity elements, and the gate electrode. By forming the edge of the gate electrode in a tapered shape, a low impurity region (LDD region) can be formed. A structure having an LDD region is called an LDD (Lightly Doped Drain) structure. The LDD structure has such characteristics that the tolerance to hot carrier deterioration can be enhanced and the off-leak current can be decreased. A structure where the LDD region overlaps with the gate electrode is called a gate-overlapped LDD structure (GOLD structure). The GOLD structure has high current driving capability and is much superior in the tolerance to hot carrier deterioration. The LDD structure or the GOLD structure can be formed when the gate electrode is formed to be a stacked-layer structure of a first gate electrode and a second gate electrode each having a different a tapered shape, for example. Such a gate electrode is preferably formed with any one of the following combinations: the first conductive film made of tantalum nitride (TaN) and the second conductive film made of tungsten (W), the first conductive film made of tantalum nitride (TaN) and the second conductive film made of titanium (Ti), the first conductive film made of tantalum nitride (TaN) and the second conductive film made of aluminum (Al), and the first conductive film made of tantalum nitride (TaN) and the second conductive film made of copper (Cu). As the first conductive film and the second conductive film, a semiconductor film which is typified by a polycrystalline silicon film doped with an impurity element such as phosphorus (P), or an AgPdCu alloy may be employed. As the channel forming region is made smaller, it is more preferable in order to suppress the short channel effect that a so-called side wall structure be employed, in which an insulator is formed at opposite sides of the gate electrode and an LDD region is formed below the insulator.

Then, an opening portion is formed in the gate insulating film, and wirings connecting to the source and drain regions (respectively denoted by a source wiring and a drain wiring) are formed. A thin film transistor can be completed in this manner.

In this embodiment mode, however, a passivation film 33 is further formed to cover the gate electrode and the semiconductor film. The passivation film 33 can prevent the oxidation of the surface of the gate electrode. In addition, a defect at the semiconductor film (dangling bond) can be terminated by hydrogen contained in the passivation film. As the passivation film 33, an oxide film containing silicon or a nitride film containing silicon, specifically, a film made of silicon oxide ($SiO_x$), silicon nitride ($SiN_x$), silicon oxynitride ($SiO_xN_y$) (x>y), silicon nitride oxide ($SiN_xO_y$) (x>y, x,y=1,2 . . . ), or the like can be used. In this embodiment mode also, an interlayer insulating film is provided in order to improve the planarity. An organic material, an inorganic material, and the like can be employed for the interlayer insulating film. As the organic material, polyimide, acryl, polyamide, polyimide amide, a resist, benzocyclobutene, siloxane, or polysilazane can be employed. <Siloxane is formed with a skeletal structure made of a bond of silicon (Si) and oxygen (O), and by a polymer material as a starting material which contains at least hydrogen as a substituent, or contains at least one of fluorine, alkyl group, and aromatic hydrocarbon as the substituent.> "Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent." Polysilazane is formed by a liquid material containing a polymer material having a bond of silicon (Si) and nitrogen (N), which is so-called polysilazane, as a starting material. As the inorganic material, an insulating film containing oxygen or nitrogen such as silicon oxide ($SiO_x$), silicon nitride ($SiN_x$), silicon oxynitride ($SiO_xN_y$) (x>y), silicon nitride oxide ($SiN_xO_y$) (x>y, x,y=1,2 . . . ), or the like can be used. The interlayer insulating film may be formed by laminating such insulating films. For example, the interlayer insulating film formed by the organic material easily absorbs moisture or oxygen while the planarity thereof is improved. In order to prevent the absorption, an insulating film containing the inorganic material is preferably formed on the organic material. When the inorganic material for the insulating film contains nitrogen, intrusion of an alkali ion such as Na can be prevented as well as moisture. A first insulating film 34 is formed by a pigmented organic material and a second insulating film 35 is formed by a light-transmitting organic material in this embodiment mode. It is to be noted that organic materials can be pigmented by dispersing carbon black particles and the like. The pigmented organic material can suppress the wraparound of light due to the wirings and the like. Thus, a function as a so-called black matrix can be provided.

Subsequently, opening portions are formed in the first and second insulating films 34 and 35, the passivation film 33, and the gate insulating film 32, and a source and drain wiring 36 is formed. The source and drain wiring is formed by a single layer or a laminated layer made of a conductive material. For example, the following stacked-layer structure can be employed: titanium (Ti)/aluminium-silicon (Al—Si)/Ti, molybdenum (Mo)/Al—Si/Mo, or molybdenum nitride (MoN)/Al—Si/MoN. In addition, as the conductive material, a film made of an aluminium alloy containing carbon and nickel (1 to 20 wt %) (Al(C+Ni)) may be employed. The (Al(C+Ni)) film keeps the high heat resistance even after energization or heat treatment and has an oxidation-reduction potential close to that of a pixel electrode (ITO or ITSO), which is described below. Therefore, it is a material in which the electric corrosion due to the battery effect hardly occurs and there are no large variations in the contact resistant value.

Then, the source and drain wiring 36 connecting to the thin film transistors Tr2 and Tr3 is connected to the pixel electrode 23. The pixel electrode is formed by a light-transmitting or a non light-transmissive material. For example, in the case of the light-transmissive material, ITO (indium tin oxide), IZO (indium zinc oxide) in which zinc oxide (ZnO) is mixed into indium oxide by 2 to 20%, ITO-$SiO_x$ in which silicon oxide ($SiO_2$) is mixed into indium oxide by 2 to 20% (referred to as ITSO or NITO for convenience), organic indium, organotin, or the like can be employed. In the case of the non light-transmissive material, an element selected among tantalum, tungsten, titanium, molybdenum, aluminum, copper as well as silver (Ag), or an alloy material or a compound material mainly containing such element can be employed.

An insulating film 37 is formed so as to cover the edge of the pixel electrode 23. The insulating film 37 functions as a partition (bank) in forming an electroluminescent layer. The insulating film 37 can be formed by either an inorganic material or an organic material similarly to the interlayer insulating film.

Subsequently, an opening portion is formed in the insulating film 37, on which an electroluminescent layer 24 is formed. The electroluminescent layer is formed so as to be in contact with the insulating film 37 at this time. Therefore, it is preferable for the insulating film 37 to have a shape where the curvature radius continuously varies, in order not to generate a pin hole and the like at the electroluminescent layer. In addition, the process from the heat treatment of the insulating film 37 up to the formation of the electroluminescent layer 24 is preferably carried out without exposing to the atmosphere.

For the electroluminescent layer, an organic material (including a low molecular weight material and a high molecular weight material) or a composition material of an organic material and an inorganic material can be employed. The electroluminescent layer can be formed by a droplet discharge method, a coating method, or a vapor deposition method. A high molecular weight material is preferably deposited by the droplet discharge method or the coating method while the low molecular weight material is preferably stacked by the vapor deposition method, in particular, a vacuum vapor deposition method. In this embodiment mode, the electroluminescent layer is formed by the vacuum vapor deposition method using a low molecular weight material.

As a state of a molecular exciton generated in the electroluminescent layer, there are a singlet excited state and a triplet excited state. The ground state is generally a singlet excited state and luminescence from the singlet excited state is called fluorescence. In addition, luminescence from the triplet excited state is called phosphorescence. Luminescence from the electroluminescent layer includes either case of the singlet excited state or the triplet excited state. In addition, both of fluorescence and phosphorescence can be used, and each of fluorescence and phosphorescence can be selected depending on the luminous characteristics (the emission luminance, the lifetime, and the like) of RGB respectively. For example, a material to be the triplet excited state is employed for the electroluminescent layer for R while a material to be the singlet excited state is employed for the electroluminescent layer for G and B.

In the electroluminescent layer specifically, HIL (Hole Injection Layer), HTL (HTL Hole Transport Layer), EML (EMitting Layer), ETL (Electron Transport Layer), and EIL (Electron Injection Layer) are laminated in this order on the pixel electrode 23. It is to be noted that the electroluminescent layer may have a single-layer structure as well as a stacked-layer structure, or a combination structure of them.

Specifically, CuPc or PEDOT is employed for HIL, a-NPD is employed for HTL, BCP or $Alq_3$ is employed for ETL, and BCP:Li or $CaF_2$ is employed for EIL. In addition, for EML, $Alq_3$ doped with a dopant corresponding to the respective emission colors of RGB (DCM and the like in the case of R and DMQD and the like in the case of G) can be employed.

It is to be noted that the electroluminescent layer is not limited to the above materials. For example, the hole injection property can be enhanced by co-evaporating oxide such as molybdenum oxide ($M_oO_x$: x=2 to 3) and a-NPD or rubrene instead of using CuPc or PEDOT. For the electron injection layer, a benzoxazole derivative (denoted by BzOS) may be employed as well.

When the respective electroluminescent layers for RGB are formed, high resolution display can be performed by using a color filter. This is because a broad peak can be corrected to be sharp in an emission spectrum of each RGB by the color filter.

Although the case of forming respective electroluminescent layers for RGB is described hereinabove, an electroluminescent layer for monochrome light emission may be formed. In that case, a color filter or a color conversion layer is combined to display images with full color. For example, when an electroluminescent layer for white or orange light emission is formed, a color filter, or a color filter combined with a color conversion layer is provided to perform a full color display.

Needless to say that monochrome display can be performed by forming the electroluminescent layer for monochrome light emission. For example, area color display can be performed by using the monochrome light emission. Area color display is mainly suitable for the case of displaying characters and symbols.

Then, a second electrode 25 of the light emitting element 18 is formed so as to cover the electroluminescent layer 24 and the insulating film 37.

Note that, it is necessary to select a material for each of the pixel electrode (denoted by a first electrode for convenience) 23 and the second electrode 25 in consideration of the work function. The first electrode 23 and the second electrode 25 can be an anode or a cathode depending on a pixel structure. Electrode materials for the anode and the cathode are described below.

As a material for the anode, a metal, an alloy, an electrically conductive compound or a mixture of them each having a high work function (a work function of 4.0 eV or higher) is preferably employed. Specifically, ITO, ZnO, IZO, ITSO, silver, platinum, nickel, tungsten, chromium, molybdenum, iron, cobalt, copper, palladium, or metal nitride (e.g., titanium nitride) can be employed.

As a material for the cathode, a metal, an alloy, an electrically conductive compound or a mixture of them each having a low work function (a work function of 3.8 eV or lower) is preferably employed. Specifically, an element of the first or second group of the periodic table, that is an alkali metal such as lithium and cesium, magnesium, calcium, or strontium, an alloy containing such an element (Mg:Ag, Al:Li), a compound (LiF, CsF, $CaF_2$), or a transition metal including a rare-earth metal can be employed.

The direction of light emitted from the electroluminescent layer can be selected by forming the first electrode and the second electrode to transmit light or not. For example, when the first electrode and the second electrode are each formed by a light-transmissive material, dual emission display can be performed in which light from the electroluminescent layer is emitted to both the substrate 30 side and a sealing substrate side.

In the case where light from the electroluminescent layer is emitted to the substrate 30 side, the first electrode is formed to transmit light and the second electrode is formed not to transmit light. Consequently, a bottom emission display device can be provided. In the case where light from the electroluminescent layer is emitted to the sealing substrate side, the first electrode is formed to be non light-transmitting and the second electrode is formed to be light-transmitting. Consequently, a top emission display device can be provided. In these cases, light can be efficiently utilized by using a highly reflective conductive film for the non light-transmissive electrode provided on a side to which light is not emitted.

In this embodiment mode, since a pigmented organic material is employed for the first interlayer insulating film 34, a non light-transmissive material is employed for the first electrode and a light-transmissive material is employed for the second electrode so as to be a top emission type. Alternatively, by employing a light-transmissive material such as ITO for the first electrode and without employing a pigmented organic material for the interlayer insulating film, a bottom emission type can be obtained.

In addition, if the first electrode or the second electrode is required to transmit light in this embodiment mode, the electrode can be formed by a lamination of an extremely thin film of a metal or an alloy containing the metal, and ITO, IZO, ITSO, or another transparent conductive film (including an alloy).

In this manner, the pixel portion can be formed.

It is to be noted that the interlayer insulating film preferably has a stacked-layer structure in order to prevent crosstalk which may occur between a signal line and a scan line. For obtaining the sufficient thickness to prevent the crosstalk, it is preferable that an organic material be partially employed for the interlayer insulating film. In the case of employing an inorganic material for the interlayer insulating film, a low dielectric constant material (low-k material) is preferably employed.

In the case where interlayer insulating films are stacked and light from the light emitting element is emitted in the bottom direction, it is preferable to prevent refraction of light at an interface between different kinds of materials. For example, an opening portion is formed in a first interlayer insulating film, and a second interlayer insulating film is formed so as to fill in the opening portion. Accordingly, refraction of light at an interface between the first interlayer insulating film and the second interlayer insulating film can be prevented so that the light extraction efficiency can be enhanced.

Described below is a structure example of the case where such interlayer insulating films are stacked and an opening portion is formed in the interlayer insulating film as described above.

In FIG. 4B, interlayer insulating films are stacked unlike FIG. 4A and an opening portion is provided in the first interlayer insulating film. The opening portion is formed in a region where the electroluminescent layer is provided. In addition; as the first switch 13, a thin film transistor having a multi-gate structure in which a plurality of gate electrodes are formed over a semiconductor film can be used. The other configuration is the same as that in FIG. 4A, thus the description thereof is omitted here. Accordingly, even when a pigmented organic material is employed for the first interlayer insulating film, bottom emission can be carried out. In addition, even when the pigmented organic material is not employed, refraction of light at an interface between the interlayer insulating film and the like can be reduced by providing the opening portion in the first interlayer insulating film. In addition, when the first electrode and the second electrode are each formed by a light-transmissive material, dual emission can be realized. Needless to say that top emission can be realized when the first electrode is formed by a non light-emitting material and the second electrode is formed by a light-emitting material.

In FIG. 5A, the wiring 36 is formed after the formation of the pixel electrode 23 unlike FIG. 4A. The other configuration is the same as that in FIG. 4A, thus the description thereof is omitted here.

In FIG. 5B, an opening portion is provided in the first interlayer insulating film unlike FIG. 5A. The opening portion is formed in the first interlayer insulating film in a region where the electroluminescent layer is provided. In addition, as the first switch 13, a thin film transistor having a multi-gate structure in which a plurality of gate electrodes are formed over a semiconductor film can be used. The other configuration is the same as that in FIG. 5A, thus the description thereof is omitted here. Accordingly, even when a pigmented organic material is employed for the first interlayer insulating film, bottom emission can be carried out. In addition, even when the pigmented organic material is not employed, refraction of light at an interface between the interlayer insulating film and the like can be reduced by providing the opening portion in the first interlayer insulating film. In addition, when the first electrode and the second electrode are each formed by a light-transmissive material, a dual emission type can be realized as shown in FIG. 5B. Needless to say that top emission can be realized when the first electrode is formed by a non light-transmissive material and the second electrode is formed by a light-transmissive material.

In FIG. 6A, unlike FIG. 4A, the passivation film is formed to have a stacked-layer structure, the wiring 36 is formed before the formation of the interlayer insulating film, an opening portion is formed in the interlayer insulating film 34, and the pixel electrode 23 is formed so as to connect to the wiring 36. As the passivation film, a silicon oxynitride (SiON) film as a first layer and a silicon nitride oxide (SiNO) film as a second layer can be used. The pixel shown in FIG. 6A may have a structure where the first interlayer insulating film 34 and the second interlayer insulating film 35 are stacked. The other configuration is the same as that in FIG. 4A, thus the description thereof is omitted here.

In FIG. 6B, an opening portion is provided in the first interlayer insulating film unlike FIG. 6A. The opening portion is formed in the first interlayer insulating film in a region where the electroluminescent layer is provided. In addition, as the first switch 13, a thin film transistor having a multi-gate structure in which a plurality of gate electrodes are formed over a semiconductor film is used. The other configuration is the same as that in FIG. 6A, thus the description thereof can be obtained by referring to FIG. 4A. Accordingly, even when a pigmented organic material is employed for the first interlayer insulating film, bottom emission can be carried out. In addition, even when the pigmented organic material is not employed, refraction of light at an interface between the interlayer insulating film and the like can be reduced by providing the opening portion in the first interlayer insulating film. In addition, when the first electrode and the second electrode are each formed by a light-transmissive material, a dual emission type can be realized as shown in FIG. 6B. Needless to say that top emission can be realized when the first electrode is formed by a non light-transmissive material and the second electrode is formed by a light-transmissive material.

Figure 43:
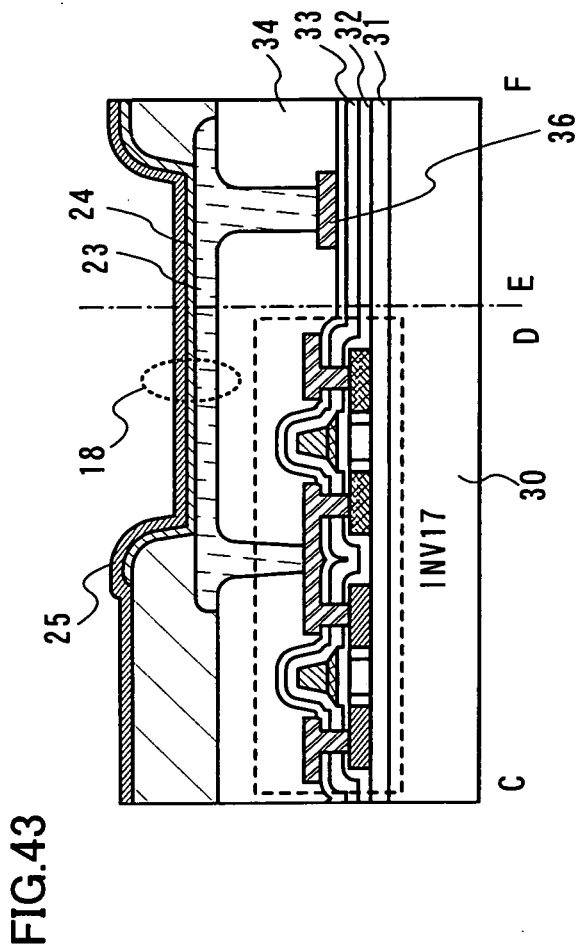
FIG. 43 is a sectional view illustrating a pixel of the invention.

FIG. 43 is a cross-sectional view taken along lines C-D and E-F in FIG. 3. In the pixel configuration of the invention, the pixel electrode 23 functioning as an electrode of a light emitting element and the wiring 36 may be connected to each other for each pixel.

Although the pixel electrode 23 and the wiring 36 are directly connected to each other in FIG. 43, they may be connected via a conductive film (typically, ITO) which is formed in the same layer as the pixel electrode 23.

When the pixel electrode 23 and the wiring 36 are connected to each other as described above, the wiring 36 can be used as an auxiliary wiring for the pixel electrode 23 by setting the pixel electrode 23 and the wiring 36 to have the same potential. The auxiliary wiring makes it possible to suppress the voltage drop even in the case where the resistance becomes high since the pixel electrode 23 is formed thin.

It is to be noted that the auxiliary wiring may be used in common with a wiring for a capacitor or a power supply line for an inverter. Accordingly, the auxiliary wiring can be provided without increasing the number of wirings. Such a configuration enables the manufacturing yield to be improved. The structure of the auxiliary wiring shown in FIG. 43 can be applied to any one of the pixel configurations of the invention.

In FIG. 7A, unlike FIG. 6A, the wiring 36 is formed by two layers. Specifically, a wiring 36a is formed on an opening portion provided in the first interlayer insulating film 34, the second interlayer insulating film 35 is formed, and then a wiring 36b is formed on an opening portion provided in the second interlayer insulating film 35. For example, (Al(C+Ni)) and Ti/Al—Si/Ti can be employed as the wiring 36a and the wiring 36b respectively. The other configuration is the same as that in FIG. 6A, thus the description thereof can be obtained by referring to FIG. 4A.

In FIG. 7B, an opening portion is provided in the first interlayer insulating film unlike FIG. 7A. The opening portion is formed in the first interlayer insulating film in a region where the electroluminescent layer is provided. In addition, as the first switch 13, a thin film transistor having a multi-gate structure in which a plurality of gate electrodes are formed over a semiconductor film is used. The other configuration is the same as that in FIG. 7A, thus the description thereof can be obtained by referring to FIG. 4A. Accordingly, even when a pigmented organic material is employed for the first interlayer insulating film, bottom emission can be carried out. In addition, even when the pigmented organic material is not employed, refraction of light at an interface between the interlayer insulating film and the like can be reduced by providing the opening portion in the first interlayer insulating film. In addition, when the first electrode and the second electrode are each formed by a light-transmissive material, a dual emission type can be realized as shown in FIG. 7B. Needless to say that top emission can be realized when the first electrode is formed by a non light-transmissive material and the second electrode is formed by a light-transmissive material.

By forming the pixel electrode 23 on the flat surface of the interlayer insulating film and the like as described above, a voltage can be applied evenly. Accordingly, good image display can be performed.

Furthermore, the display device formed in this manner may be provided with a polarizer or a circular polarizer in order to improve the contrast. In that case, when a film for polarizing a wave within the emission spectrum of a light emitting element as the center wavelength is provided on an emission side of the light emitting element, the contrast can be improved and being a mirror surface (glare) due to wiring and the like can be prevented.

Figure 41:
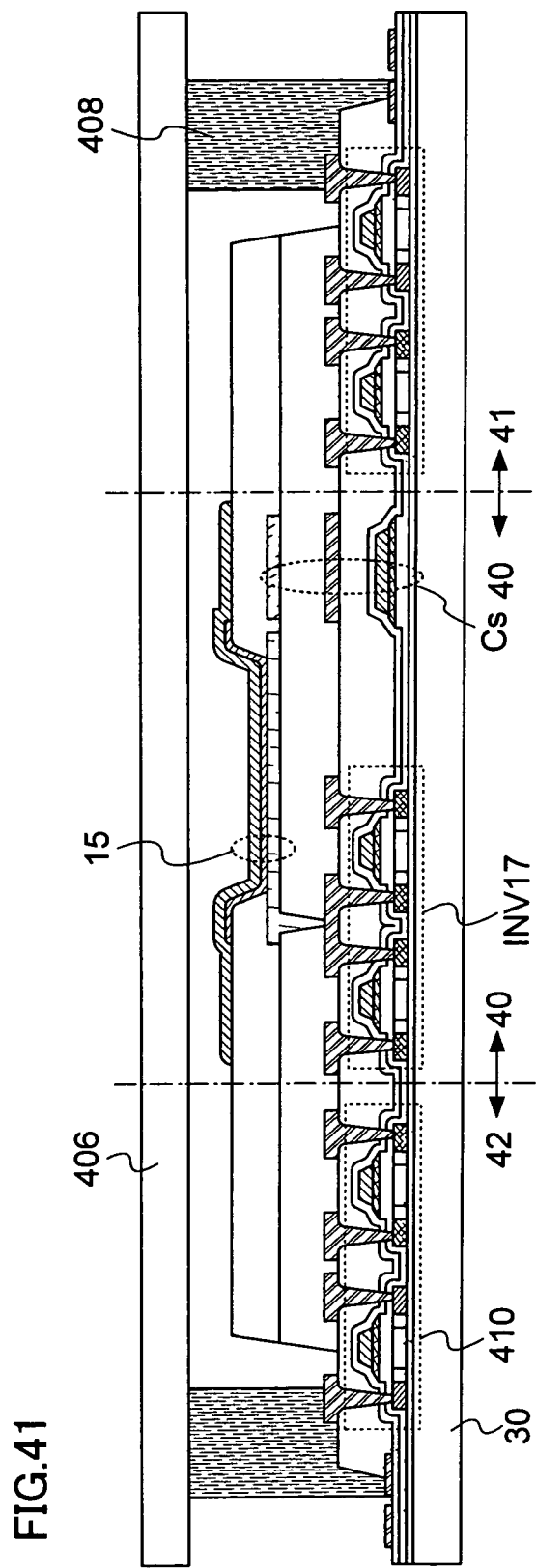
FIG. 41 is a sectional view illustrating a display device of the invention.

FIG. 41 is a sectional view of respective regions of a part of the pixel portion shown in FIGS. 6A and 6B, a first gate driver 41, and a second gate driver 42. The first and the second capacitors can be each formed by a gate electrode material, the interlayer insulating film 34, the wiring 36 and the like, though not shown in FIGS. 6A and 6B. A sealing member 408 is provided in the first and the second gate driver regions. A counter substrate 406 can be attached by means of the sealing member. Space formed between the element substrate and the counter substrate 406 being attached is preferably filled with an inert gas such as nitrogen or a resin material, or provided with a drying agent, by which the light emitting element 15 can be prevented from deteriorating due to moisture or oxygen.

In addition, by providing the sealing member on the gate driver as shown in FIG. 41, the frame size of the display device can be reduced. Alternatively, the sealing member may be provided on a source driver. In that case, attention is required since many leading-out wiring and the like are provided.

Such a sealing structure can be applied to any one of the pixel configurations shown in FIGS. 4A, 4B, 5A, 5B, 7A, and 7B This embodiment mode can be freely combined with any of the other embodiment modes.

Embodiment Mode 5

In this embodiment mode, constitution of a display panel having the pixel portion described in the above embodiment modes is described.

The display panel comprises a pixel region 40 where a plurality of the pixels are arranged in matrix, the first gate driver 41, the second gate driver 42, and a source driver 43. The first gate driver 41 and the second gate driver 42 are preferably disposed so as to face each other with the pixel region 40 interposed therebetween, or on any one of the left, right, top and bottom of the pixel region 40.

The source driver 43 includes a pulse output circuit 44 and a selection circuit 46. The selection circuit 46 includes a switch which is controlled by a select signal (select signal) from a wiring (selection wiring) 47. The video signal 20 or the reference signal 21 is inputted to the signal line (Si) 10 depending on the switch.

A specific example of the source driver is described below.

Figure 9:
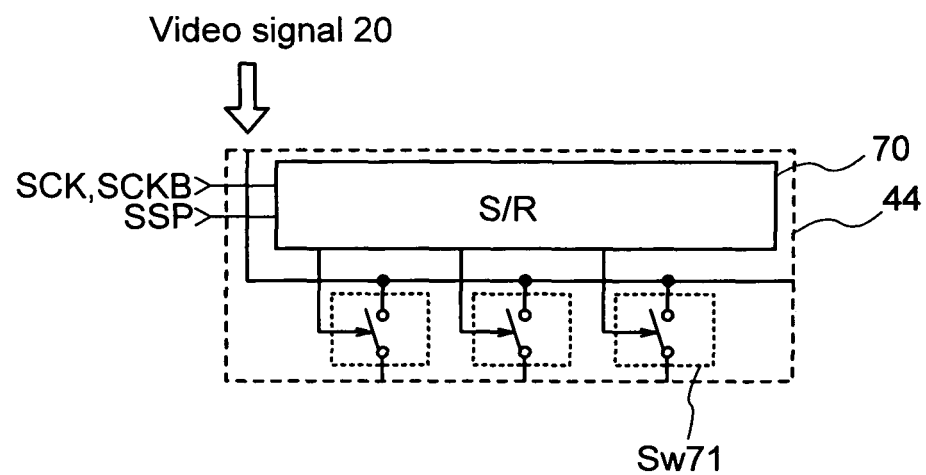
FIG. 9 is a diagram illustrating a driver circuit of the invention.

As shown in FIG. 9, the pulse output circuit 44 includes a shift register. (S/R) 70 to which a start clock pulse (SCK) and an inverted start clock pulse (SCKB) are inputted. The pulse output circuit further includes a first switch Sw71, and outputs the video signal 20 when the switch is selected based on the start clock pulse. It is to be noted that the first analog switch 71 includes a thin film transistor.

Figure 10:
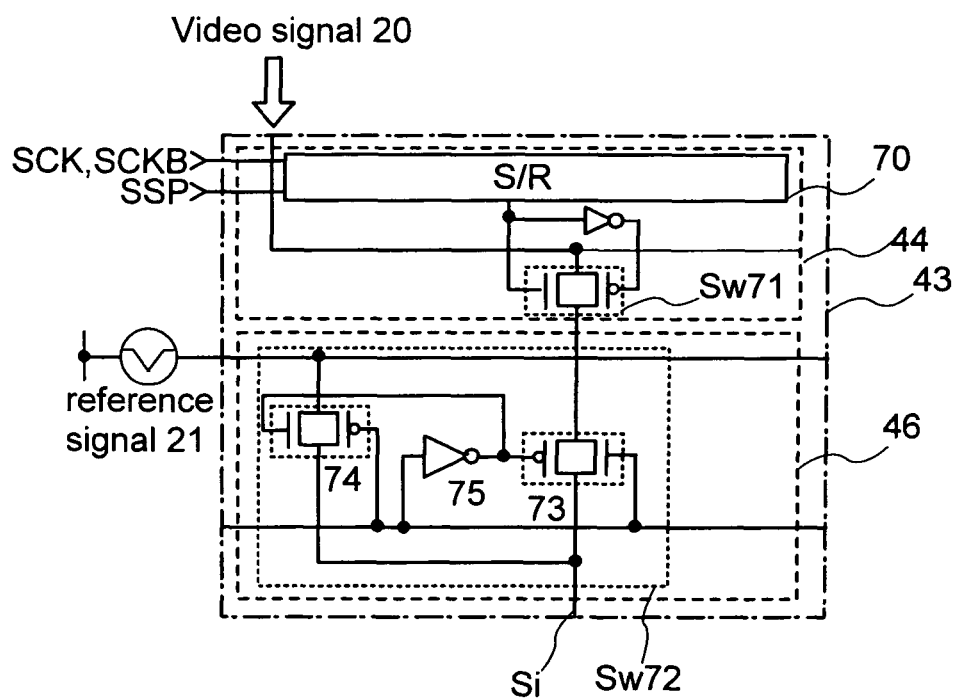
FIG. 10 is a diagram illustrating a driver circuit of the invention.

As shown in FIG. 10, the selection circuit 46 includes a second switch Sw72, and the second switch Sw72 includes a first analog switch 73, a second analog switch 74, and an inverter 75. The first and the second analog switches 73 and 74, and the inverter 75 each has thin film transistors which are different in polarity. The input side of the first analog switch 73 is connected to the first switch 71 of the pulse output circuit 44, and the output side thereof is connected to the signal line (Si) 10. The input side of the second analog switch 74 is inputted with the reference signal 21, and the output side thereof is connected to the signal line (Si) 10. The inverter 75 is provided such that the first analog switch 73 and the second analog switch 74 are selected alternately.

According to the source driver 43, the video signal 20 is inputted to the signal line 10 when the first analog switch 73 is selected whereas the reference signal 21 is inputted to the signal line 10 when the second analog switch 74 is selected. The period during which the first analog switch 73 is selected is a video signal inputting period T2 and the period during which the second analog switch 74 is selected is a reference signal inputting period T1.

Figure 11:
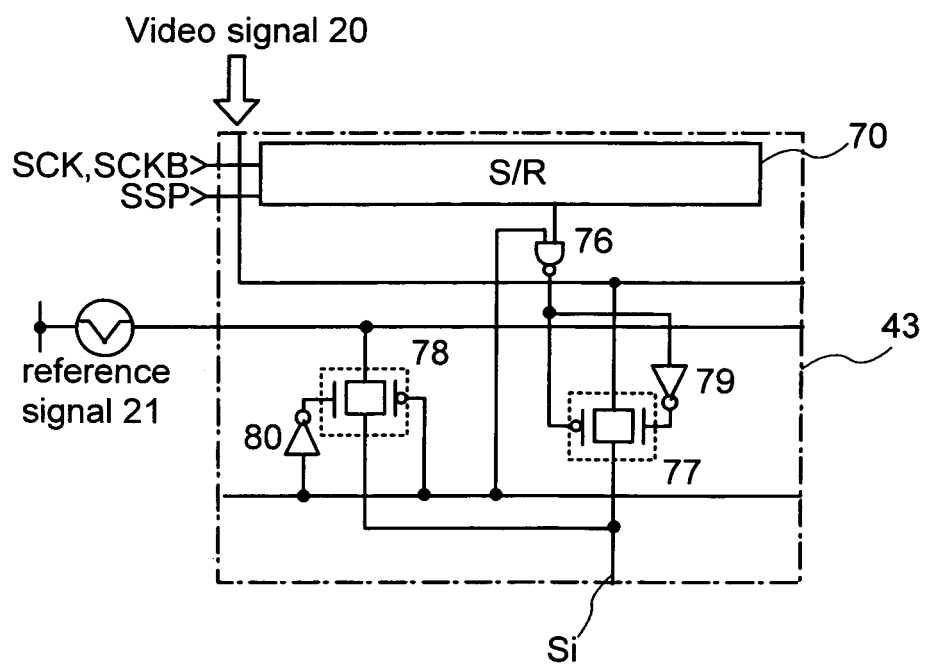
FIG. 11 is a diagram illustrating a driver circuit of the invention.

Alternatively, as shown in FIG. 11, the function of the pulse output circuit 44 and the function of the selection circuit 46 can be shared. The source driver 43 shown in FIG. 11 includes a NAND 76 which is connected to the shift register 70. A first analog switch 77 and an inverter 79 which is provided such that the first analog switch 77 is selected are included. In addition, a second analog switch 78 which is inputted with the reference signal 21 and an inverter 80 which is provided such that the second analog switch 78 is selected are included. The output side of each of the first and the second analog switches 77 and 78 is connected to the signal line 10. One of the first analog switch 77 and the second analog switch 78 is selected by the NAND 76. The period during which the first analog switch 77 is selected is a video signal inputting period T2 and the period during which the second analog switch 78 is selected is a reference signal inputting period T1.

It is to be noted that the source driver is not limited to the configurations shown in FIGS. 9 to 11 so long as the video signal 20 and the reference signal 21 are inputted to the signal line 10 alternately in the circuit.

The first gate driver 41 includes a pulse output circuit 54 and a selection circuit 55. The second gate driver 42 includes a selection circuit 57. The selection circuits 55 and 57 are connected to a first selection wiring 52a and a second selection wiring 52b respectively. A pulse signal A (select pulse A) which is inputted from the first selection wiring 52a and a pulse signal B (select pulse B) which is inputted from the second selection wiring 52b are inverted to each other. Then, the pulse signal A is inputted to the first scan line Ga based on a signal from a first selection circuit 57a. The pulse signal B is inputted to the first scan line Ga based on a signal from a second selection circuit 57b. By the pulse signal A and the pulse signal B, a pulse signal which is inputted to the first scan line Ga as shown in FIG. 2C is generated. The first switch 13 is selected in accordance with the pulse signal.

Figure 33:
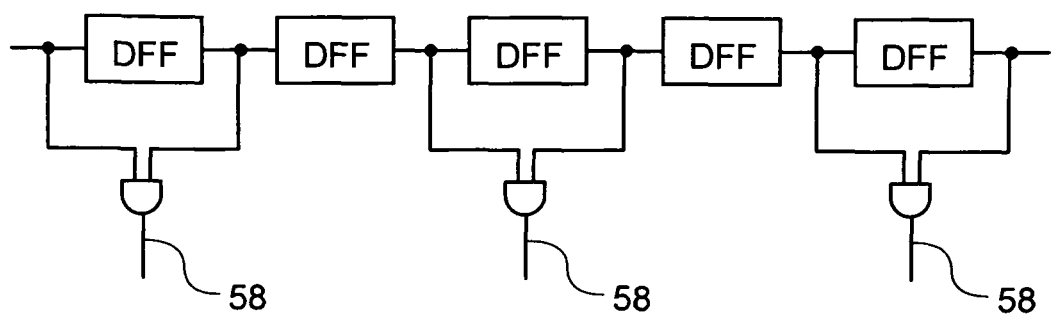
FIG. 33 is a diagram illustrating constitution of a shift register of the invention.

The second scan line Gb is inputted with a pulse signal as shown in FIG. 2C from the pulse output circuit 54. In order to generate the pulse signal, the pulse output circuit 54 includes a delay flip-flop (DFF) circuit as shown in FIG. 33. Although each DFF outputs a pulse signal, an output wiring 58 is provided every other DFF in order to generate the pulse signal as shown in FIG. 2C. The second switch 14 is selected in accordance with the pulse signal.

The first selection circuit 57a inputs the pulse signal (select pulse A) to input to the first scan line (Ga) 11. At this time, a thin film transistor corresponding to the first switch 13 of a pixel is selected, and the video signal 20 is inputted from the signal line 10.

The pulse output circuit 54 of the first gate driver 41 may be configured by using a shift register which is constituted by a plurality of flip-flop circuits, or a decoder circuit. Similarly, the pulse output circuit 44 of the source driver 43 may be configured by using a shift register which is constituted by a plurality of flip-flop circuits, or a decoder circuit as well. When a decoder circuit is employed as the pulse output circuits 44 and 56 respectively, random selection of a source line Sx or a scan line Gy can be carried out.

It is to be noted that the configuration of the source driver 43 is not limited to the above description, and another circuit such as a level shifter and a buffer may be provided. In addition, the configuration of each of the first gate driver 41 and the second gate driver 42 is not limited to the above description, and another circuit such as a level shifter and a buffer may be provided.

In addition, the source driver 43, the first gate driver 41, and the second gate driver 42 may each includes a protection circuit. The protection circuit includes at least one of a resistor, a capacitor, and a rectifying element. The rectifying element is a diode or a transistor of which gate and drain electrodes are connected to each other. According to the protection circuit, electrostatic discharge due to a large current such as the static electricity can be prevented. Particulars about the protection circuit are described in an embodiment mode later.

The display device of the invention comprises a power source control circuit 63. The power source control circuit 63 includes a power source circuit 61 which supplies power to the light emitting element 18, and a controller 62. The power source circuit 61 includes a power source 83 which is connected to a counter electrode of the light emitting element 18.

In the case where a forward voltage is applied to the light emitting element 18 so that the light emitting element 18 is supplied with a current to emit light, the potential of the power source 83 is set to be lower than the potential of the pixel electrode of the light emitting element 18. On the other hand, in the case where a reverse-voltage is applied in the AC drive period, the potential of the power source 83 is set to be higher than the potential of the pixel electrode of the light emitting element 18. Such setting of the power source 83 can be performed by inputting a predetermined signal from the controller 62 to the power source circuit 61.

This is preferable because the condition of the light emitting element 18 and the reliability thereof can be improved by applying a reverse voltage to the light emitting element 18 with the power source control circuit 63.

It is further preferable that the display panel comprise a monitor circuit 64 which operates based on the temperature of the environment (hereinafter referred to as the environmental temperature) and a control circuit 65. The monitor circuit 64 includes a light emitting element for monitoring 66 (hereinafter referred to as a light emitting element 66). The light emitting element for monitoring is formed similarly to the light emitting element 18 of a pixel, however, it is not required to be used for image display. By the light emitting element for monitoring 66, data on the change in an element depending on the environmental temperature can be obtained.

The light emitting element for monitoring 66 is supplied with a current by a constant current source or the like. At this time, the same amount of current as that to the light emitting element 18 is preferably supplied. Data on the deterioration of the light emitting element can be also obtained in this manner.

The control circuit 65 includes a constant current source and a buffer. The control circuit 65 supplies to the power source control circuit 63 a signal for changing the power source potential based on the output of the monitor circuit 64. The power source control circuit 63 changes the power source potential to be supplied to the pixel region 40 based on the signal supplied from the control circuit 65. According to the invention having the abovedescribed constitution, the variation of a current value due to change of the environmental temperature can be suppressed, and the reliability can be improved.

According to the monitor circuit 64, the driving voltage can be corrected depending on the condition of the light emitting element. Particular constitution of the monitor circuit 64 and the like are described in an embodiment mode later.

In addition, when the driving voltage exceeds a limit value, a display screen may display that. Alternatively, the luminance of the display screen may be gradually decreased or the display screen may be lightened.

Figure 8:
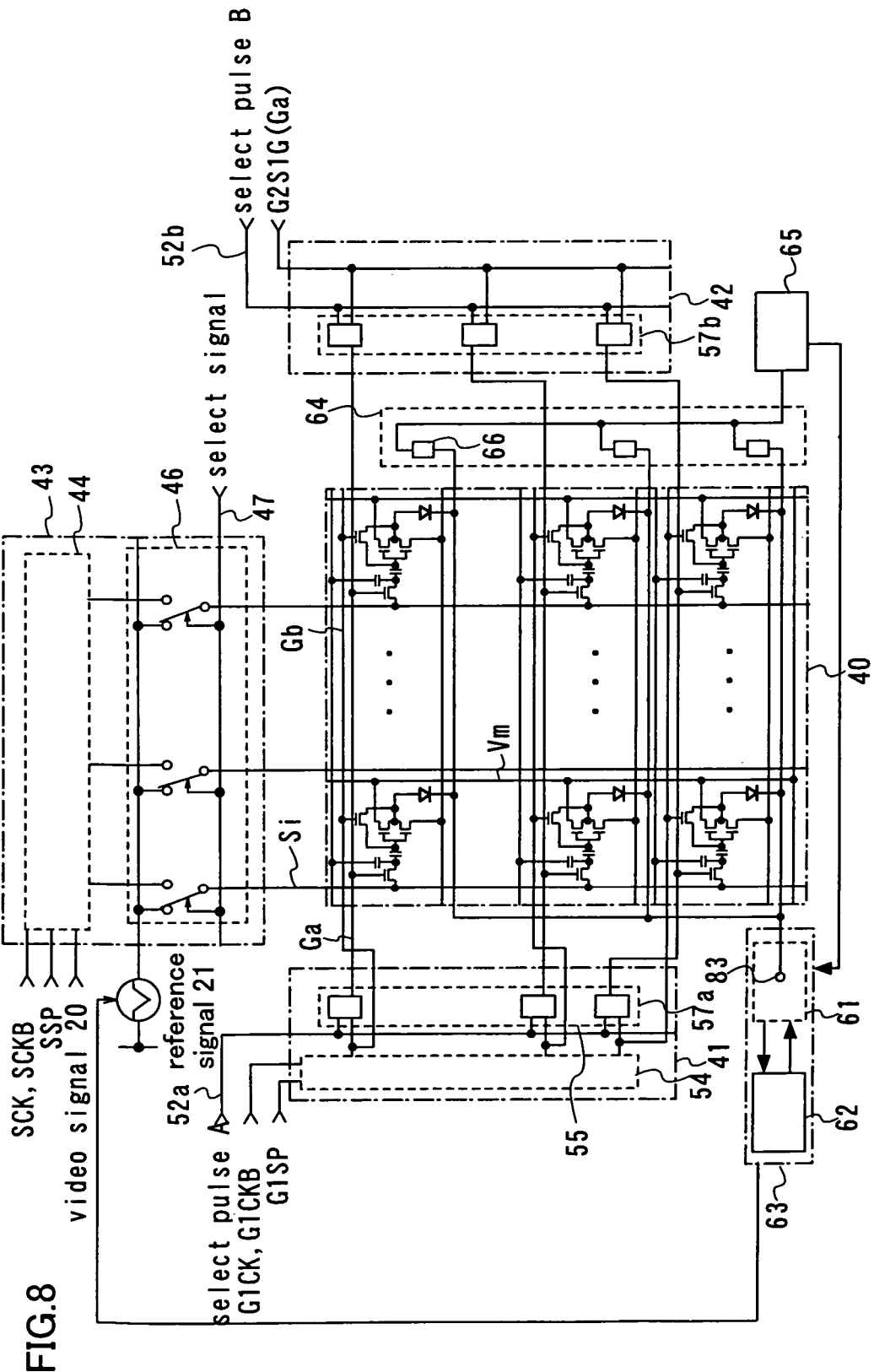
FIG. 8 is an overall diagram of a panel comprising a pixel of the invention.

It is to be noted that the thin film transistor in this embodiment mode may be any type of transistors other than the thin film transistor. In addition, the transistor may be formed over any substrate. That is, the entire circuit as shown in FIG. 8 may be formed over a glass substrate, a plastic substrate, a monocrystalline substrate, or an SOI substrate. Alternatively, it is possible that a part of the circuit shown in FIG. 8 is formed over a substrate and another part of the substrate is formed over another substrate. That is, the entire circuit shown in FIG. 8 is not necessarily formed over the same substrate unlike that shown in FIG. 8. For example, in FIG. 8, the pixel region 40 and the gate driver 41 may be formed over a glass substrate by using a TFT, the source driver 43 (or a part thereof) may be formed over a monocrystalline substrate, and an IC chip thereof may be disposed onto the glass substrate by connecting by COG (Chip On Glass). The IC chip may be connected to the glass substrate by using TAB (Tape Auto Bonding) or a printed substrate as well.

This embodiment mode can be freely combined with any of the other embodiment modes.

Embodiment Mode 6

Figure 12:
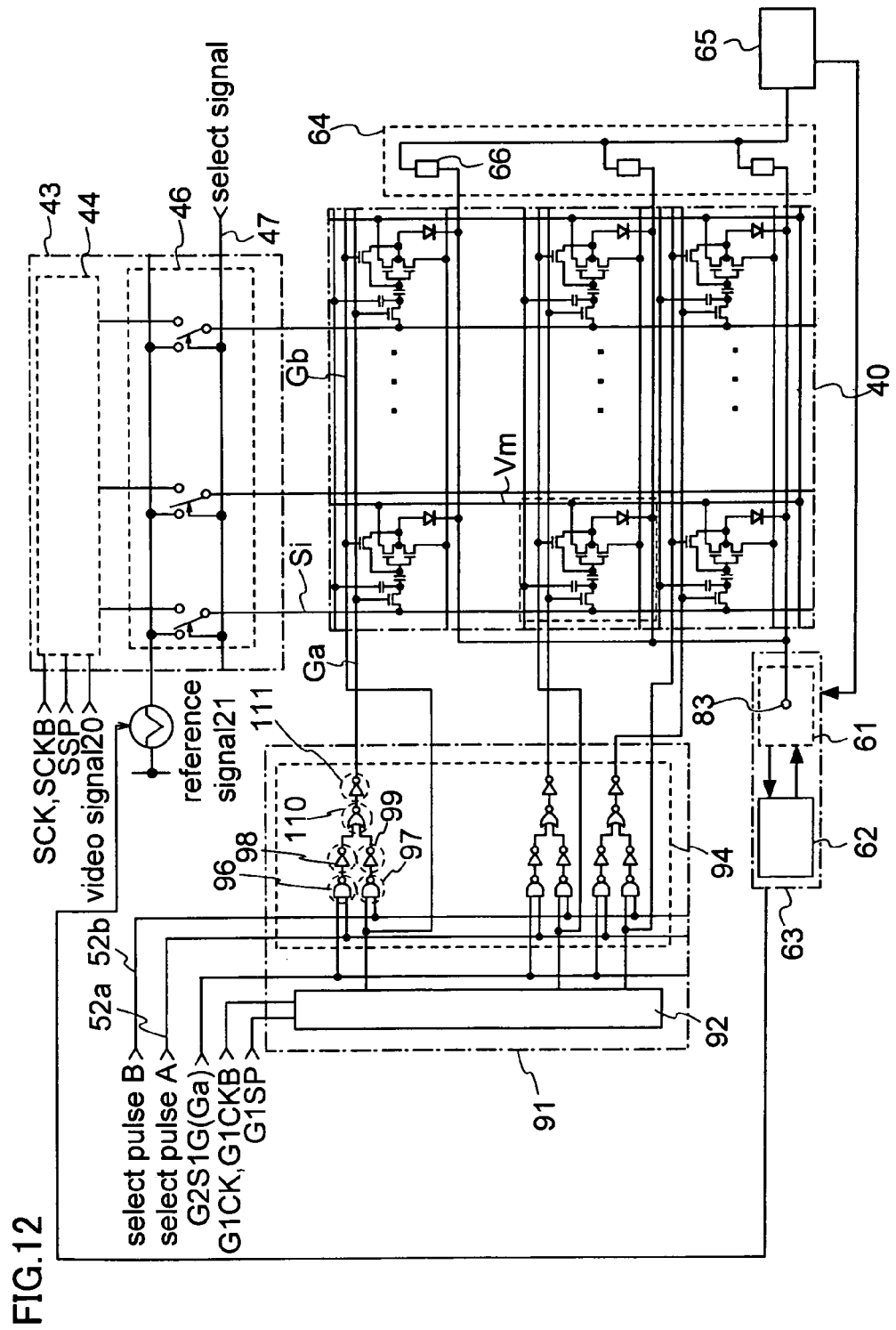
FIG. 12 is an overall diagram of a panel comprising a pixel of the invention.

In this embodiment mode, the display panel comprising a pixel portion described in the above embodiment mode and having a configuration that the first and the second gate drivers are shared is described using FIG. 12.

The source driver 43 includes the pulse output circuit 44 and the selection circuit 46, which is the same constitution as that in FIG. 8.

A gate driver 91 includes a pulse output circuit 92 and a selection circuit 94. The selection circuit 94 includes NANDs 96 and 97, inverters 98, 99, and 111, and a NOR 110 corresponding to each scan line. The first selection wiring 52a is connected to one terminal of the NAND gate 96. The other terminal of the NAND gate 96 is connected to a wiring (G2S1G) which is inputted with a pulse signal. The second selection wiring 52b is connected to one terminal of the NAND gate 97. The other terminal of the NAND gate 97 is connected to the pulse output circuit 92. The output side of the NAND 96 is connected to the input side of the inverter 98. The output side of the NAND 97 is connected to the input side of the inverter 99. The output sides of the inverters 98 and 99 are connected to the input side of the NOR 110, and the output side of the NOR 110 is connected to the input side of the inverter 111.

Similarly to the above embodiment mode, the pulse output circuit 44 of the source driver 43, a first pulse output circuit 94 and the second pulse output circuit 92 of the gate driver 91 may be each configured by using a shift register which is constituted by a plurality of flip-flop circuits, or a decoder circuit. When a decoder circuit is employed as the pulse output circuits 44, 92, and 93 respectively, random selection of a source line Sx or a scan line Gy can be carried out.

It is to be noted that the configuration of the source driver 43 is not limited to the above description, and another circuit such as a level shifter and a buffer may be provided. In addition, the configuration of each of the gate driver 91 is not limited to the above description, and another circuit such as a level shifter and a buffer may be provided. In addition, similarly to the above embodiment mode, the source driver 43 and the gate driver 91 each includes a protection circuit. Particulars about the protection circuit are described in an embodiment mode later.

By sharing the gate drivers in this manner, the pixel region 40 can occupy large area. Accordingly, the frame size of the display panel can be reduced.

This embodiment mode can be freely combined with any of the other embodiment modes.

Embodiment Mode 7

In this embodiment mode, operation of applying a reverse voltage and a pixel configuration for the operation are described.

Figure 18:
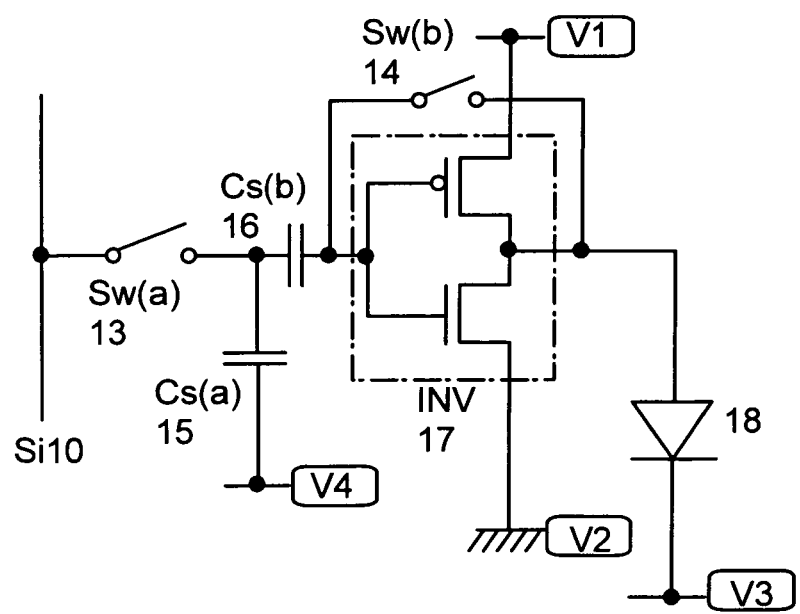
FIG. 18 is a diagram illustrating a pixel to which a reverse voltage is applied of the invention.

Description is made in a pixel where a P-channel thin film transistor and an N-channel thin film transistor are provided as the inverter 17 as shown in FIG. 18. In FIG. 18, the voltage of one side of the inverter 17 is denoted by V1, the voltage of the other side thereof is denoted by V2, the potential of the counter electrode of the light emitting element 18 is denoted by V3, and the low potential of the first capacitor 15 is denoted by V4.

In the pixel configuration shown in FIG. 18, it is preferable to set such that a potential difference between the counter electrode and the pixel electrode of the light emitting element 18 is inverted, in order to apply a reverse voltage in the alternating drive period.

Figure 23:
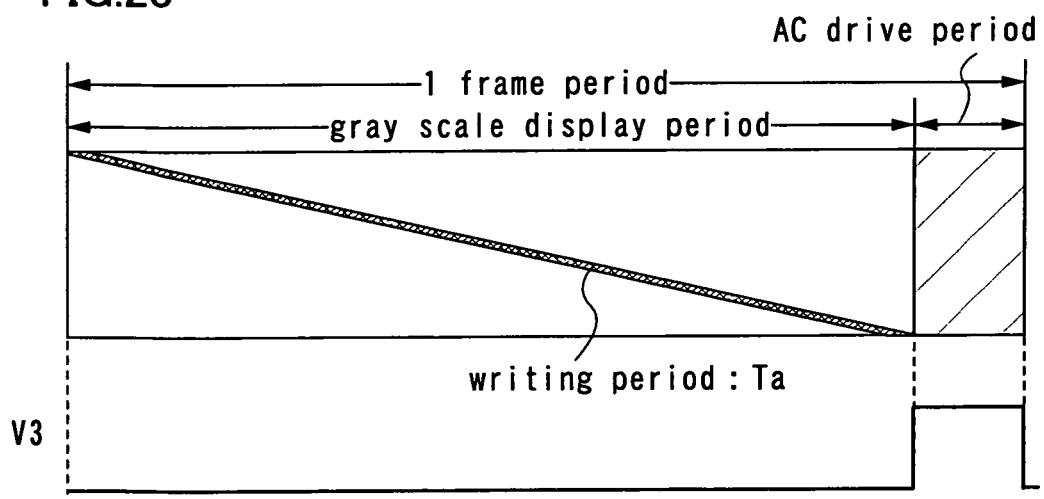
FIG. 23 is a diagram illustrating an operation where a reverse voltage is applied of the invention.

Therefore, as shown in FIG. 23, for example, the potential V3 of the counter electrode is set to be higher than the potential of the pixel electrode in the alternating drive period. That is, the case where the potential of the counter electrode of the light emitting element 18 is varied is described. It is to be noted that in the pixel configuration shown in FIG. 18, light emission is obtained when the potential of the pixel electrode of the light emitting element 18 is higher than the potential V3 of the counter electrode. According to the potential variation of the counter electrode of the light emitting element 18, in the case where the potential V3 of the counter electrode is equal to the potential V1 of the inverter 17, the N-channel transistor of the inverter 17 is turned on in the alternating drive period. Consequently, a reverse voltage is applied to a light emitting element which is connected to the inverter 17. In addition, in the case where the potential V3 of the counter electrode is higher than the potential V1 of the inverter 17, a reverse voltage can be applied to all the pixels in the alternating drive period.

It is to be noted that in the alternating drive period, the potential V3 of the counter electrode may be increased while the voltage V1 of one side of the inverter 17 may be decreased as shown in FIG. 23.

Note that a method, a circuit configuration, and a timing of applying a reverse voltage are not limited to those shown in FIGS. 23 and 18. For example, a configuration where the potential of the counter electrode is fixed may be employed. A pixel configuration and operation in this case are described below.

Figure 19:
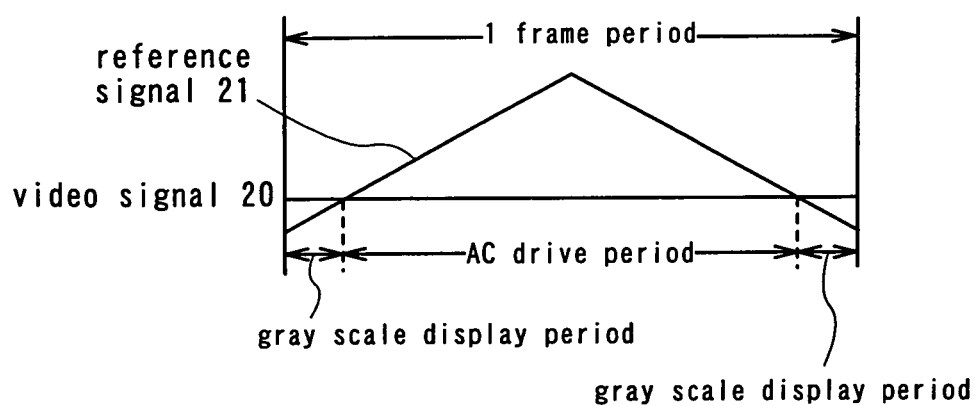
FIG. 19 is a diagram illustrating an operation where a reverse voltage is applied of the invention.

In the pixel shown in FIG. 18, as shown in FIG. 19, a period in which the potential of the reference signal 21 is smaller than that of the video signal 20 within one frame period is a gray scale display period. On the other hand, a period in which the potential of the reference signal 21 is higher than that of the video signal 20 is a non gray scale display period, which is an alternating drive period in which a reverse voltage is applied.

It is to be noted that the potential V3 of the counter electrode of the light emitting element 18 is fixed and made higher than the potential V2 of the inverter 17 as described above. Consequently, a reverse voltage can be applied to the light emitting element 18. That is, by satisfying the above potentials respectively, a reverse voltage can be applied to the light emitting element 18 constantly when light emission is not performed.

Figure 20:
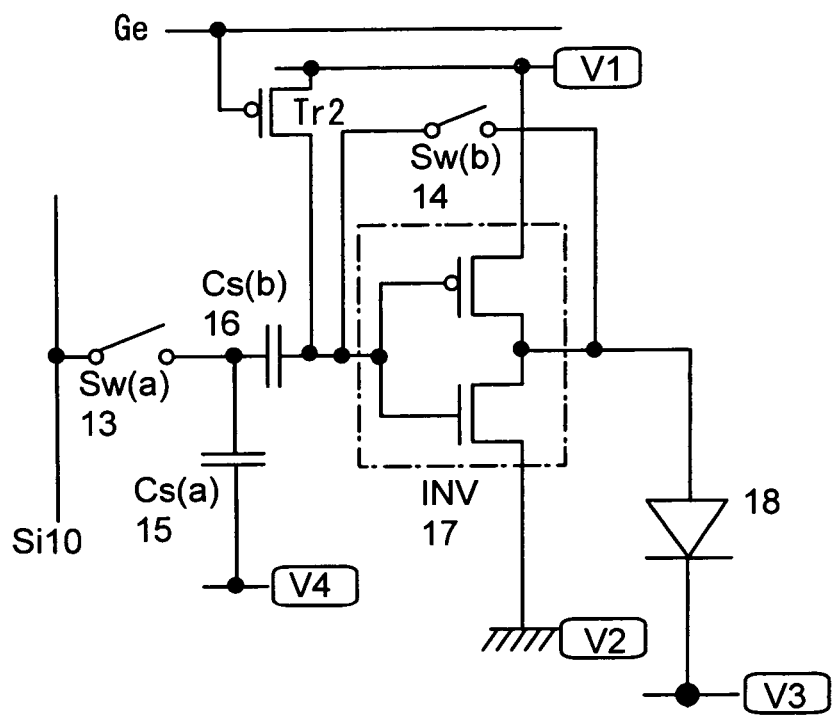
FIG. 20 is a diagram illustrating a pixel to which a reverse voltage is applied of the invention.
Figure 21:
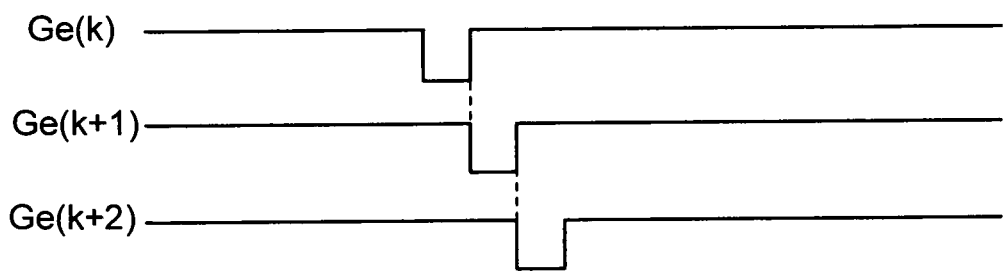
FIG. 21 is a diagram illustrating an operation where a reverse voltage is applied of the invention.

Next, the case where an erase period Te in which a reverse voltage is applied is provided is described. A pixel configuration for this case is different from those shown in FIGS. 1A to 1C. For example, as shown in FIG. 20, the pixel configuration shown in FIG. 1 which is additionally provided with a transistor Tr2 is employed. The transistor Tr2 is provided so as to discharge electric charges of the second capacitor 16, and the light emitting element 18 does not emit light when the transistor Tr2 is turned on. Note that the transistor Tr2 is formed by a P-channel thin film transistor in this embodiment mode, therefore, the transistor Tr2 is turned on when Low is inputted to an erasing scan line Ge as shown in FIG. 21. The transistor Tr2 is controlled by the erasing scan line Ge. The period in which the light emitting element 18 does not emit light is called an erase period. It is to be noted that the potential of the counter electrode of the light emitting element 18 is fixed at V3 and set so as to be higher than V2 of the inverter 17 during one frame period. Consequently, in the erase period, a reverse voltage can be applied to the light emitting element 18. That is, the erasing scan line is sequentially selected and when the transistor Tr2 is turned on, a reverse voltage can be applied to the pixel. Furthermore, in the pixel shown in FIG. 20, a reverse voltage can be applied even when a video signal makes the light emitting element 18 emit no light, in addition to when the transistor Tr2 is turned on.

A timing chart in such a pixel configuration is the same as those shown in FIGS. 22B and 22C, and thus description thereof is omitted.

In this manner, by making the light emitting element 18 emit no light, the effect of preventing the afterimage can be also obtained.

In addition, an erase signal inputting period T3 as well as a reference signal inputting period T1 and a video signal inputting period T2 is provided in one gate selection period as shown in FIG. 22A, and a reverse voltage can be applied in the erase signal inputting period T3.

In the erase signal inputting period T3, a video signal for erasing is inputted from the signal line 10 so that no light emission is obtained. In addition, the potential of the counter electrode of the light emitting element 18 is fixed at V3 and is higher than V2 of the inverter 17. Consequently, a reverse voltage can be applied to the light emitting element 18. In this case, a reverse voltage can be applied sequentially to the pixel.

Such a timing chart as shown in FIG. 22B that the erase period Te starts after the termination of a writing period Ta in one frame period is obtained for this case. When a pixel at the k-th row is focused attention on, a gray scale display period and an erase period that is an alternating drive period appear in one frame period as shown in FIG. 22C.

A reverse voltage may be applied in the case of a pixel configuration other than the above described one as well. An example thereof is described using FIG. 24.

Figure 24:
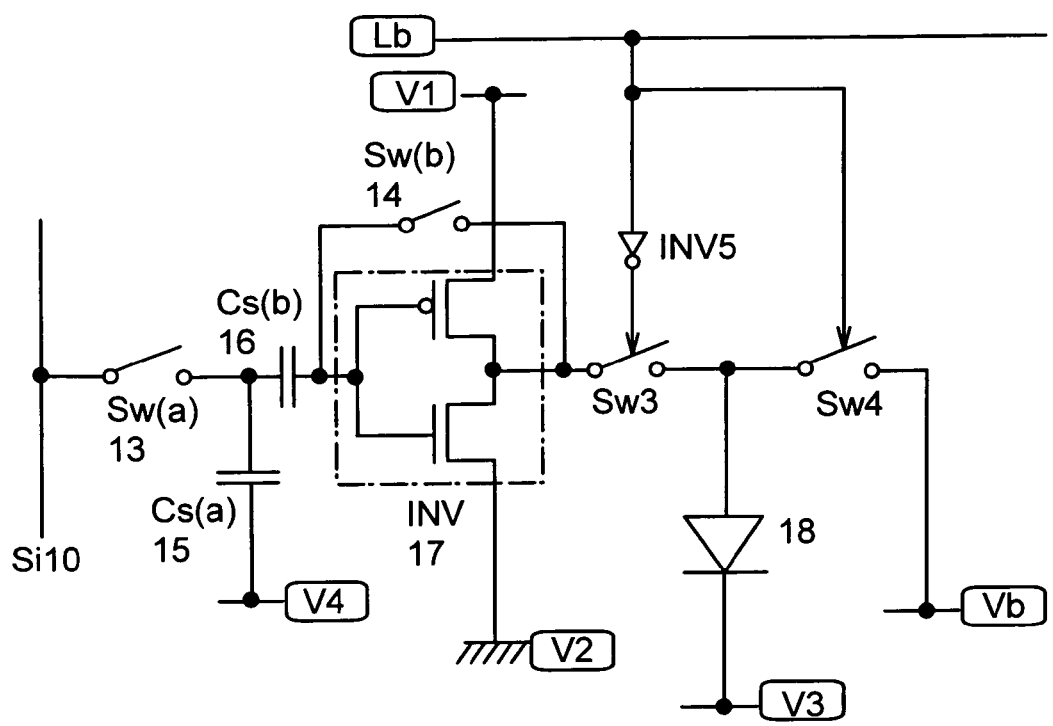
FIG. 24 is a diagram illustrating a pixel to which a reverse voltage is applied of the invention.

FIG. 24 shows a pixel configuration additionally provided with a third switch Sw3 and a forth switch Sw4 to the pixel configuration shown in FIG. 18. The voltage of one terminal, which is not connected to the light emitting element, of the forth switch Sw4 (simply called one terminal of the forth switch) is denoted by Vb. The third switch Sw3 and the forth switch Sw4 are controlled by the scan line Gb. Since the third switch Sw3 and the forth switch Sw4 are connected to each other via an inverter INV5 to each other, their operations are inverted to each other.

In such a pixel configuration, the potential V3 of the counter electrode of the light emitting element 18 is set to be higher than the potential Vb at one terminal of the forth switch Sw4. According to such a configuration, when the forth switch Sw4 is selected, a reverse voltage is applied to the light emitting element 18. It is to be noted that the potential Lb at one terminal of the forth switch may be varied for each row, or may be varied for all rows at a time. In addition, the potential V3 of the counter electrode of the light emitting element 18 may be set so as to be higher than the potential Vb at one terminal of the forth switch Sw4 only when the forth switch Sw4 is selected. Similarly, the potential Vb at one terminal of the forth switch Sw4 may be set so as to be lower than the potential V3 of the counter electrode only when the forth switch Sw4 is selected. Alternatively, the potential Vb at one terminal of the forth switch Sw4 and the potential V3 of the counter electrode of the light emitting element 18 may be fixed in order to satisfy the above voltage.

It is preferable to apply a reverse voltage to the pixel configuration described in this embodiment mode in that an adverse effect due to an initial defect and the like can be reduced as described above.

The case where a reverse voltage is applied to the light emitting element 18 is described in this embodiment mode, and a reverse voltage can be applied to the light emitting element for monitoring 66 similarly. Consequently, the initial deterioration and the like of the light emitting element 66 can be decreased. It is preferable that a reverse voltage is applied to the light emitting element 66 when a reverse voltage is applied to the light emitting element 18 at the same time. As the light emitting element 66 and the light emitting element 18 become comparable in their conditions, a voltage can be compensated based on the light emitting element 66 with high accuracy.

This embodiment mode can be freely combined with any of the other embodiment modes.

Embodiment Mode 8

In this embodiment mode, a temperature compensation function is described.

Figure 15:
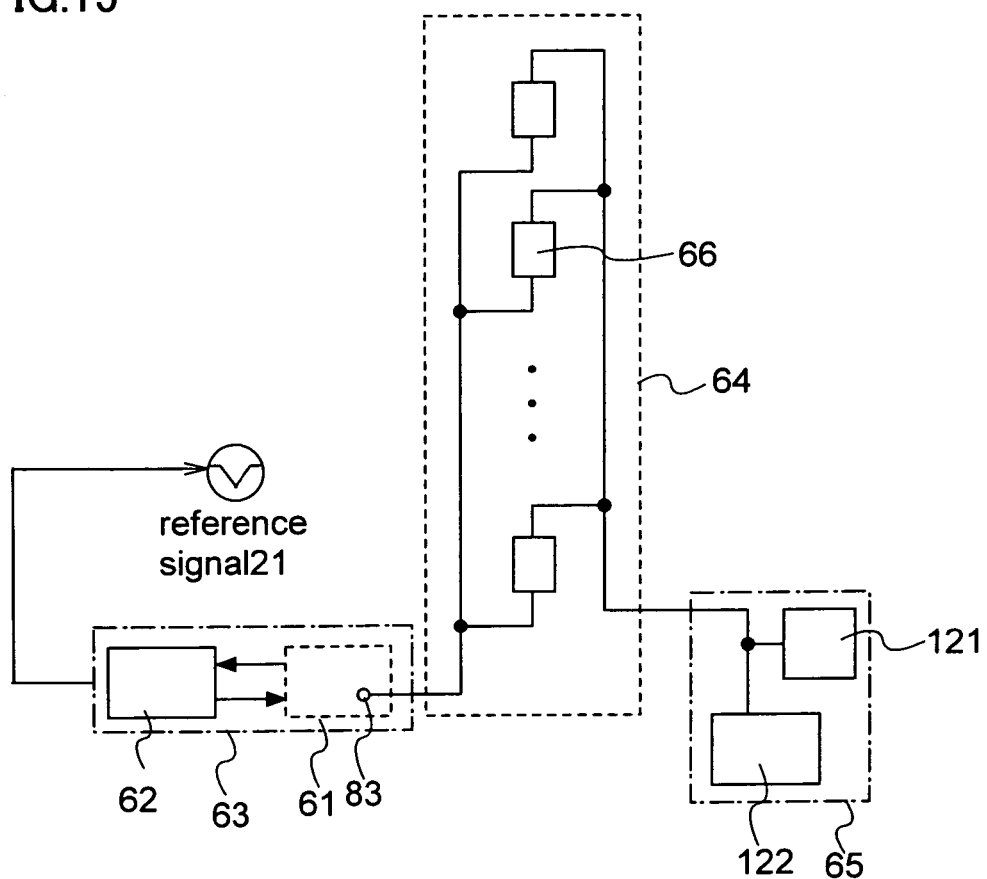
FIG. 15 is a diagram illustrating a temperature compensation function of the invention.

In this embodiment mode, the element having a temperature compensation function includes a monitor circuit 64 which operates based on the temperature of the environment as shown in FIG. 15. The monitor circuit 64 includes the light emitting element for monitoring 66. One electrode of the light emitting element 66 is connected to a power source whose potential is fixed (connected to ground in the shown configuration), and the other electrode thereof is connected to the control circuit 65. The control circuit 65 includes a constant power source 121 and an amplifier 122. The power source control circuit 63 includes the power source circuit 61 and the controller 62 as described above. It is to be noted that the power source circuit 61 is preferably a variable power source that is capable of varying the power source potential to supply. By the monitor circuit 64, the control circuit 65 and the power source control circuit 63, temperature compensation is carried out.

Next, a mechanism for detecting the environmental temperature with the light emitting element 66 is described. A constant current is supplied between both electrodes of the light emitting element 66 from the constant power source 121. That is, a constant current is always supplied to the light emitting element 66. The resistance value of the light emitting element 66 itself changes when the environmental temperature changes. Then, since the current value of the light emitting element 66 is always constant, a potential difference between the both electrodes of the light emitting element 66 changes. The change in potential difference of the light emitting element 66 due to the change in temperature is detected, thereby a variation in the environmental temperature is detected. At this time, the potential of the electrode on the side of the constant potential of the light emitting element 66 does not change, therefore, a change in the potential of the electrode connected to the constant current source 121 is detected. A signal containing such data on the potential change of the light emitting element is supplied to the amplifier 122 to be amplified, and then outputted to the power source control circuit 63. The power source control circuit 63 varies the reference signal 21 via the amplifier 122 based on the output of the monitor circuit 64. Specifically, the potential of the reference signal 21 is controlled. Accordingly, the luminance of the light emitting element 18 can be corrected in accordance with the change in temperature.

It is to be noted that a plurality of the light emitting element 66 is included in FIG. 15, however, the invention is not limited to this. That is, the number of the light emitting element 66 provided in the monitor circuit 64 is not limited. For example, the light emitting element for monitoring for each of RGB may be provided because the temperature characteristic is different depending on each of RGB. In that case, the potential of the pixel electrode is preferably controlled as described above.

Alternatively, the light emitting element 66 to which a transistor is connected in series may be employed as an element for monitoring. In that case, for example, the transistor is set so as to be always on. In addition, the transistor can be used as a limiter. The transistor can be formed similarly to the transistor in a pixel. It is to be noted that the transistor is preferably formed so as to have long channel width or channel length in the case of using as a limiter.

The case where a reference signal is corrected is described hereinabove, however, the potential of the pixel electrode or that of the counter electrode of the light emitting element 18 may be controlled.

Figure 25A:
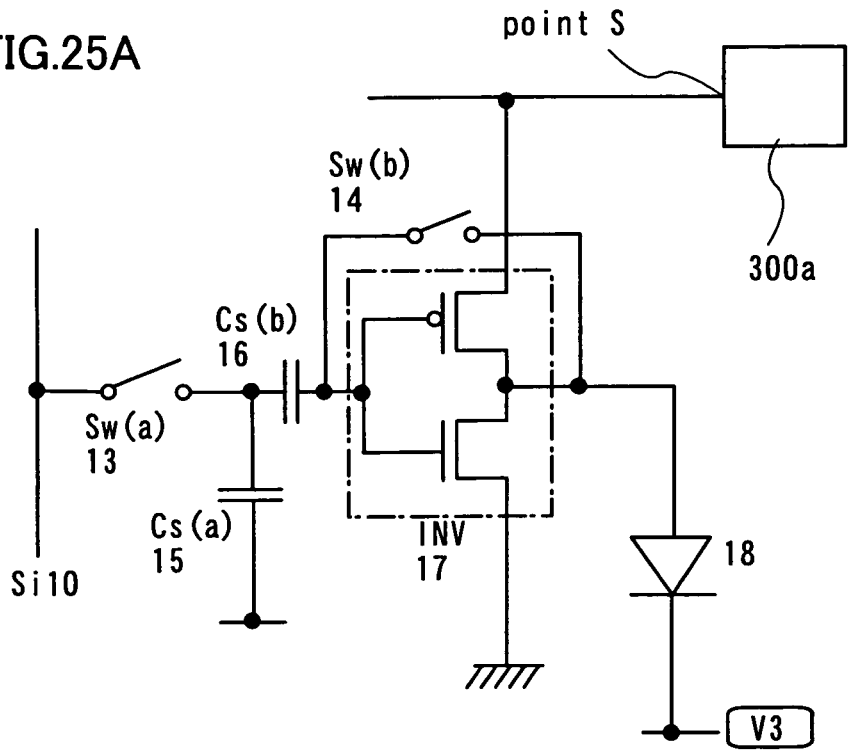
FIGS. 25A and 25B are diagrams each illustrating a pixel having a temperature compensation function of the invention.
Figure 25B:
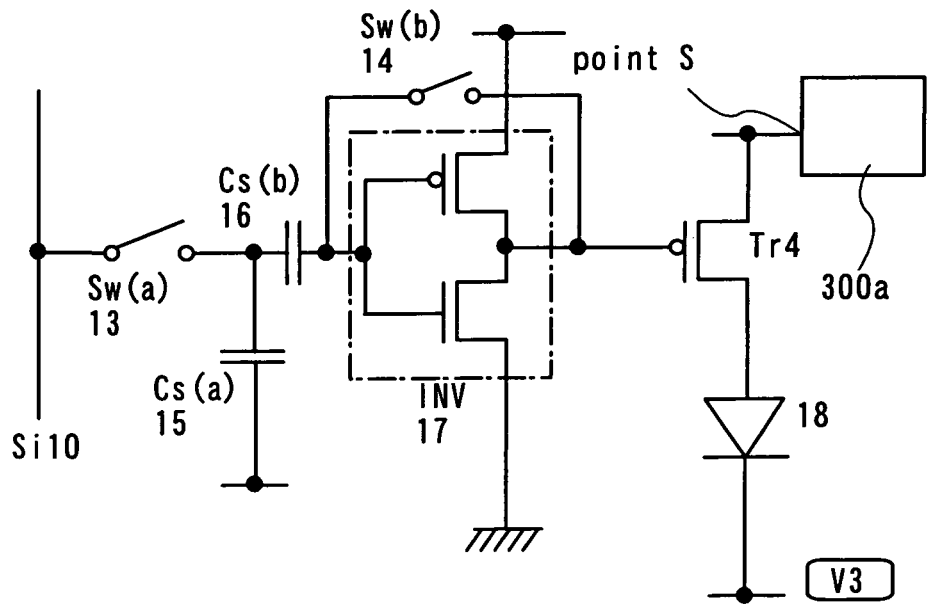

The case where the potential of the pixel electrode is controlled is described using FIGS. 25A and 25B. In a pixel configuration shown in FIG. 25A, the pixel electrode is provided with a compensation circuit 300a via the inverter 17. The potential of the pixel electrode of the light emitting element 18 can be controlled by the compensation circuit 300a.

In a pixel configuration shown in FIG. 25B, the pixel electrode is provided with the compensation circuit 300a via a transistor Tr4. The potential of the pixel electrode of the light emitting element 18 can be controlled by the compensation circuit 300a.

It is preferable to control the potential of the pixel electrode as described above in that a difference of the temperature change among RGB can be taken into consideration since the pixel electrode is provided for each pixel.

Figure 26:
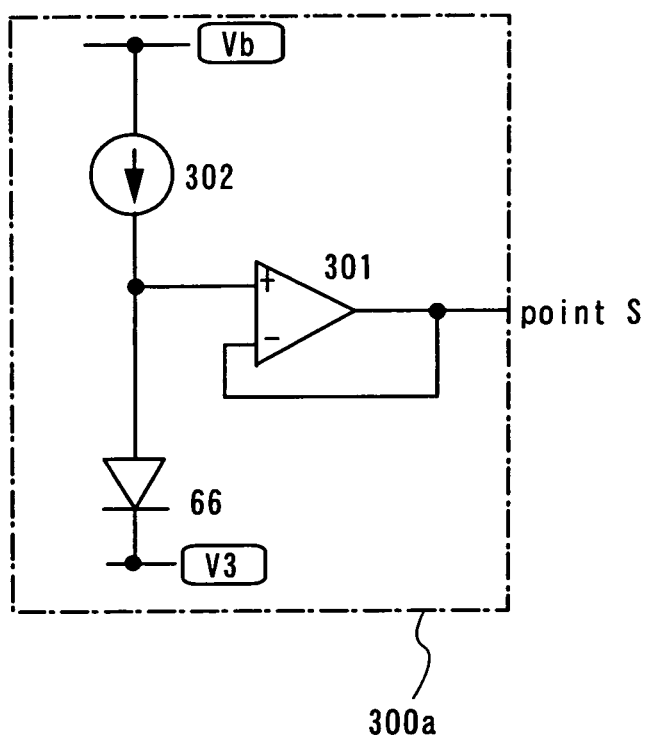
FIG. 26 is a diagram illustrating a compensation circuit of the invention.

FIG. 26 shows a specific configuration of the compensation circuit 300a. The compensation circuit 300a includes the light emitting element 66, and an amplifier 301 and a constant current source 302 which are connected to a pixel electrode of the light emitting element 66. A negative side of the amplifier 301 is connected to an output side thereof. A positive side of the amplifier 301 is connected to the constant current source 302.

By the compensation circuit, a variation in a potential difference of the light emitting element 66 due to the temperature change can be detected. More specifically, the potential of the electrode on the side of the constant potential of the light emitting element 66 does not change, therefore, a change in the potential of the electrode connected to the constant current source 302 is detected. A signal containing such data on the change in the pixel electrode of the light emitting element 66 is supplied to the amplifier 301 to be amplified. The amplified signal is inputted to a pixel electrode of the light emitting element 18 to control so as to have a potential depending on the temperature change.

Figure 27:
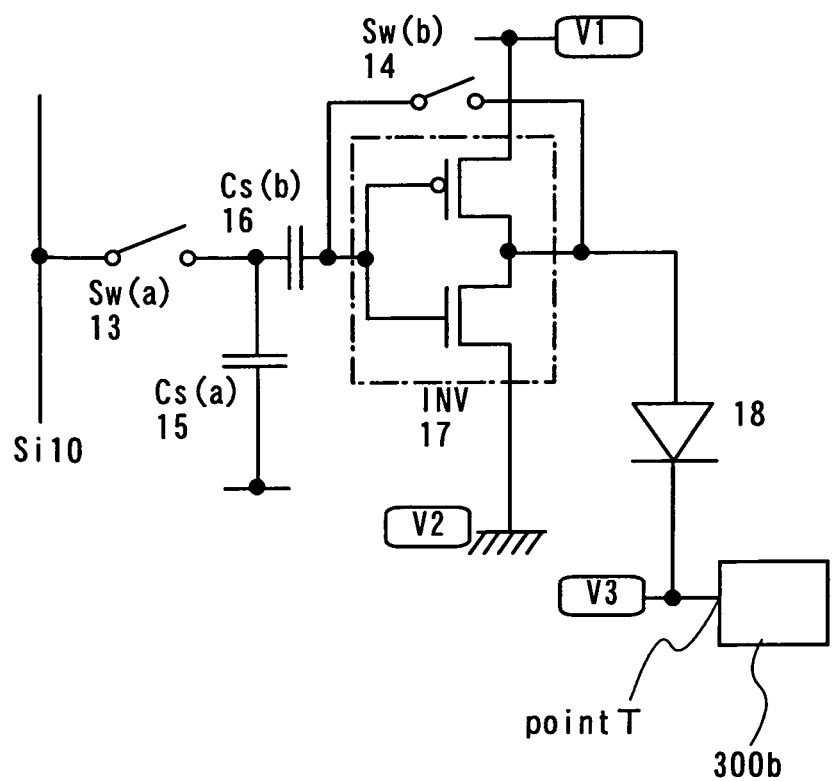
FIG. 27 is a diagram illustrating a pixel having a temperature compensation function of the invention.

The case where the potential of the counter electrode is controlled is described using FIG. 27. In a pixel configuration shown in FIG. 27, the counter electrode is provided with a compensation circuit 300b. The potential of the counter electrode of the light emitting element 18 can be controlled by the compensation circuit 300b.

Figure 28:
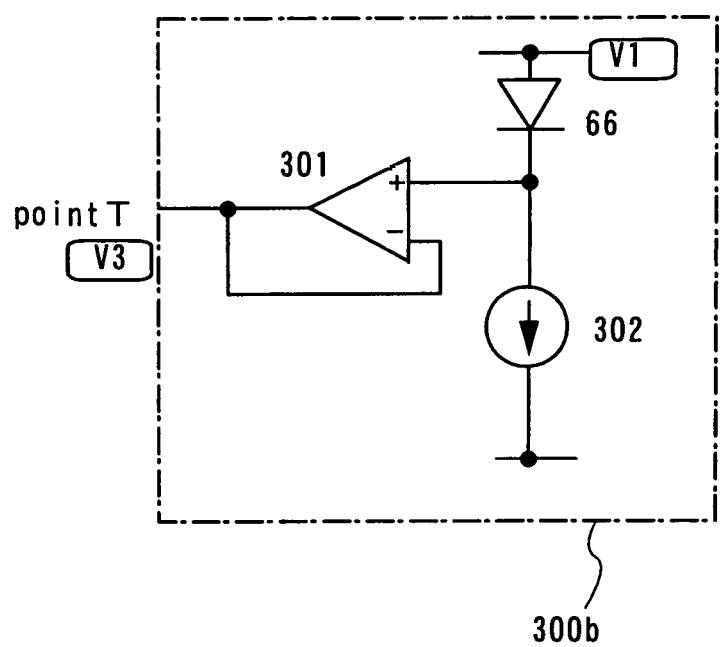
FIG. 28 is a diagram illustrating a compensation circuit of the invention.

FIG. 28 shows a specific configuration of the compensation circuit 300b. The compensation circuit 300b includes the light emitting element 66, the constant current source 302 connected to a pixel electrode of the light emitting element 66, and the amplifier 301 connected to one terminal, which is not connected to the pixel electrode, of the constant current source 302. A negative side of the amplifier 301 is connected to an output side thereof. A positive side of the amplifier 301 is connected to the constant current source 302.

By the compensation circuit, a variation in a potential difference of the light emitting element 66 due to the temperature change can be detected. More specifically, the potential of the electrode on the side of the constant potential of the light emitting element 66 does not change, therefore, a change in the potential of the electrode connected to the constant current source 302 is detected. A signal containing such data on the change in the counter electrode of the light emitting element 66 is supplied to the amplifier 301 to be amplified. The amplified signal is inputted to a counter electrode of the light emitting element 18 to control so as to have a potential depending on the temperature change.

As described above, the potential of the pixel electrode or the counter electrode of the light emitting element 18 can be controlled depending on the temperature change. Consequently, light emission with the predetermined luminance can be obtained regardless of the temperature change.

Specific examples of the compensation circuit 300a are shown in FIGS. 29 to 32. A pixel portion shown in FIG. 29 includes at least the inverter 17 and the light emitting element 18 as shown in FIG. 1 and the like. In addition, the light emitting element for monitoring 66 is connected to a counter electrode of the light emitting element 18 via a power source line 226.

If the current-voltage characteristics of the light emitting element 18 vary depending on the temperature, the luminance is increased at a high temperature and decreased at a low temperature even in the case where the constant voltage is applied. In order to correct this, a constant current is supplied to the light emitting element 66 from the constant current source 302, and a voltage generated at this time is applied to a power source line 228 via the amplifier 301 and a transistor 213. The power source line 228 is connected to a pixel electrode of the light emitting element 18 via the inverter 17. When such a compensation circuit is employed, the temperature characteristics are canceled so that the luminance can be kept constant depending on the temperature if the light emitting element 66 and the light emitting element 18 are formed by the same material.

A switching regulator is included in addition to the amplifier 301, which includes a first comparator 201, a second comparator 202, an oscillating circuit 204, a smoothing capacitor 205, a diode 206, a switching transistor 208, an inductor 209, reference power sources 203, 207, and 224, and an attenuator 210. As the reference power source 207, a power source having large current capacitance such as a battery is employed.

The constitution of the switching regulator is not limited to the above, and another constitution may be employed. In addition, the switching transistor is an NPN bipolar transistor in FIG. 29, however, the invention is not limited to this.

An output signal of the oscillating circuit 204, the reference voltage 203, and an output signal of the first comparator 201 are compared with one another by the second comparator 202, and an output signal thereof controls the switching transistor 208. A current flows to the inductor 209 when the switching transistor 208 is turned on, and magnetic energy is held in the inductor 209. When the switching transistor 208 is turned off, the magnetic energy is turned into voltage and charges the smoothing capacitor 205 via the diode 206. A direct voltage generated in the smoothing capacitor 205 varies depending on the on/off duty ratio of the switching transistor 208.

The direct voltage in the smoothing capacitor 205 is attenuated by the attenuator 210, and inputted to the first comparator 201. The first comparator 201 compares the reference voltage 224 and the voltage of the attenuator 210 with each other, and inputs its output to the second comparator 202. Feedback is carried out in this manner so that a required voltage can be generated in the smoothing capacitor 205. The constant current source 302, the amplifier 301, and the light emitting element 66 are directly connected in the configuration shown in FIG. 29, however, an element such as a resistor and a switch may be provided therebetween.

Figure 29:
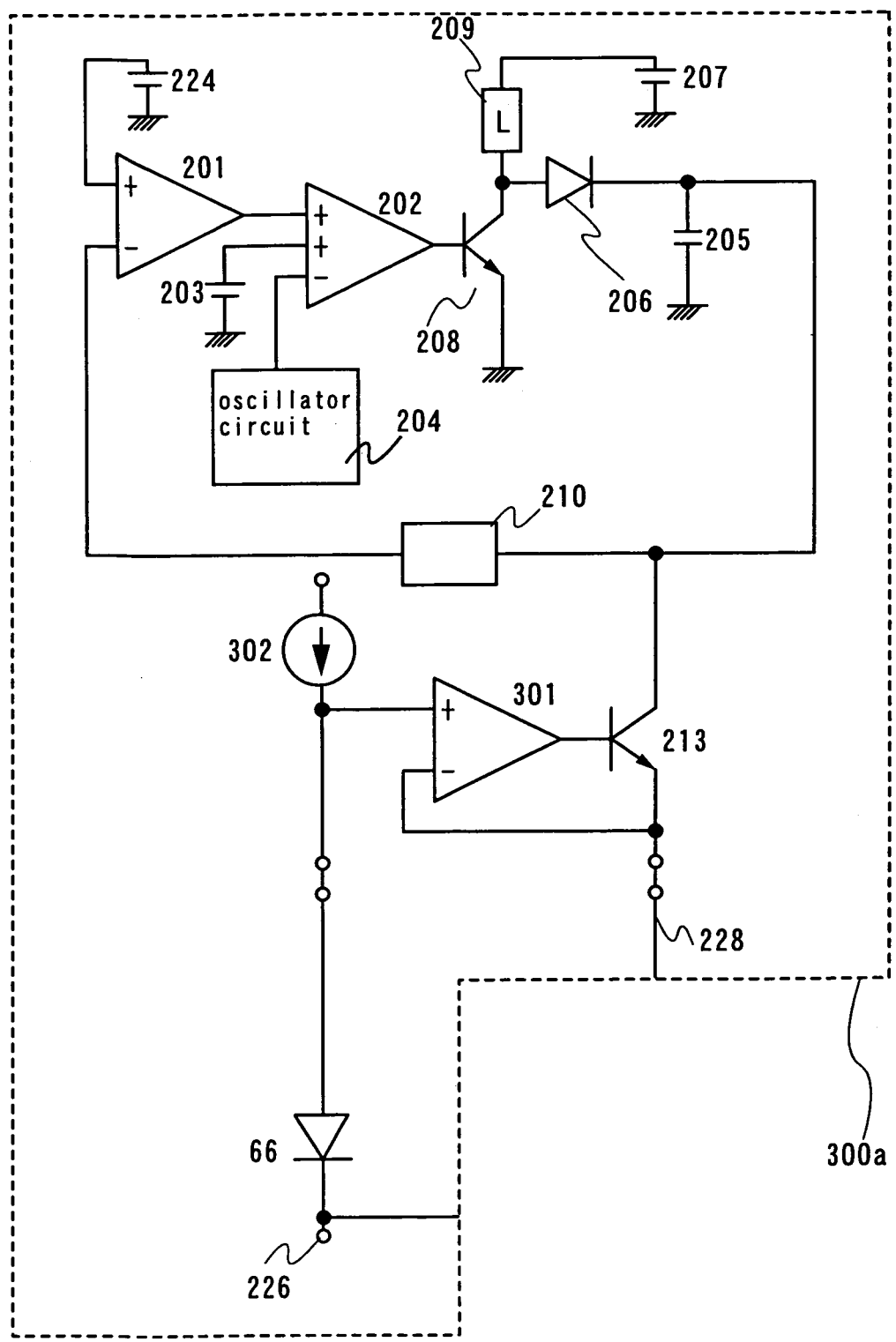
FIG. 29 is a diagram illustrating a compensation circuit of the invention.
Figure 30:
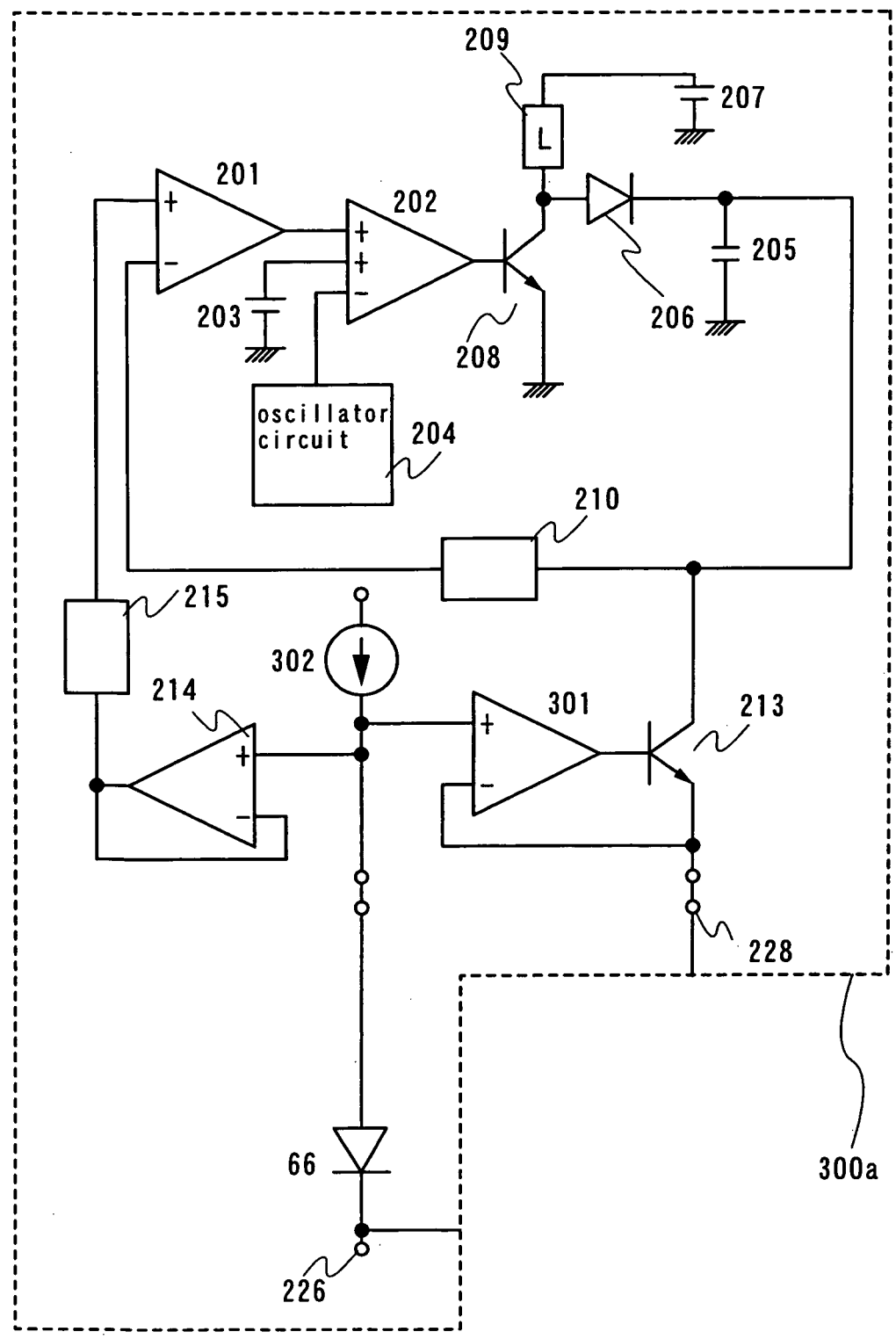
FIG. 30 is a diagram illustrating a compensation circuit of the invention.

A configuration which is different from that shown in FIG. 29 of the compensation circuit is described using FIG. 30. In the configuration shown in FIG. 29, the voltage of the smoothing capacitor 205 has a constant value regardless of the temperature, however, the light emitting element has the temperature characteristics. Generally, the voltage of the light emitting element is high at a low temperature and is low at a high temperature. At a high temperature, a difference between the voltage of the light emitting element and that of the smoothing capacitor becomes large, for which unnecessary power is consumed. In that case, the unnecessary power can be reduced if the voltage of the switching regulator is decreased in conjunction with the voltage of the light emitting element at a high temperature.

FIG. 30 is a configuration of the compensation circuit in view of the foregoing problem, the voltage of the light emitting element 66 is also inputted to the switching regulator so that the voltage of the switching regulator and that of the light emitting element 18 gear to each other.

Specifically, the compensation circuit includes an amplifier 214 and an attenuator 215 in addition to the compensation circuit shown in FIG. 29. A driving voltage of the light emitting element 18 is inputted to the first comparator 201 via the amplifier 214 and the attenuator 215. A direct voltage in the smoothing capacitor 205 is attenuated by the attenuator 210, and inputted to the first comparator 201. The first comparator 201 compares the voltage of the attenuator 215 and that of the attenuator 210 with each other, and inputs its output to the second comparator 202. Feedback is carried out in this manner so that a required voltage can be generated in the smoothing capacitor 205. The constant current source 302, the amplifiers 301 and 214, and the light emitting element 66 are directly connected in the configuration shown in FIG. 30, however, an element such as a resistor and a switch may be provided therebetween.

Figure 31:
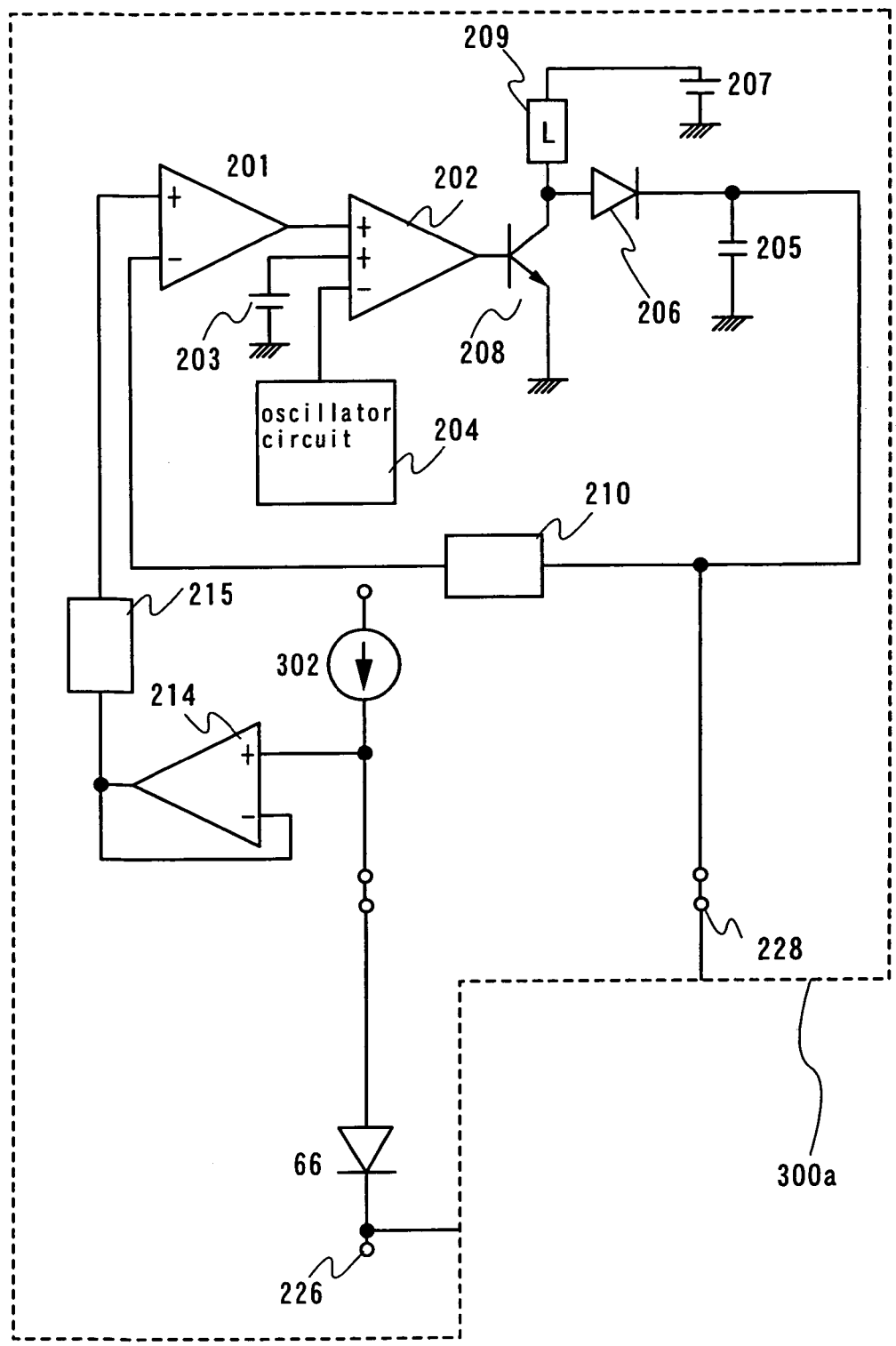
FIG. 31 is a diagram illustrating a compensation circuit of the invention.

In addition, a configuration which is different from the above compensation circuit is described using FIG. 31. In the configuration shown in FIG. 31, output of the switching regulator is directly connected to a second power source terminal of the display panel. The driving voltage of the light emitting element 66 is also inputted to the switching regulator so that the voltage of the switching regulator and that of the light emitting element 18 gear to each other.

Specifically, in the compensation circuit, the amplifier 301 and the transistor 213 are omitted from the compensation circuit shown in FIG. 30, and the output of the switching regulator is directly connected to the power source line 228. As compared with the compensation circuit shown in FIG. 30, there is an advantage in that an amplifier and a transistor can be omitted, though the stability drops. The constant current source 302, the amplifier 214, and the monitoring element 66 are directly connected in the configuration shown in FIG. 31, however, an element such as a resistor and a switch may be provided therebetween.

Figure 32:
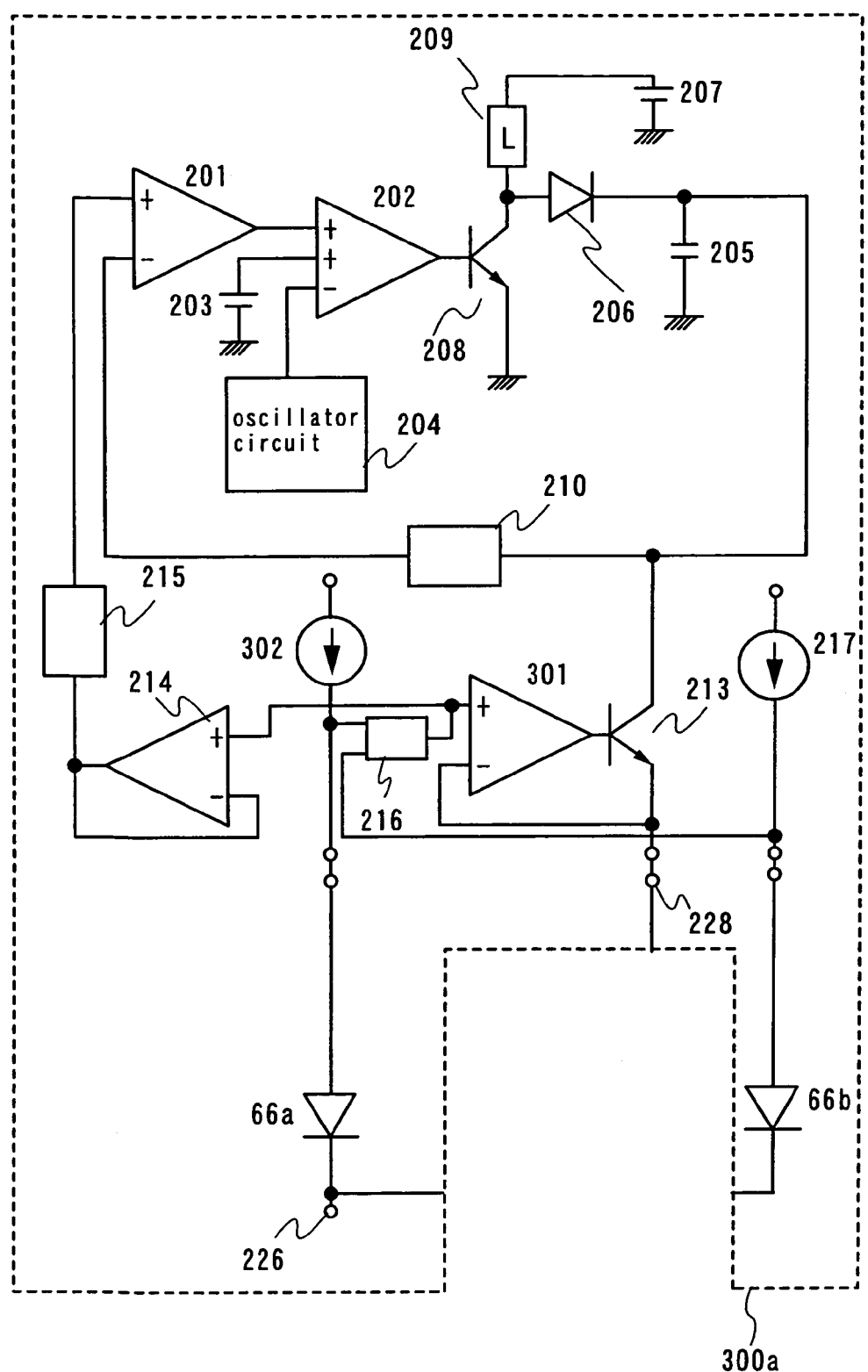
FIG. 32 is a diagram illustrating a compensation circuit of the invention.

Next, a configuration in which a plurality of the light emitting element 66 is provided, unlike the above compensation circuit, is described using FIG. 32. In the configuration shown in FIG. 32, voltages of a light emitting element 66a and a light emitting element 66b are also inputted to the switching regulator so that the voltage of the switching regulator and that of the light emitting element 18 gear to each other. In addition, if the two monitoring elements (66a and 66b) are provided on both sides of the pixel portion, averaging thereof is performed by an adding circuit 216, and then connected to the amplifiers 214 and 301, more precise monitoring can be performed. Further, the number of the light emitting element 66 may be further increased in this invention. By increasing the number of the light emitting element 66, difference in characteristics between the light emitting element 66 and the light emitting element 18 can be reduced.

Voltages of the monitoring elements 66a and 66b are inputted to the first comparator 201 via the adding circuit 216, the amplifier 214, and the attenuator 215. A direct voltage in the smoothing capacitor 205 is attenuated by the attenuator 210, and inputted to the first comparator 201. The first comparator 201 compares the voltage of the attenuator 215 and that of the attenuator 210 with each other, and inputs its output to the second comparator 202. Feedback is carried out in this manner so that a required voltage can be generated in the smoothing capacitor 205. The constant current sources 302 and 217, the amplifier 301, and the light emitting elements 66a and 66b are directly connected here, however, an element such as a resistor and a switch may be provided therebetween.

The first power source line 226 and the second power source line 228 of the display panel has fixed voltages respectively in the configurations shown in FIGS. 29 to 32, however, the alternating drive of the light emitting element 18 and the light emitting element 66 may be performed by interchanging the voltages each to be applied to the first power source line 226 and the second power source line 228 regularly by means of a switch for interchanging interposed therebetween. It is to be noted that the temperature compensation is described using FIGS. 29 to 32 hereinabove, and compensation for deterioration of the light emitting element 18 may be performed as well by taking advantage that the light emitting element 66 and the light emitting element 18 deteriorate similarly to each other.

The light emitting element 66 is employed as the monitor circuit 64 in this embodiment mode, however, the invention is not limited to this and a known temperature sensor may be employed. In the case where a known temperature sensor is employed, it may be formed on the same substrate as the pixel region 40, or may be externally attached by using an IC.

It is to be noted that since the temperature compensation function requires no user's operation, the correction can continue after the display device is sent to a user. Accordingly, a longer operating life as a product can be achieved.

This embodiment mode can be freely combined with any of the other embodiment modes.

Embodiment Mode 9

In this embodiment mode, deterioration data obtained from the light emitting element for monitoring 66 is described.

In a driving method in which the light emitting element emits light by applying a voltage (voltage drive), the luminance deterioration may progress faster than in a driving method in which the light emitting element emits light by applying a current (current drive). The reason is considered that the resistance between a cathode and an anode is increased in addition to the deterioration of the light emitting material in the case of the voltage drive. Therefore, in the case of the voltage drive, such deterioration is preferably taken into consideration in addition to the deterioration data obtained from the light emitting element for monitoring.

Figure 42:
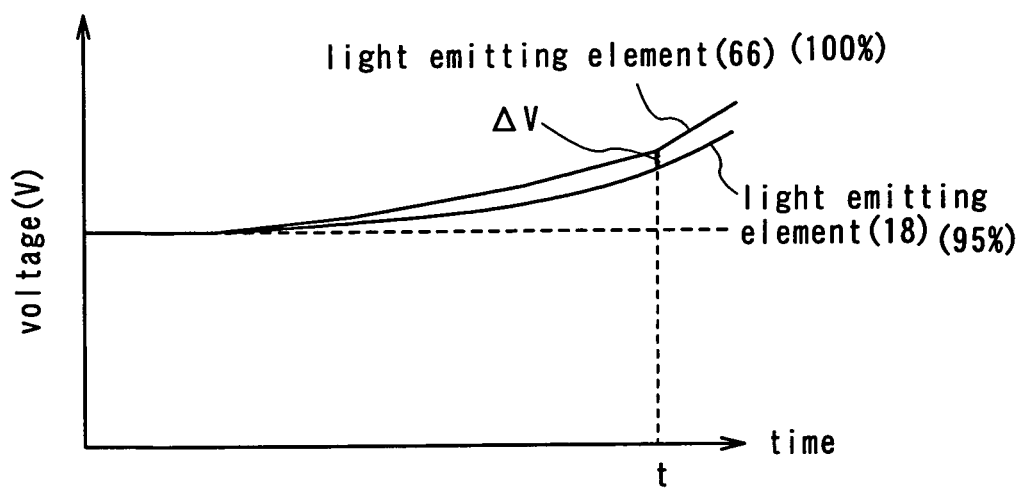
FIG. 42 is a diagram describing a temperature compensation function of the invention.

In addition, the light emitting element for monitoring 66 is connected to a constant current source and always emits light. That is, the light emission duty ratio of the light emitting element for monitoring 66 is 100%. On the other hand, that of the light emitting element 18 provided in the pixel is lower than 100%. The reason is that the light emitting element 18 does not emit light when black display is performed, and that a voltage to be applied varies depending on the gray scale display. Accordingly, as shown in FIG. 42, a difference ($\Delta V$) between a voltage obtained from the light emitting element for monitoring 66 and a voltage to be applied to the light emitting element 18 is generated at time t. Consequently, the predetermined luminance may not be obtained in the light emitting element 18. Therefore, in the case of the voltage drive, such data is preferably taken into consideration in addition to the deterioration data obtained from the light emitting element for monitoring.

Description is made below using a theory formula.

When the current drive is performed with an initial luminance $L_0$ and a current density of $J_0$, a current efficiency $\eta(t)$ that decreases with time is represented by the following formula as a function of time t.

$$\eta(t) = L_0/J_0 \times f(t) \qquad (1)$$

It is known that f (t) can be represented by the following exponential function.

$$f(t) = \exp\{-(t/\alpha)\beta\} \qquad (2)$$

Note that $\alpha$ is a parameter indicating medium and long-term deterioration and $\beta$ is a parameter indicating initial deterioration, which can be obtained experimentally.

Meanwhile, if the current density J changes with time t (i.e., J=J(t)), the luminance L can be represented by the following formula.

$$L = \eta(t) \times J(t) \qquad (3)$$

Accordingly, in the case of performing the voltage drive, the following formula (4) should be satisfied when $L=L_0$ (constant) is satisfied in the formula (3).

$$L_0 = \eta(t) \times J(t) \qquad (4)$$

By substituting the formula (4) in the formula (1), the following formula can be obtained.

$$J(t) = J_0/f(t) \qquad (5)$$

The formula (5) shows the phenomenon that in order to maintain the luminance constant, the current density should gradually increase from $J_0$ taking a decrease in the current efficiency into consideration. The reason is that the formula (2) shows that f (t) is a monotonically decreasing function.

In general, current density is proportional to an exponentiated value of the voltage (x-th power), and the following formula is thus obtained, where x is a power determined by an element and C is a constant.

$$J(t) = C \times V^x(t) \qquad (6)$$

Accordingly, the following formula is obtained by substituting the formula (6) in the formula (5) and taking the formula (2) into consideration.

$$V(t) = Const. \times [\exp(t/\alpha)\beta]^{1/x} \qquad (7)$$

The formula (7) shows how the voltage should vary to perform the voltage drive. Const. is a constant determined by an initial current density $J_0$ and x (Const.=$(J_0/C)^{1/x}$)

The driving voltage of the light emitting element 18 is preferably corrected by taking the above voltage increase into consideration in addition to the data of the light emitting element for monitoring 66.

On the basis of the above, deterioration data of the material of the light emitting element is preferably accumulated and held in a memory and the like. Furthermore, deterioration data of the light emitting element depending on the light emission duty ratio is preferably accumulated and held in a memory and the like. The voltage applied to the light emitting element 18 is corrected based on such held deterioration data and the deterioration data from the light emitting element for monitoring 66. Consequently, the luminance of the light emitting element 18 can be corrected depending on the temperature change.

Further, deterioration data of the material of the light emitting element for each of RGB is preferably accumulated. In addition, deterioration data of the light emitting element for each of RGB depending on the light emission duty ratio is preferably accumulated. In that case, the light emitting element for monitoring 66 is provided for each of RGB.

As described in this embodiment mode, the deterioration data obtained from the light emitting element for monitoring 66 is preferably corrected by taking the material deterioration of the light emitting element and the light emission duty ratio into consideration. Accordingly, the voltage to be applied to the light emitting element 18 can be corrected with high accuracy.

Embodiment Mode 10

A protection circuit is described in this embodiment mode.

Figure 16:
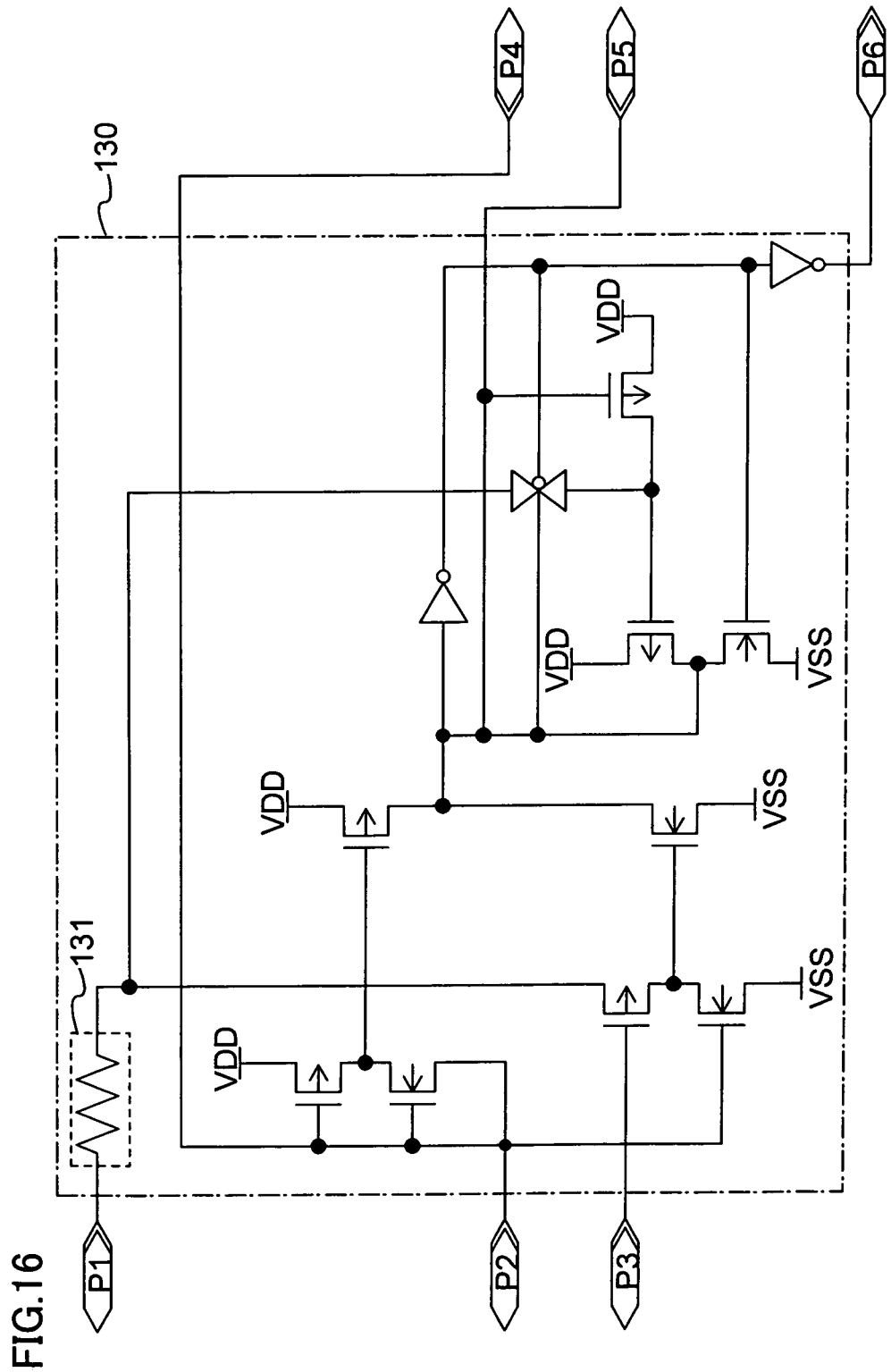
FIG. 16 is a diagram illustrating a protection circuit of the invention.

The shift register 70 in the source driver includes a unit circuit 130. The unit circuit 130 includes a plurality of transistors and a logic circuit shown in FIG. 16. In the unit circuit 130, a resistor 131 as a protection circuit is provided to a power source line inputted with a start clock pulse (SCK) or an inverted start clock pulse (SCKB). It is to be noted that the protection circuit may be provided anywhere in the unit circuit 130. The resistor as the protection circuit may be provided to a power source line supplied with the video signal 20. Alternatively, the protection circuit may be provided between the selection circuit 46 and the signal line Si. By providing the protection circuit as described above, deterioration or destruction of an element due to the static electricity can be suppressed. More specifically, noise may be included in a clock signal or a data signal inputted to an input node, which may instantaneously supply a high or low voltage to an element. However, according to the invention comprising the protection circuit, malfunction of an element and deterioration or destruction of the element can be suppressed.

The protection circuit can be formed by at least one of a resistor, a capacitor, and a rectifying element.

Figure 17:
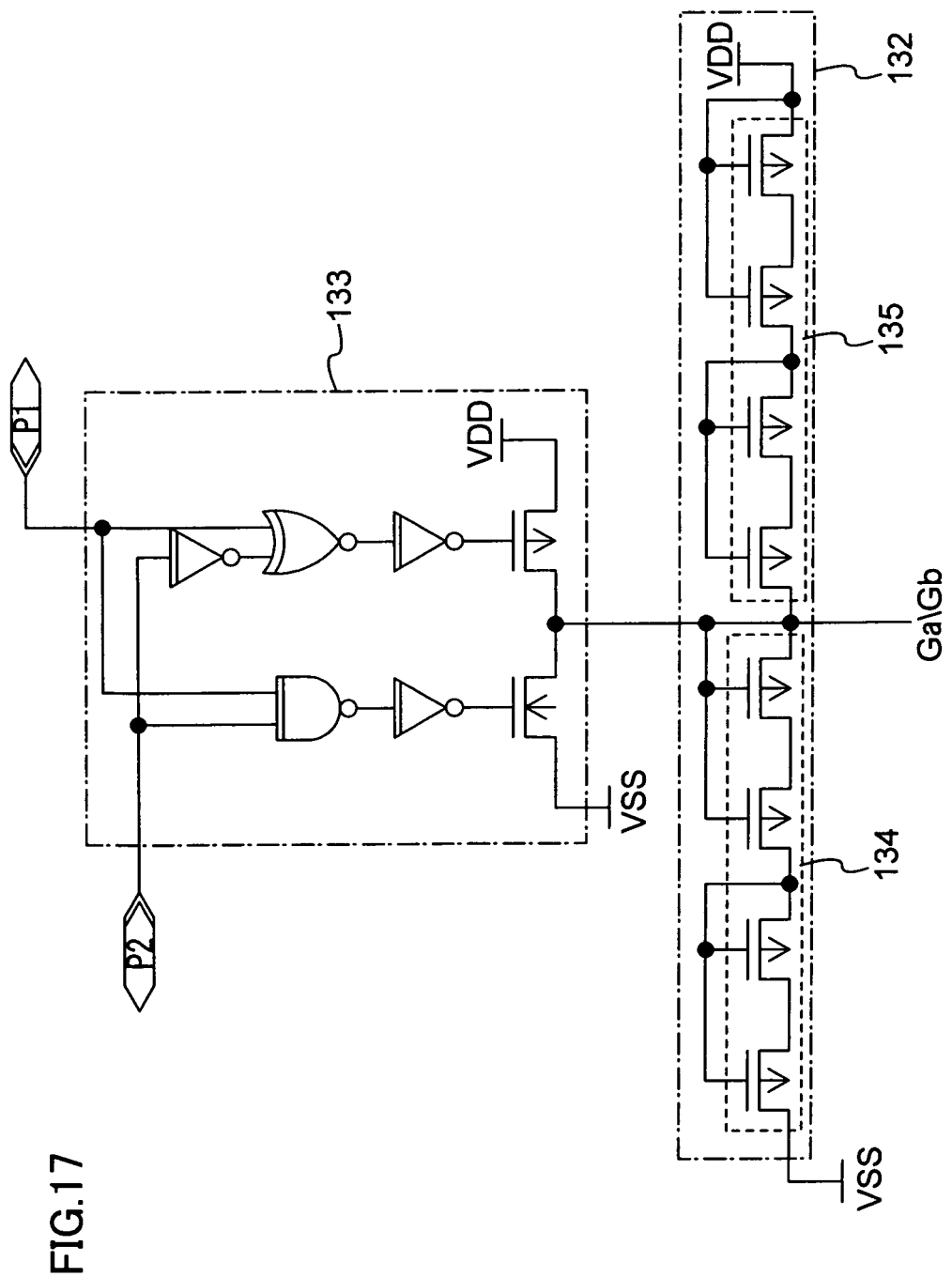
FIG. 17 is a diagram illustrating a protection circuit of the invention.

Described next is a protection circuit provided in the pulse output circuit included in each of the gate drivers 41, 42 and 91. As shown in FIG. 17, the pulse output circuit has a configuration in which a plurality of unit circuits (GSRs) are cascade-connected to each other, and the unit circuit (GSR) includes a tri-state buffer 133 and a protection circuit 132. The tri-state buffer 133 is provided for preventing interruption in signal input of one of the first gate driver 41 and the second gate driver 42 to the scan line Ga or Gb due to output from the other driver thereof. Therefore, an analog switch, a clocked inverter or the like may be employed as well as the tri-state buffer so long as it has the abovedescribed function. The protection circuit 132 includes element groups 134 and 135. It is to be noted that the element group of the protection circuit is configured by at least one of a resistor, a capacitor, and a rectifying element as well as only a resistor or a transistor. The rectifying element is a diode or a transistor of which gate and drain electrodes are connected to each other.

Next, operation of a protection circuit 88 in the gate driver is described. First, it is provided that a signal having a higher voltage than VDD is supplied from an output line of the tri-state buffer 133 due to an adverse effect such as noise or the like. At this time, the element group 134 is turned off whereas the element group 135 is turned on because of the relationship of gate-source voltage. Then, charges which have been accumulated in the tri-state buffer 133 is discharged to a power source line for transmitting VDD, and the potential of the scan line Ga or Gb becomes VDD or (VDD+a). Meanwhile, it is provided that a signal having a lower voltage than VSS is supplied from the output line of the tri-state buffer 133. At this time, the element group 134 is turned on whereas the element group 135 is turned off because of the relationship of gate-source voltage. Then, the potential of the scan line Ga or Gb becomes VSS or (VSS−a). As described above, even when the output line of the tri-state buffer 133 supplies a higher voltage than VDD or a lower voltage than VSS instantaneously due to noise or the like, the voltage supplied to the scan line Ga or Gb does not become higher than VDD and lower than VSS. Accordingly, malfunction, damage, and destruction of an element due to noise, static electricity, and the like can be suppressed.

It is to be noted that the protection circuit described in this embodiment mode may be provided between a connection film such as an FPC (flexible print circuit) and the gate driver 41 or 42, or the source driver 43.

This embodiment mode can be freely combined with any of the other embodiment modes.

Embodiment Mode 11

In this embodiment mode, a pixel configuration which is different from those in the above embodiment modes is described.

Figure 13:
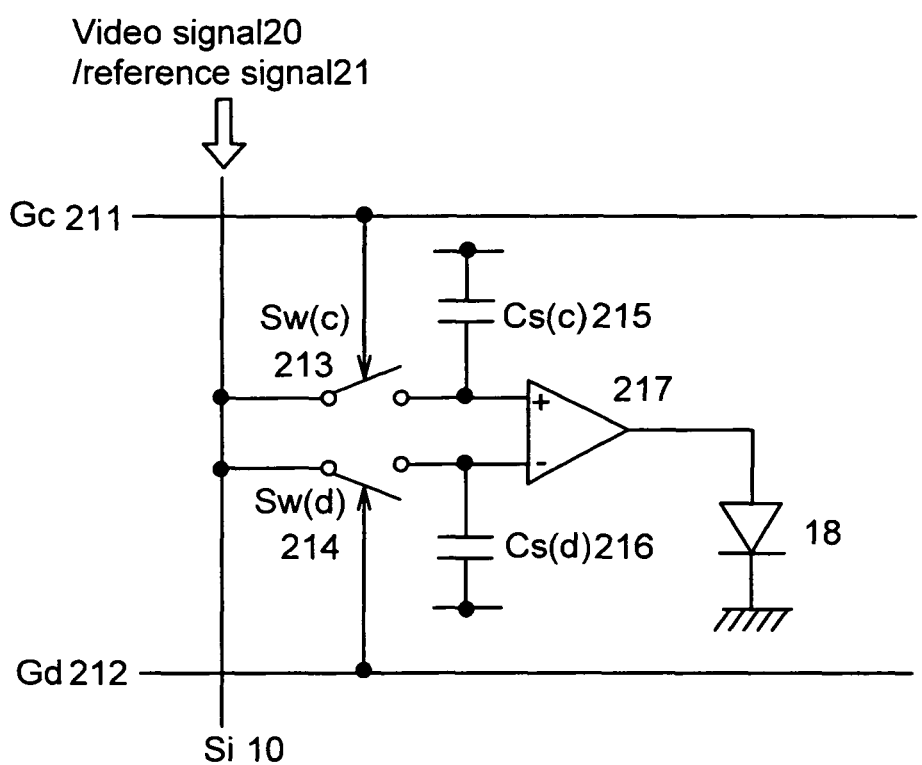
FIG. 13 is a circuit diagram illustrating a pixel of the invention.

A pixel shown in FIG. 13 includes the signal line (Si) 10, a first scan line (Gc) 211, a second scan line (Gb) 212, the first switch (Sw(c)) 213, the second switch (Sw(d)) 214, a first capacitor (Cs(c)) 215, a second capacitor (Cs(d)) 216, a differential amplifier 217, and the light emitting element 18. The first switch 213 and the second switch 214 each can be formed by a thin film transistor, for example. An operational amplifier can be employed as the differential amplifier 217, for example.

A connection relationship or the like in the pixel configuration is described. One terminal of the first switch 213 is connected to the signal line 10 and controlled by the first scan line 211. The other terminal of the first switch 213 is connected to one terminal of the first capacitor 215. The other terminal of the first capacitor 215 is connected to an arbitrary wiring. The arbitrary wiring preferably has a constant potential. In addition, the first capacitor 215 is required to have a function for holding charges inputted from the signal line 10. Specifically, the first capacitor 215 is required to hold the reference signal 21 inputted from the signal line 10. Although described below, according to the invention, input of the video signal 20 and the reference signal 21 is performed in one gate selection period which is quite a short period, and thus the first capacitor 215 can be made small.

One terminal of the second switch 214 is connected to the signal line 10 and controlled by the second scan line 212. The other terminal of the second switch 214 is connected to one terminal of the second capacitor 216. The other terminal of the second capacitor 216 is connected to an arbitrary wiring.

The arbitrary wiring preferably has a constant potential. In addition, the second capacitor 216 is required to have a function for holding charges inputted from the signal line 10. Specifically, the second capacitor 216 is required to hold the video signal 20 inputted from the signal line 10.

On the input side of the differential amplifier 217, a high potential side thereof is connected to the first switch 213 while a low potential side thereof is connected to the second switch 214.

The light emitting element 18 is connected to the output side of the differential amplifier 217. It is to be noted that an element such as a switch, that is a transistor or an inverter for example, may be provided between the light emitting element 18 and the differential amplifier 217.

According to such a pixel configuration, the video signal 20 and the reference signal 21 can be inputted from one signal line. Consequently, the aperture ratio of the pixel can be improved.

Next, operation of a display device having the pixel configuration shown in FIG. 13 is described. In the operation of the pixel configuration shown in FIG. 13, one frame period includes a gray scale display period and an alternating drive period similarly to that in FIG. 2. However, the invention is not necessarily provided with the alternating drive period.

The gray scale display period includes a writing period in which sequential selection of a scan line is carried out. In the writing period, the video signal 20 is inputted from the signal line 10. In addition, the reference signal 21 is inputted from the signal line 10 as well. These signals are inputted from the signal line 10 shown in FIG. 13. Which signal of them is to be inputted is controlled by the first switch 213 or the second switch 214. Based on a magnitude relationship between the voltage of the video signal 20 and that of the reference signal 21, a signal is outputted from the differential amplifier 217 so that a current is supplied to the light emitting element 18 to emit light. A light emission period of the light emitting element 18 is controlled by the signal from the differential amplifier 217, so that a gray scale display can be performed.

It is to be noted that a thin film transistor of the differential amplifier 217, particularly a P-channel thin film transistor, is not required to be operated in the saturation region in this embodiment mode. That is, the thin film transistor can be operated in the linear region, and thus the driving voltage is not required to be increased and the power consumption can be reduced.

In the alternating drive period, a reverse voltage is applied to the light emitting element. For example, potentials of a counter electrode of the light emitting element and of a low potential power source (Vss) are changed. This is preferable because the condition of the light emitting element and the reliability thereof can be improved by applying a reverse voltage.

Figure 14:
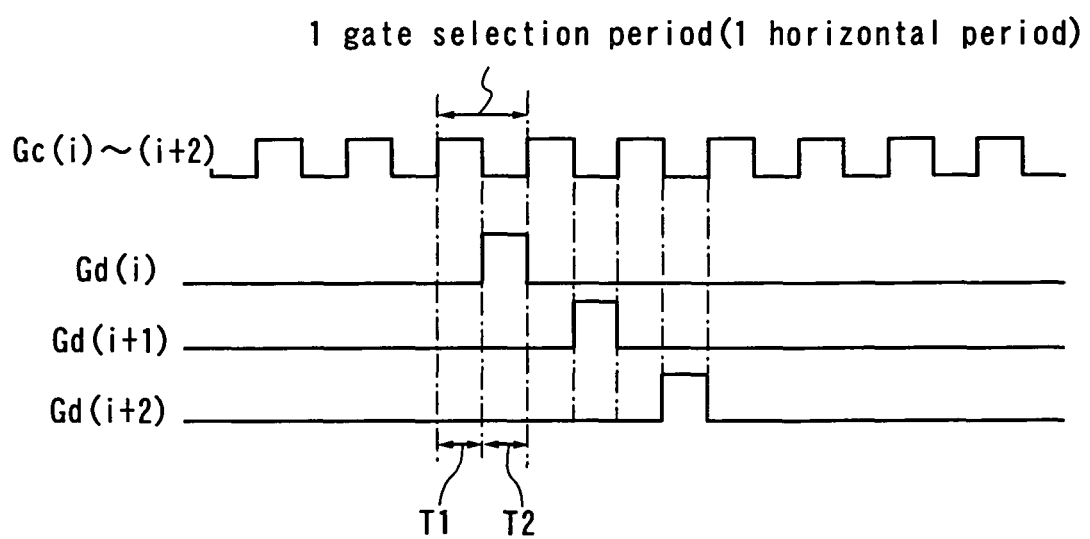
FIG. 14 is a diagram illustrating a driving method of a pixel of the invention.

In FIG. 14, respective waveforms of signals inputted to the first scan line Gc at any row and the second scan lines Gds at the i-th to (i+2)-th rows are shown. In this embodiment mode, one gate selection period includes a reference signal inputting period T1 and a video signal inputting period T2.

At the i-th row, the first scan line Gc(i) is inputted with a High signal in one gate selection period. At this time, the first switch 213 is selected, the video signal 20 is inputted from the signal line 10, and charges are held in the first capacitor 215. Meanwhile, in the one gate selection period, the second scan line Gd(i) is inputted with a Low signal in the reference signal inputting period T1 and inputted with a High signal in the video signal inputting period T2. When the High signal is inputted, the second switch 214 is selected, the video signal 20 is inputted from the signal line 10, and charges are held in the second capacitor 216.

Similarly, at the (i+1)-th row, the first scan line Gc(i+1) is inputted with a High signal in one gate selection period. At this time, the first switch 213 is selected, the reference signal 21 is inputted from the signal line 10, and charges are held in the first capacitor 215. Meanwhile, in the one gate selection period, the second scan line Gd(i+1) is inputted with a Low signal in the reference signal inputting period T1 and inputted with a High signal in the video signal inputting period T2. When the High signal is inputted, the second switch 214 is selected, the video signal 20 is inputted from the signal line 10, and charges are held in the second capacitor 216.

Similarly, at the (i+2)-th row, the first scan line Gc(i+2) is inputted with a High signal in one gate selection period. At this time, the first switch 213 is selected, the reference signal 21 is inputted from the signal line 10, and charges are held in the first capacitor 215. Meanwhile, in the one gate selection period, the second scan line Gd(i+2) is inputted with a Low signal in the reference signal inputting period T1 and inputted with a High signal in the video signal inputting period T2. When the High signal is inputted, the second switch 214 is selected, the video signal 20 is inputted from the signal line 10, and charges are held in the second capacitor 216.

In this manner, input of the video signal and input of the reference signal are performed. Based on a magnitude relationship between the potential of the video signal and that of the reference signal, a signal is outputted from the differential amplifier 217 so that a current is supplied to the light emitting element 18 to emit light. A light emission period of the light emitting element 18 is controlled by the signal from the differential amplifier 217, so that a gray scale display can be performed. It is to be noted that, as described above, the thin film transistor of the differential amplifier 217 is not required to be operated in the saturation region in this embodiment mode. Therefore, the driving voltage is not required to be increased and the power consumption can be reduced.

As described above, the reference signal inputting period T1 and the video signal inputting period T2 are provided in one gate selection period in this embodiment mode. Consequently, one signal line 10 can be shared and the aperture ratio can be improved. Since the reference signal inputting period T1 and the video signal inputting period T2 are provided in one gate selection period, it is preferable to increase the operating frequency of a scan line driver circuit.

Even in the case of the pixel configuration described in this embodiment mode, the manufacturing method described in the above embodiment mode can be employed as well.

Even in the case of the pixel configuration described in this embodiment mode, the structure for applying a reverse voltage, the element having a temperature compensation function, or the protection circuit described in the above embodiment mode may be provided as well.

Embodiment Mode 12

An electronic apparatus using a display device provided with a pixel region having a light emitting element includes a television unit (a television and a television receiver), a digital camera, a digital video camera, a mobile phone unit (a mobile phone), a portable data terminal such as a PDA, a portable game machine, a monitor, a computer, a sound reproducing device such as a car audio set, an image reproducing device provided with a recording medium such as a home game machine, and the like. Specific examples thereof are described with reference to FIGS. 34A to 34F.

Figure 34A:
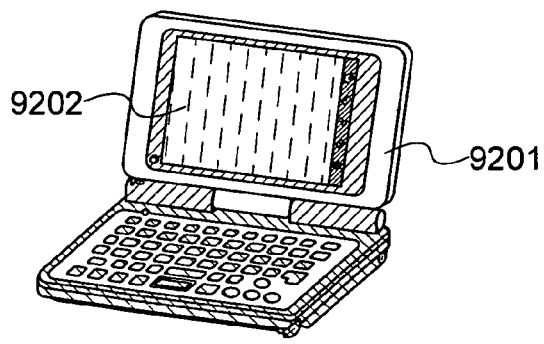
FIGS. 34A to 34F are views each illustrating an electronic apparatus of the invention.
Figure 34B:
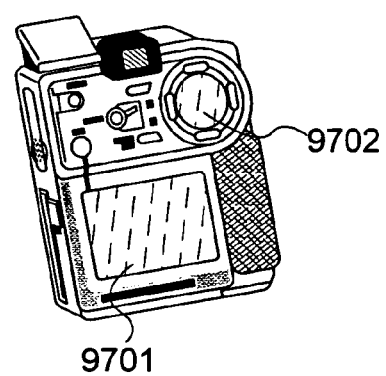
Figure 34C:
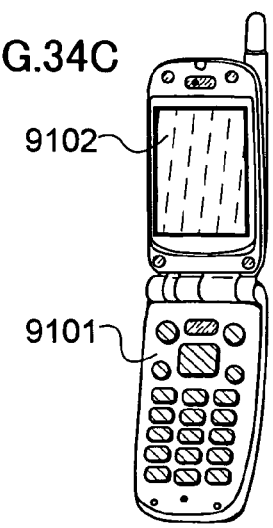
Figure 34D:
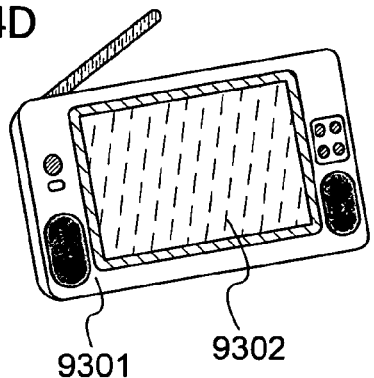
Figure 34E:
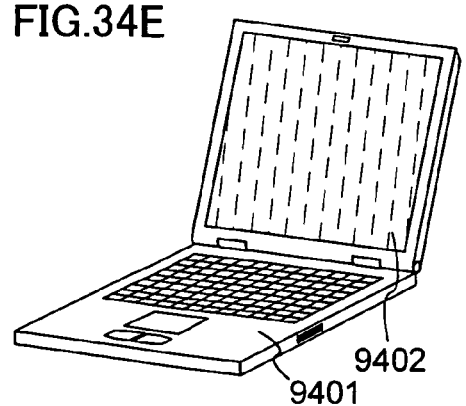
Figure 34F:
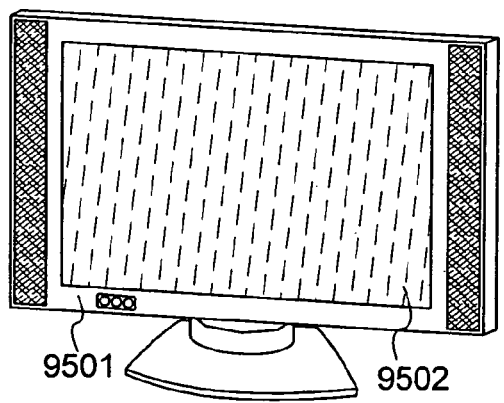

A personal data assistant using the display device of the invention shown in FIG. 34A includes a main body 9201, a display portion 9202 and the like, of which power consumption can be reduced by the invention. A digital video camera using the display device of the invention shown in FIG. 34B includes display portions 9701 and 9702, and the like, of which power consumption can be reduced by the invention. A portable terminal using the display device of the invention shown in FIG. 34C includes a main body 9101, a display portion 9102, and the like, of which power consumption can be reduced by the invention. A portable television unit using the display device of the invention shown in FIG. 34D includes a main body 9301, a display portion 9302, and the like, of which power consumption can be reduced by the invention. A portable computer using the display device of the invention shown in FIG. 34E includes a main body 9401, a display portion 9402, and the like, of which power consumption can be reduced by the invention. A television unit using the display device of the invention shown in FIG. 34F includes a main body 9501, a display portion 9502, and the like, of which power consumption can be reduced by the invention. In the case where a battery is employed among the above mentioned electronic apparatus, the hour of use of the electronic apparatus can be prolonged by a reduction in the power consumption and the trouble of charging the battery can be saved.

This application is based on Japanese Patent Application Ser. No. 2004-152628 filed in Japan Patent Office on 21th, May, 2004, the entire contents of which are hereby incorporated by reference.

What is claimed is:

1. A display device comprising:
a pixel region comprising:
a first switch controlled by a first scan line;
a first capacitor connected to one side of the first switch:
a second switch controlled by a second scan line;
a second capacitor provided between one side of the first switch and one side of the second switch:
an inverter provided at both terminals of the second switch;
a light emitting element provided on an output side of the inverter;
a gate of a third switch connected to an output side of the inverter;
a current source connected to the light emitting element via the third switch; and
a driver for generating a signal inputted to the first scan line and the second scan line,
wherein an element having a temperature compensation function is provided between the pixel region and the driver,.
wherein the gate of a third switch is connected to one side of the second switch,
wherein the inverter comprises an N-channel thin film transistor and a P-channel thin film transistor,
wherein the second capacitor is connected to a gate of the N-channel thin film transistor, and
wherein the second capacitor is connected to a gate of the P-channel thin film transistor.

2. The display device according to claim 1, wherein the element having a temperature compensation function includes a light emitting element for monitoring.

3. The display device according to claim 1,
wherein the element having a temperature compensation function includes a light emitting element for monitoring, and
wherein the light emitting element for monitoring is connected to a pixel electrode of a light emitting element in a pixel.

4. The display device according to claim 1,
wherein the element having a temperature compensation function includes a light emitting element for monitoring, and
wherein the light emitting element for monitoring is connected to a counter electrode of a light emitting element in a pixel.

5. The display device according to claim 1, wherein the driver includes a pulse output circuit, the pixel region includes a signal line, and a shift register is connected to the signal line via a fourth switch and a fifth switch.

6. The display device according to claim 1,
wherein the driver includes a pulse output circuit, the pixel region includes a signal line, and a shift register is connected to the signal line via a fourth switch and a fifth switch, and
wherein the fourth switch is constituted by an analog switch.

7. The display device according to claim 1,
wherein the driver includes a pulse output circuit, the pixel region includes a signal line, and a shift register is connected to the signal line via a fourth switch and a fifth switch, and
wherein the fifth switch includes a first analog switch, a second analog switch, and an inverter.

8. The display device according to claim 1,
wherein the driver includes a protection circuit, and
wherein the protection circuit includes at least one of a resistor, a capacitor, and a rectifying element.

9. A display device comprising:
a pixel region comprising:
a first switch controlled by a first scan line;
a first capacitor connected to one side of the first switch:
a second switch controlled by a second scan line;
a second capacitor provided between one side of the first switch and one side of the second switch:
an inverter provided at both terminals of the second switch;
a light emitting element provided on an output side of the inverter;
a gate of a third switch connected to an output side of the inverter;
a current source connected to the light emitting element via the third switch; and
a driver for generating a signal inputted to the first scan line and the second scan line,
wherein the gate of a third switch is connected to one side of the second switch,
wherein the inverter comprises an N-channel thin film transistor and a P-channel thin film transistor,
wherein the second capacitor is connected to a gate of the N-channel thin film transistor, and
wherein the second capacitor is connected to a gate of the P-channel thin film transistor.

10. The display device according to claim 9, wherein an element having a temperature compensation function is provided between the pixel region and the driver.

11. The display device according to claim 9, wherein a protection circuit is provided between the pixel region and the driver.

* * * * *

UNITED STATES PATENT AND TRADEMARK OFFICE
CERTIFICATE OF CORRECTION

| | | |
|---|---|---|
| PATENT NO. | : 8,581,805 B2 | Page 1 of 1 |
| APPLICATION NO. | : 11/131463 | |
| DATED | : November 12, 2013 | |
| INVENTOR(S) | : Kimura et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2158 days.

Signed and Sealed this
Eighth Day of September, 2015

Michelle K. Lee
*Director of the United States Patent and Trademark Office*